(12) United States Patent
Bessho et al.

(10) Patent No.: US 8,275,013 B2
(45) Date of Patent: Sep. 25, 2012

(54) SEMICONDUCTOR LASER DEVICE AND METHOD OF MANUFACTURING THE SAME

(75) Inventors: Yasuyuki Bessho, Uji (JP); Masayuki Hata, Kadoma (JP); Hiroki Ohbo, Hirakata (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 545 days.

(21) Appl. No.: 12/137,214

(22) Filed: Jun. 11, 2008

(65) Prior Publication Data

US 2008/0310471 A1 Dec. 18, 2008

(30) Foreign Application Priority Data

Jun. 18, 2007 (JP) ................................ 2007-159903
Jun. 5, 2008 (JP) ................................ 2008-148021

(51) Int. Cl.
*H01S 5/00* (2006.01)
(52) U.S. Cl. .................. 372/50.121; 372/36; 372/44.01
(58) Field of Classification Search ................ 372/44.01
See application file for complete search history.

(56) References Cited

U.S. PATENT DOCUMENTS

| | | | |
|---|---|---|---|
| 6,711,192 B1 * | 3/2004 | Chikuma et al. | 372/43.01 |
| 6,748,001 B1 * | 6/2004 | Nishitsuka et al. | 372/43.01 |
| 7,333,525 B2 | 2/2008 | Kimura et al. | |
| 2004/0196877 A1 * | 10/2004 | Kawakami et al. | 372/23 |
| 2005/0218420 A1 | 10/2005 | Bessho et al. | |
| 2005/0220159 A1 | 10/2005 | Bessho et al. | |
| 2006/0093000 A1 | 5/2006 | Nam et al. | |
| 2010/0260227 A1 | 10/2010 | Bessho et al. | |

FOREIGN PATENT DOCUMENTS

| | | |
|---|---|---|
| JP | 11-112091 A | 4/1999 |
| JP | 11-186651 A | 7/1999 |
| JP | 2005-209950 | 8/2005 |
| JP | 2005-286244 A | 10/2005 |
| JP | 2005-317919 | 11/2005 |
| JP | 2006-135306 A | 5/2006 |
| JP | 2007-048810 | 2/2007 |

* cited by examiner

*Primary Examiner* — Patrick Stafford
*Assistant Examiner* — Xinning Niu
(74) *Attorney, Agent, or Firm* — Marvin A. Motsenbocker; Mots Law, PLLC

(57) ABSTRACT

A semiconductor laser device includes a first semiconductor laser element formed on a surface of a first conductive type substrate, obtained by stacking a first conductive type first semiconductor layer, a first active layer and a second conductive type second semiconductor layer successively from the first conductive type substrate and a second semiconductor laser element obtained by successively stacking a first conductive type third semiconductor layer, a second active layer and a second conductive type fourth semiconductor layer, wherein the third semiconductor layer is electrically connected to the first semiconductor layer by bonding a side of the third semiconductor layer to the surface of the first conductive type substrate through a fusible layer.

19 Claims, 40 Drawing Sheets

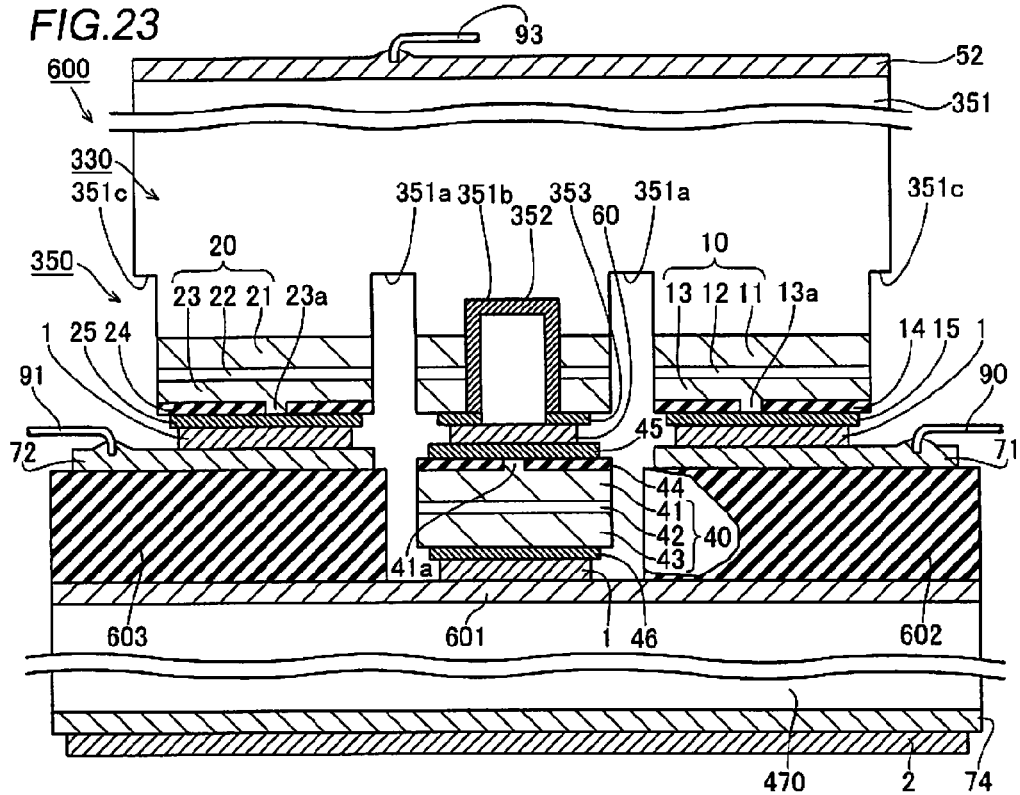
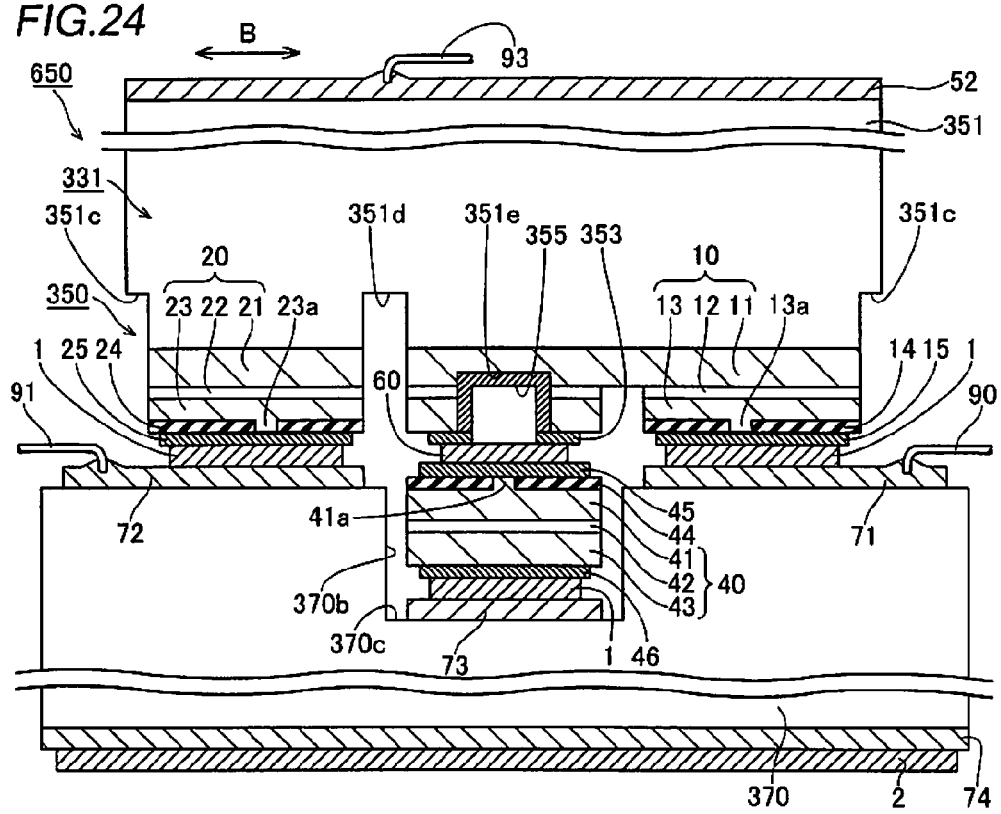

SEMICONDUCTOR LASER DEVICE AND METHOD OF MANUFACTURING THE SAME

CROSS-REFERENCE TO RELATED APPLICATIONS

The priority application number JP2007-159903, Semiconductor Laser Device and Method of Manufacturing the Same, Jun. 18, 2007, Yasuyuki Bessho, JP2008-148021, Semiconductor Laser Device and Method of Manufacturing the Same, Jun. 5, 2008, Yasuyuki Bessho, upon which this patent application is based is hereby incorporated by reference.

BACKGROUND OF THE INVENTION

1. Field of the Invention

The present invention relates to a semiconductor laser device and a method of manufacturing the same, and more particularly, it relates to a semiconductor laser device integrating a plurality of semiconductor laser elements and a method of manufacturing the same.

2. Description of the Background Art

A semiconductor laser element (infrared semiconductor laser element) emitting infrared light having a wavelength of about 780 nm is employed as a light source for a CD (compact disk)/CD-R (compact disk-recordable) drive in general. A semiconductor laser element (red semiconductor laser element) emitting red light having a wavelength of about 650 nm is employed as a light source for a DVD (digital versatile disc) drive.

On the other hand, a DVD allowing writing and reading by employing blue-violet light having a wavelength of about 405 nm has recently been developed. For writing and reading of such a DVD, a next generation DVD drive employing a semiconductor laser element (blue-violet semiconductor laser element) emitting blue-violet light having a wavelength of about 405 nm has also simultaneously been developed. This DVD drive requires compatibility for conventional CD/CD-R and DVD.

In this case, the compatibility for the conventional CD/CD-R and DVD is attained by a method of providing a plurality of optical pickups emitting infrared light, red light and blue-violet light respectively in a DVD drive or a method of individually providing an infrared semiconductor laser element, a red semiconductor laser element and a blue-violet semiconductor laser element in one optical pickup. However, these methods cause increase of the number of components, and hence downsizing, simplified configuration or price-reduction of the optical pickup system is disadvantageously difficult.

In order to suppress the increase of the number of components, a semiconductor laser element in which an infrared semiconductor laser element (laser having a wavelength of about 780 nm) and a red semiconductor laser element (laser having a wavelength of about 650 nm) formed on a gallium arsenide substrate are integrated in one chip has been put into practice in general. In the integrated semiconductor laser element in the one chip, the light emission positions of the respective wavelength semiconductor laser elements are accurately formed.

The blue-violet semiconductor laser element not formed on the gallium arsenide substrate, on the other hand, it is very difficult to integrate the blue-violet semiconductor laser element together with the infrared semiconductor laser element and the red semiconductor laser element in one chip. The light emission positions of the respective wavelength semiconductor laser elements must be arranged as close as possible in order to reduce loss or aberration to laser beams emitted from the respective wavelength semiconductor laser elements.

A semiconductor laser device having a structure, in which semiconductor laser elements are individually formed on different growth substrates and thereafter are bonded to each other such that emission layers of the semiconductor laser elements are opposed to each other, is proposed in general, as disclosed in Japanese Patent Laying-Open Nos. 2005-209950 and 2007-488100, for example.

The aforementioned Japanese Patent Laying-Open No. 2005-209950 discloses an integrated semiconductor light-emitting device having a structure in which emission layers (semiconductor element layers) of a red semiconductor laser element and a blue semiconductor laser element are bonded to be opposed to each other. In the integrated semiconductor light-emitting device described in Japanese Patent Laying-Open No. 2005-209950, the emission layer of the blue semiconductor laser element is fitted into a recess portion (groove) formed on a prescribed region of the emission layer of the red semiconductor laser element and reaching the growth substrate through a bonding layer so that p-side semiconductor layers of the red semiconductor laser element and the blue semiconductor laser element are electrically connected to each other. In particular, the bonding layer are so formed as to cover the overall surface region of the semiconductor laser element including portions where the growth substrate and an n-side semiconductor layer are exposed, and a p-side electrode is mounted on a first end of the bonding layer, so that the integrated semiconductor light-emitting device can be employed in a common anode type (p-side common electrode).

In the integrated semiconductor light-emitting device described in Japanese Patent Laying-Open No. 2005-209950, insulating layers are provided between the growth substrate and the n-side semiconductor layer of the red semiconductor laser element and the bonding layer so as to cause no electrical short circuit between the growth substrate as a cathode side (n-side) and the n-side semiconductor layer of the red semiconductor laser element and a region of the bonding layer (p-side). Additionally, insulating layers are provided between the growth substrate and the n-side semiconductor layer of the blue semiconductor laser element and the bonding layer so as to cause no electrical short circuit between the growth substrate as the cathode side (n-side) and the n-side semiconductor layer of the blue semiconductor laser element and the region of the bonding layer (p-side).

The aforementioned Japanese Patent Laying-Open No. 2007-488100 discloses a semiconductor laser having structure in which a blue-violet semiconductor laser element (first light-emitting element) and a semiconductor laser element (second light-emitting element) integrally formed with a red semiconductor laser element and an infrared semiconductor laser element are bonded to a support substrate in a state where the emission layers (semiconductor element layers) of the first light-emitting element and the second light-emitting element are opposed and bonded to each other. In the semiconductor laser described in Japanese Patent Laying-Open No. 2007-488100, p-side semiconductor layers of the first light-emitting element and the second light-emitting element are arranged so as to be opposed to each other and insulating layers are provided between the opposed p-side semiconductor layers, whereby the p-side semiconductor layers of the respective light-emitting elements are electrically insulated from each other. Therefore, electrodes connected to the p-side semiconductor layers of the respective light-emitting elements are formed on the support substrate and an electrode connected to the n-side semiconductor layer of the first light-emitting element is also connected to the support substrate.

In the integrated semiconductor light-emitting device disclosed in Japanese Patent Laying-Open No. 2005-209950, however, the p-side semiconductor layers of the red semiconductor laser element and the blue semiconductor laser element are electrically connected to each other through the bonding layer, while the insulating layers for preventing a short circuit must be formed between the portions of the growth substrates and the n-side semiconductor of the respective semiconductor laser elements layers are exposed and the bonding layer as an anode side (p-side) respectively, and hence an inner structure of the semiconductor laser element is disadvantageously complicated.

In the semiconductor laser disclosed in Japanese Patent Laying-Open No. 2007-488100, the insulating layers must formed in order to electrically isolate the p-side semiconductor layers of the first and second light-emitting elements while the p-side semiconductor layers of the respective light-emitting elements are arranged to be close to each other. Thus, the inner structure of the semiconductor element is disadvantageously complicated.

SUMMARY OF THE INVENTION

A semiconductor laser device according to a first aspect of the present invention comprises a first semiconductor laser element formed on a surface of a first conductive type substrate, obtained by stacking a first conductive type first semiconductor layer, a first active layer and a second conductive type second semiconductor layer successively from the first conductive type substrate and a second semiconductor laser element obtained by successively stacking a first conductive type third semiconductor layer, a second active layer and a second conductive type fourth semiconductor layer, wherein the third semiconductor layer is electrically connected to the first semiconductor layer by bonding a side of the third semiconductor layer to the surface of the first conductive type substrate through a fusible layer.

A method of manufacturing a semiconductor laser device according to a second aspect of the present invention comprises steps of forming a first semiconductor laser element on a surface of a first conductive type substrate by successively growing a first conductive type first semiconductor layer, a first active layer and a second conductive type second semiconductor layer, forming a second semiconductor laser element on a surface of a growth substrate by growing a first conductive type third semiconductor layer, a second active layer and a second conductive type fourth semiconductor layer and bonding the first semiconductor laser element and the second semiconductor laser element in a state where the third semiconductor layer and the first semiconductor layer are electrically connected to each other by bonding a side of the third semiconductor layer to the surface of the first conductive type substrate through a fusible layer.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 23 is a sectional view showing a structure of a semiconductor laser device according to a third modification of the second embodiment of the present invention;

FIG. 24 is a sectional view showing a structure of a semiconductor laser device according to a fourth modification of the second embodiment of the present invention;

DESCRIPTION OF THE PREFERRED EMBODIMENTS

Embodiments of the present invention will be hereinafter described with reference to the drawings.

(First Embodiment)

A structure of a semiconductor laser device 100 comprising a three-wavelength semiconductor laser element portion 50 according to a first embodiment of the present invention will be now described with reference to FIGS. 1 and 2.

Figure 1:
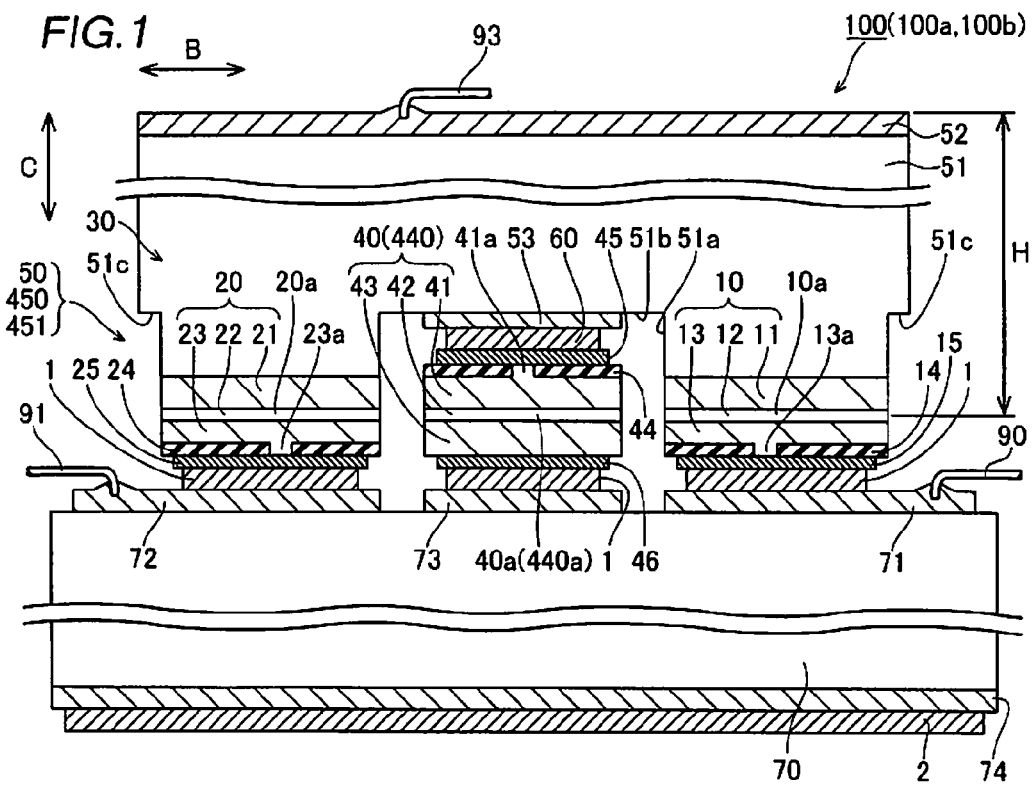
FIG. 1 is a front elevational view showing a structure of a semiconductor laser device according to a first embodiment of the present invention.

In the semiconductor laser device 100 according to the first embodiment of the present invention, the three-wavelength semiconductor laser element portion 50 is fixed to a base (submount) 70 made of AlN through conductive bonding layers 1 made of metal layers such as AuSn solder, as shown in FIG. 1. In the three-wavelength semiconductor laser element portion 50, a blue-violet semiconductor laser element 40 having a lasing wavelength of about 405 nm is bonded to a monolithic two-wavelength semiconductor laser element portion 30 in which an infrared semiconductor laser element 10 having a lasing wavelength of about 780 nm and a red semiconductor laser element 20 having a lasing wavelength of about 650 nm are formed on the n-type GaAs substrate 51 through a fusible layer 60. The infrared semiconductor laser element 10 and the red semiconductor laser element 20 are each an example of the "first semiconductor laser element" in the present invention and the blue-violet semiconductor laser element 40 is an example of the "second semiconductor laser element" in the present invention. The n-type GaAs substrate 51 is an example of the "first conductive substrate" in the present invention. The base 70 is an example of the "heat radiator base" in the present invention.

In the infrared semiconductor laser element 10 of the three-wavelength semiconductor laser element portion 50, an n-type AlGaAs cladding layer 11, an active layer 12 having a MQW structure formed by alternately staking quantum well layers made of AlGaAs having a lower Al composition and barrier layers AlGaAs having a higher Al composition and a p-type AlGaAs cladding layer 13 are formed on the n-type GaAs substrate 51, as shown in FIG. 1. Therefore the infrared semiconductor laser element 10 is made of a semiconductor layer of a compound containing As. The n-type AlGaAs cladding layer 11, the active layer 12 and the p-type AlGaAs cladding layer 13 are examples of the "first conductive type first semiconductor layer", the "first active layer" and the "second conductive type second semiconductor layer" in the present invention, respectively.

The first semiconductor layer may include other semiconductor layer such as a light guide layer (not shown) or a carrier blocking layer (not shown) between the n-type AlGaAs cladding layer 11 and the active layer 12. The first semiconductor layer may include other semiconductor layer such as a contact layer (not shown) on a side of the n-type AlGaAs cladding layer 11 opposite to the active layer 12. The second semiconductor may include other semiconductor layer such as a light guide layer (not shown) or a carrier blocking layer (not shown) between the active layer 12 and the p-type AlGaAs cladding layer 13. The second semiconductor layer may include other semiconductor layer such as a contact layer (not shown) on a side of the p-type AlGaAs cladding layer 13 to opposite the active layer 12. The active layer 12 may have a single-layer or single quantum well (SQW).

As shown in FIG. 1, the p-type AlGaN cladding layer 13 is provided with a ridge portion 13a having a width of about 3 μm, extending in a direction A (see FIG. 2) which is a direction perpendicular to the drawing, thereby forming a waveguide structure. As shown in FIG. 1, insulating films 14 made of $SiO_2$ are formed on a surface of the p-type AlGaAs cladding layer 13 except the ridge portion 13a. A p-side electrode 15 is formed on a lower surface of the ridge portion 13a of the p-type AlGaAs cladding layer 13 and the insulating films 14. A contact layer (not shown) or the like having a smaller band gap than the p-type AlGaAs cladding layer 13 may be preferably formed between the ridge portion 13a and the p-side electrode 15. The p-side electrode 15 is formed by stacking a Cr layer having a thickness of about 10 nm and an Au film having a thickness of about 2.2 μm. As shown in FIG. 1, the lower surface of the p-side electrode 15 and an upper surface of an electrode layer 71 formed on the base 70 are bonded to each other.

In the red semiconductor laser element 20 of the three-wavelength semiconductor laser element portion 50, an n-type AlGaInP cladding layer 21, an active layer 22 having a MQW structure formed by alternately staking quantum well layers made of GaInP and barrier layers made of AlGaInP and a p-type AlGaInP cladding layer 23 are formed on the n-type GaAs substrate 51, as shown in FIG. 1. Therefore the red semiconductor laser element 20 is made of a semiconductor layer of a compound containing P (phoshporus). The n-type AlGaInP cladding layer 21, the active layer 22 and the p-type AlGaInP cladding layer 23 are examples of the "first conductive type first semiconductor layer", the "first active layer" and the "second conductive type second semiconductor layer" in the present invention, respectively.

The first semiconductor layer may include other semiconductor layer such as a light guide layer (not shown) or a carrier blocking layer (not shown) between the n-type AlGaInP cladding layer 21 and the active layer 22. The first semiconductor layer may include other semiconductor layer such as a contact layer (not shown) on a side of the n-type AlGaInP cladding layer 21 opposite to the active layer 22. The second semiconductor layer may include other semiconductor layer such as a light guide layer (not shown) or a carrier blocking layer (not shown) between the active layer 22 and the p-type AlGaInP cladding layer 23. The second semiconductor layer may include other semiconductor layer such as a contact layer (not shown) on a side of the p-type AlGaInP cladding layer 23 opposite to the active layer 22. The active layer 22 may have a single-layer or single quantum well (SQW).

As shown in FIG. 1, the p-type AlGaInP cladding layer 23 is provided with a ridge portion 23a having a width of about 2 μm, extending in the direction A (see FIG. 2) which is a direction perpendicular to the drawing, thereby forming a waveguide structure. As shown in FIG. 1, insulating films 24 made of SiO$_2$ are formed on a surface of the p-type AlGaInP cladding layer 23 except the ridge portion 23a. A p-side electrode 25 is formed on a lower surface of the ridge portion 23a of the p-type AlGaInP cladding layer 23 and the insulating films 24. A contact layer (not shown) or the like having a smaller band gap than the p-type AlGaInP cladding layer 23 may preferably be formed between the ridge portion 23a and the p-side electrode 25. The p-side electrode 25 is formed by stacking a Cr layer having a thickness of about 10 nm and an Au film having a thickness of about 2.2 μm. As shown in FIG. 1, the lower surface of the p-side electrode 25 and an upper surface of an electrode layer 72 formed on the base 70 are bonded to each other.

As shown in FIG. 1, an n-side electrode 52 formed by stacking an AuGe layer, an Ni layer and an Au film successively from the n-type GaAs substrate 51 is formed on an overall upper surface of the n-type GaAs substrate 51 formed with the three-wavelength semiconductor laser element portion 50.

In the blue-violet semiconductor laser element 40 of the three-wavelength semiconductor laser element portion 50, an n-type AlGaN cladding layer 41, an active layer 42 having a MQW structure formed by alternately staking quantum well layers made of InGaN having a higher In composition and barrier layers made of InGaN having a lower In composition and a p-type AlGaN cladding layer 43 are formed, as shown in FIG. 1. Therefore the blue-violet semiconductor laser element 40 is made of a semiconductor layer of a nitride-based compound. The n-type AlGaN cladding layer 41, the active layer 42 and the p-type AlGaN cladding layer 43 are examples of the "first conductive type third semiconductor layer", the "second active layer" and the "second conductive type fourth semiconductor layer" in the present invention, respectively.

The third semiconductor layer may include other semiconductor layer such as a light guide layer (not shown) or a carrier blocking layer (not shown) between the n-type AlGaN cladding layer 41 and the active layer 42. The third semiconductor layer may include other semiconductor layer such as a contact layer (not shown) on a side of the n-type AlGaN cladding layer 42 opposite to the active layer 41. The fourth semiconductor layer may include other semiconductor layer such as a light guide layer (not shown) or a carrier blocking layer (not shown) between the active layer 42 and the p-type AlGaN cladding layer 43. The fourth semiconductor layer may include other semiconductor layer such as a contact layer (not shown) on a side of the p-type AlGaN cladding layer 43 opposite to the active layer 42. The active layer 42 may have a single-layer or single quantum well (SQW).

As shown in FIG. 1, the n-type AlGaN cladding layer 41 is provided with a ridge portion 41a having a width of about 1.5 μm, extending in the direction A (see FIG. 2) which is the direction perpendicular to the drawing, thereby forming a waveguide structure. As shown in FIG. 1, insulating films 44 made of SiO$_2$ are formed on a surface of the n-type AlGaN cladding layer 41 except the ridge portion 41a. An n-side electrode 45 is formed on upper surfaces of the ridge portion 41a of the n-type AlGaN cladding layer 41 and the insulating films 44. The n-side electrode 45 is an example of the "first electrode" in the present invention. A contact layer (not shown) or the like having a smaller band gap than the n-type AlGaN cladding layer 41 may be preferably formed between the ridge portion 41a and the n-side electrode 45. The n-side electrode 45 is formed by stacking an Al layer having a thickness of about 10 nm and a Pd layer having a thickness of about 20 nm and has an outer most surface coated with an Au layer having a thickness of about 1000 nm. As shown in FIG. 1, a p-side electrode 46 formed by stacking a Pt layer, a Pd layer and an Au layer successively from the p-type AlGaN cladding layer 43 is formed on a lower surface of the p-type AlGaN cladding layer 43. The n-side electrode 46 is an example of the "second electrode" in the present invention. A contact layer (not shown) or the like having a smaller band gap than the p-type AlGaN cladding layer 43 may be preferably formed between the p-type AlGaN cladding layer 43 and the p-side electrode 46. As shown in FIG. 1, the lower surface of the p-side electrode 46 and an upper surface of an electrode layer 73 formed on the base 70 are bonded to each other.

According to the first embodiment, a step portion 51a having a bottom 51b reaching the n-type GaAs substrate 51 is formed on a region held between the infrared semiconductor laser element 10 and the red semiconductor laser element 20 of the monolithic two-wavelength semiconductor laser element portion 30, as shown in FIG. 1. An electrode layer 53 is formed on the bottom 51b of the step portion 51a. The blue-violet semiconductor laser element 40 is bonded to the n-type GaAs substrate 51 in a state where the n-type AlGaN cladding layer 41 is electrically connected to the bottom 51b of the step portion 51a through the fusible layer 60.

As shown in FIG. 1, isolation grooves 51c reaching the n-type GaAs substrate 51 are formed on sides (both side ends of the element portion) where the step portion 51a is not formed among the monolithic two-wavelength semiconductor laser element portion 30. These isolation grooves 51c are provided for dividing three-wavelength semiconductor laser element portions 50 to be in the form of chips (second cleavage) along the isolation grooves 51c in a manufacturing process of the semiconductor laser device 100 described later.

According to the first embodiment, emission regions (around the active layers 12 and 22) of the infrared semiconductor laser element 10 and the red semiconductor laser element 20 and an emission region (around the active layer 42) of the blue-violet semiconductor laser element 40 are arranged at prescribed intervals in a direction along substantially the same plane (on positions in a thickness direction of each semiconductor layer (direction C in FIG. 1), where distances H of the emission regions from the upper surface of the n-type GaAs substrate 51 are substantially equal), as shown in FIG. 1.

Figure 2:
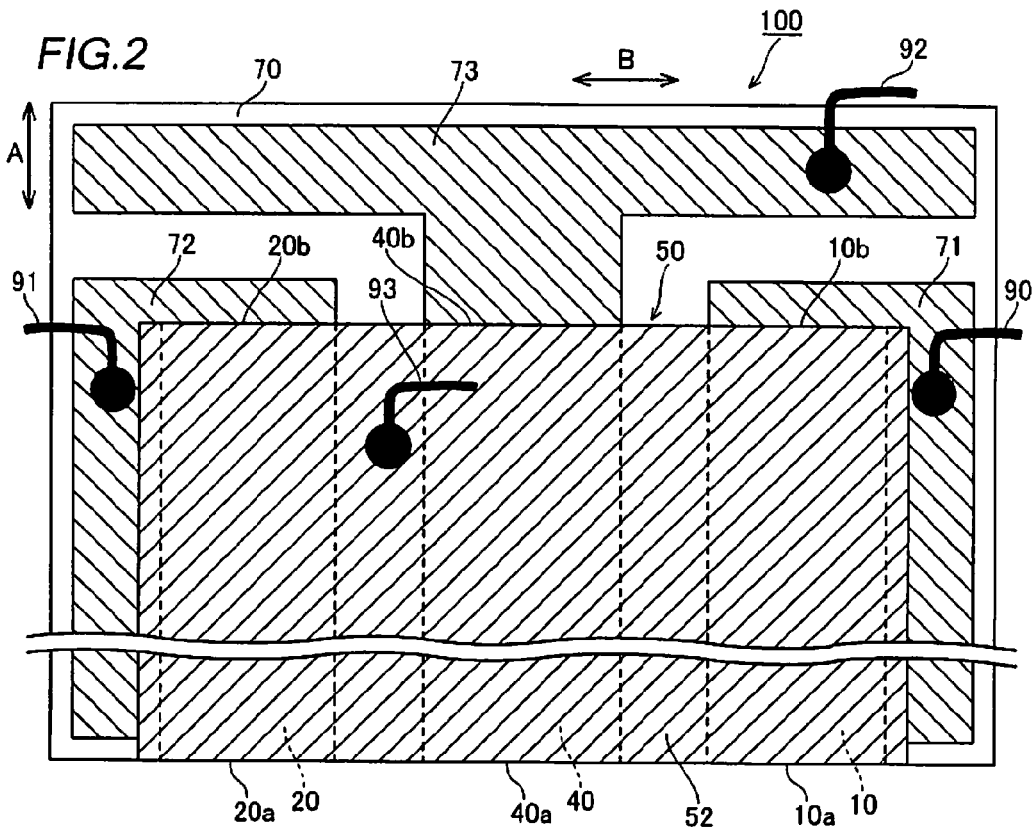
FIG. 2 is a plan view showing a structure of the semiconductor laser device according to the first embodiment shown in FIG. 1.

As shown in FIGS. 1 and 2, the electrode layers 71, 72 and 73 are formed on an upper surface of the base 70. The electrode layers 71, 72 and 73 are electrically separated from each other. The electrode layer 71 is formed on a region corresponding to a position of the p-side electrode 15 of the infrared semiconductor laser element 10. The electrode layer 72 is formed on a region corresponding to a position of the p-side electrode 25 of the red semiconductor laser element 20. The electrode layer 73 is formed on a region corresponding to a position of the p-side electrode 46 of the blue-violet semiconductor laser element 40.

A metal underlayer 74 formed by a Ti layer having a thickness of about 100 nm and a Pt layer having a thickness of about 200 nm and an Au layer having a thickness of about 300 nm is formed on an overall lower surface of the base 70. The metal underlayer 74 is provided for bonding a conductive bonding layer 2 made of a metal layer such as AuSn solder to the base 70. The base 70 is fixed to a stem made of a metal such as copper or iron (not shown) through the conductive bonding layer 2.

As shown in FIGS. 1 and 2, the electrode layers 71, 72 and 73 have regions (where the laser elements are not bonded to the upper surfaces of the electrode layers) projecting from the infrared semiconductor laser element 10, the red semiconductor laser element 20 and the blue-violet semiconductor laser element 40 in plan view, on the base 70 respectively. An Au wire 90 is wire-bonded to the upper surface of the projecting region of the electrode layer 71 provided on the infrared semiconductor laser element 10 and an Au wire 91 is wire-bonded to the upper surface of the projecting region of the electrode layer 72 provided on the red semiconductor laser element 20. As shown in FIG. 2, an Au wire 92 is wire-bonded to the upper surface of the projecting region of the electrode layer 73 provided on the blue-violet semiconductor laser element 40. As shown in FIGS. 1 and 2, an Au wire 93 is wire-bonded to a prescribed region of the upper surface of the n-side electrode 52 provided on the n-type GaAs substrate 51. The Au wires 90, 91 and 92 of the semiconductor laser device 100 are provided for connecting lead terminals (anode terminals: not shown) of the stem (not shown), and the Au wire 93 is provided for connecting a lead terminal (cathode terminal: not shown) of the stem (not shown). Thus, the semiconductor laser device 100 according to the first embodiment is so formed that a current can be individually supplied from the lead terminals on anode sides to the respective semiconductor laser elements and the respective semiconductor laser elements are connected in a common cathode type (n-side common electrode).

The infrared semiconductor laser element 10, the red semiconductor laser element 20 and the blue-violet semiconductor laser element 40 constituting the three-wavelength semiconductor laser element portion 50 are provided with light emitting surfaces 10a, 20a and 40a and light reflecting surfaces 10b, 20b and 40b on both ends of the extensional direction (direction A) of a cavity respectively, as shown in FIG. 2. According to the first embodiment, the light emitting surfaces 10a, 20a and 40a and the light reflecting surfaces 10b, 20b and 40b are distinguished from each other through the high-low direction between the intensity levels of laser beams emitted from cavity facets respectively. In other words, the light emitting surfaces boa, 20a and 40a have relatively higher laser beam intensity, and the light reflecting surfaces 10b, 20b and 40b have relatively lower laser beam intensity. The light emitting surfaces 10a, 20a and 40a and the light reflecting surfaces 10b, 20b and 40b of the respective semiconductor laser elements are formed with the dielectric multilayer films (not shown) made of AlN or $Al_2O_3$ by cavity facet coating treatment in the manufacturing process, respectively.

The manufacturing process of the semiconductor laser device 100 according to the first embodiment will be now described with reference to FIGS. 1 and 3 to 11.

In the manufacturing process for the semiconductor laser device 100 according to the first embodiment, wafer-state three-wavelength semiconductor laser element portions 50 are formed by a "forming step of monolithic two-wavelength semiconductor laser element portions" and a "forming step of blue-violet semiconductor laser element" and thereafter a "bonding step of semiconductor laser elements", and a "separation step of a growth substrate" and an "electrode forming step". Thereafter the three-wavelength semiconductor laser element portion 50 as a component is formed by a "cleavage plane forming step" and a "mounting step". The detailed description of the respective steps will be hereinafter described in order.

Figure 3:
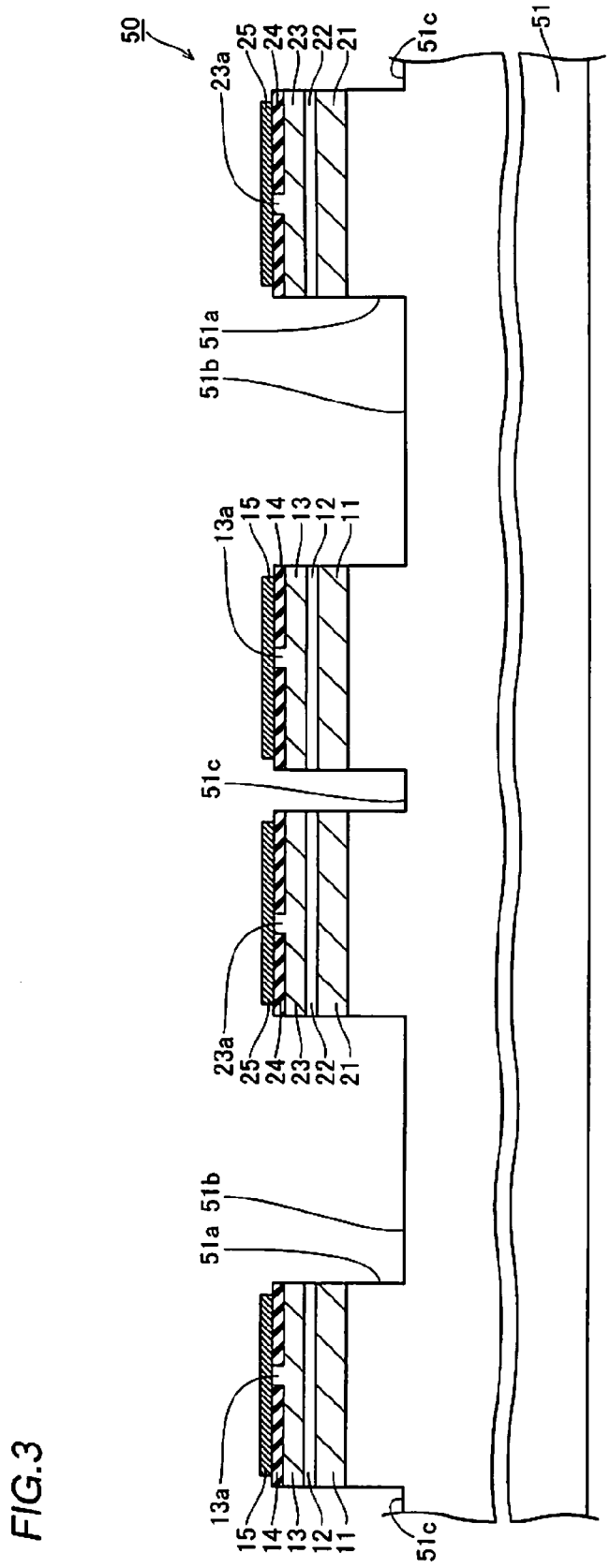
FIGS. 3 to 11 are diagrams for illustrating a manufacturing process for the semiconductor laser device according to the first embodiment shown in FIG. 1.

In the "forming step of monolithic two-wavelength semiconductor laser element portions", the infrared semiconductor laser elements 10 and the red semiconductor laser elements 20 are formed on the upper surface of the n-type GaAs substrate 51 at prescribed intervals, as shown in FIG. 3. Then the step portions 51a and the isolation grooves 51c are formed by etching. The step portions 51a and the isolation grooves 51c are formed such that the depths thereof reach the n-type GaAs substrate 51. Thereafter the p-type AlGaAs cladding layers 13 and the p-type AlGaInP cladding layers 23 are formed with the ridge portions 13a and 23a by etching respectively, and the insulating films 14 and 24 made of $SiO_2$ are formed on the upper surfaces of the p-type AlGaAs cladding layers 13 and p-type AlGaInP cladding layers 23 except the ridge portions 13a and 23a respectively. The p-side electrodes 15 (p-side electrodes 25) each having an outermost surface made of an Au film are formed on the upper surfaces of the ridge portions 13a (ridge portions 23a) and the insulating films 14 (insulating films 24) by vacuum evaporation.

Figure 4:
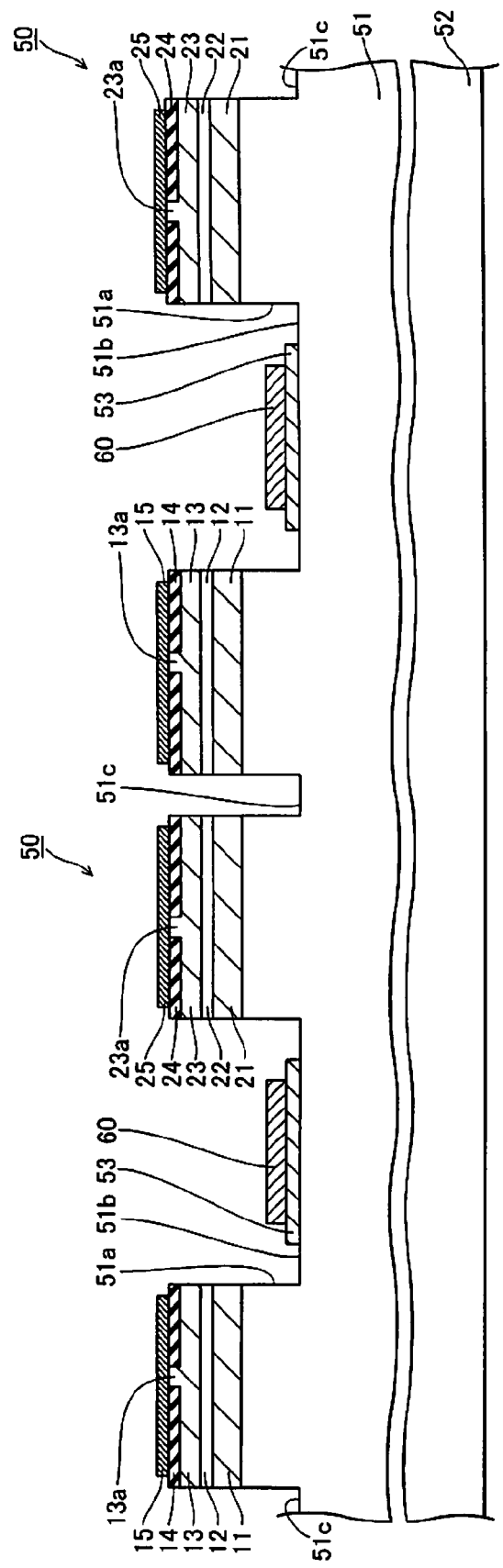

As shown in FIG. 4, the electrode layers 53 are formed on the step portions 51a of the n-type GaAs substrate 51 by vacuum evaporation and the fusible layers 60 are formed on the electrode layers 53. The monolithic two-wavelength semiconductor laser element portions 30 are manufactured in the aforementioned manner.

Figure 5:
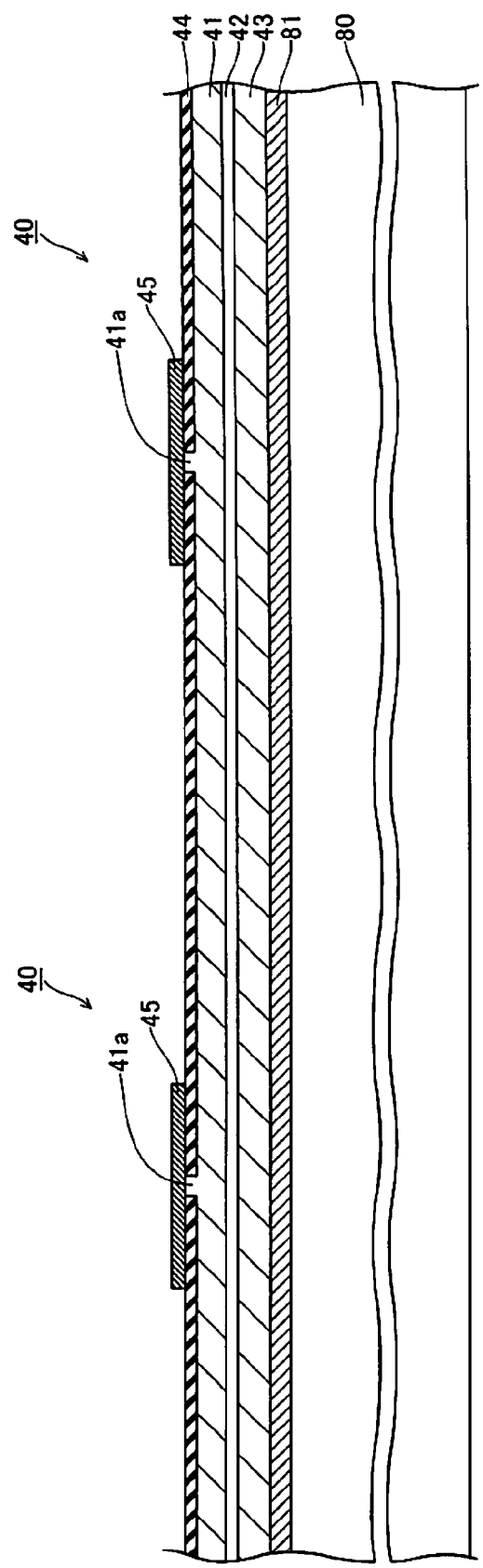

In the "forming step of blue-violet semiconductor laser elements", an InGaN separative layer 81, the p-type AlGaN cladding layer 43, the active layer 42 and the n-type AlGaN cladding layer 41 are successively stacked on the upper surface of the n-type GaN substrate 80, thereby forming the blue-violet semiconductor laser elements 40, as shown in FIG. 5. The ridge portions 41a are formed on the upper surface of the n-type AlGaN cladding layer 41 by etching and thereafter the insulating films 44 made of $SiO_2$ are formed on the upper surface of the n-type AlGaN cladding layer 41 except the ridge portions 41a. Then the n-side electrodes 45 each having an outermost surface made of an Au film are formed on the upper surfaces of the ridge portions 41a and the insulating films 44 by vacuum evaporation. The n-type GaN substrate 80 is an example of the "growth substrate" in the present invention.

Figure 6:
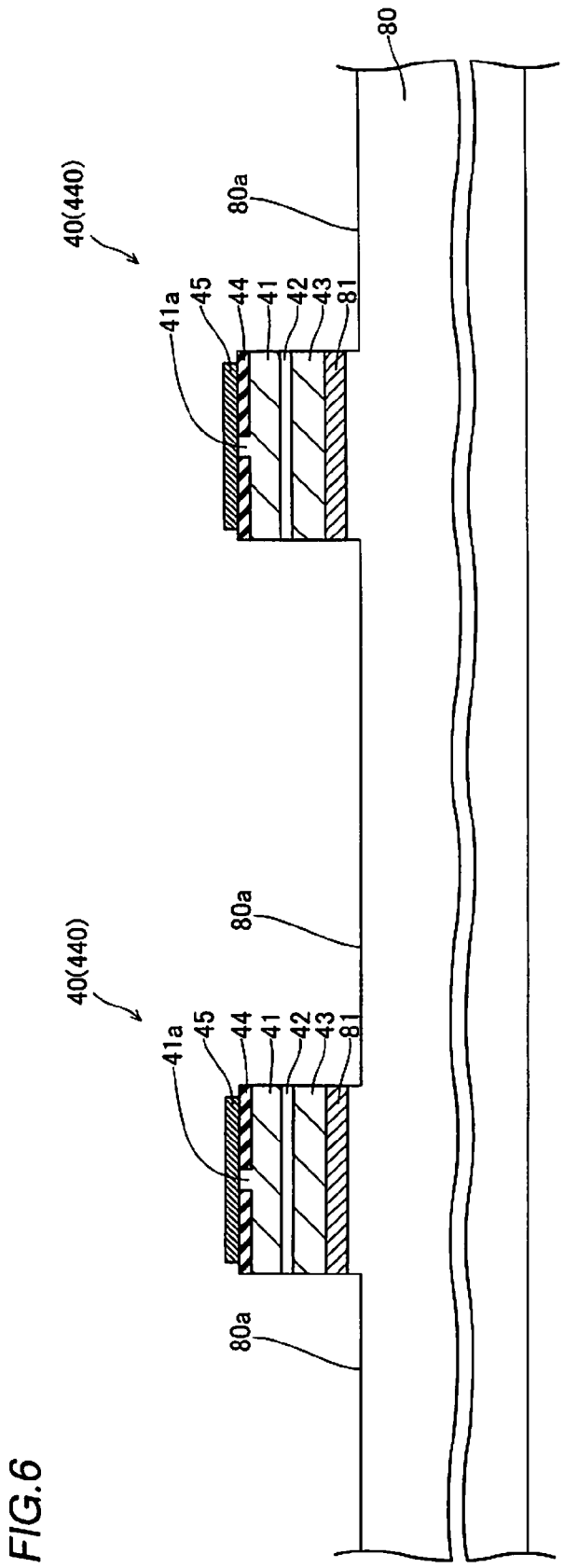

Thereafter step portions 80a are formed by etching as shown in FIG. 6. The step portions 80a are so formed as to reach the n-type GaN substrate 80. The blue-violet semiconductor laser elements 40 are formed in the aforementioned manner.

Figure 7:
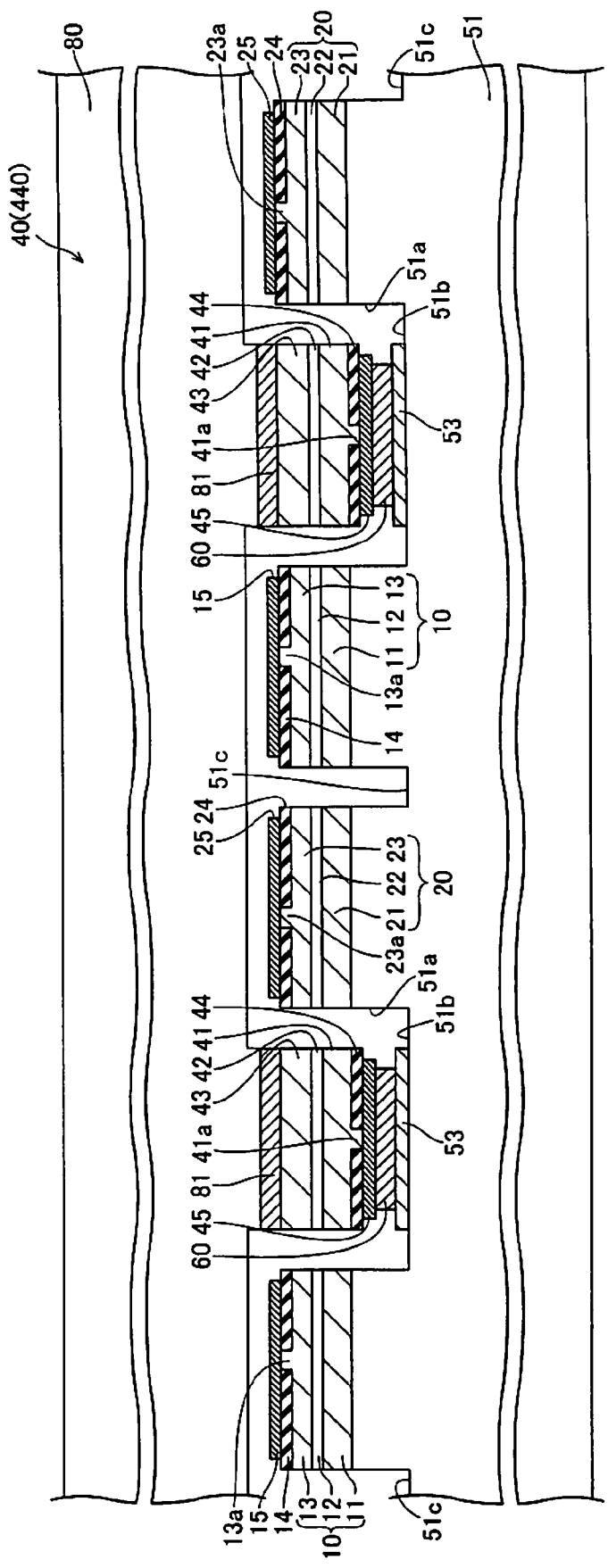

In the "bonding step of semiconductor laser elements", the electrode layers 53 provided on the step portions 51a of the monolithic two-wavelength semiconductor laser element portions 30 and the n-side electrodes 45 of the blue-violet semiconductor laser elements 40 formed on the n-type GaN substrate 80 are opposed and bonded to each other through the fusible layers 60 with a load of about 100 N at a temperature of about 295° C., as shown in FIG. 7.

Figure 8:
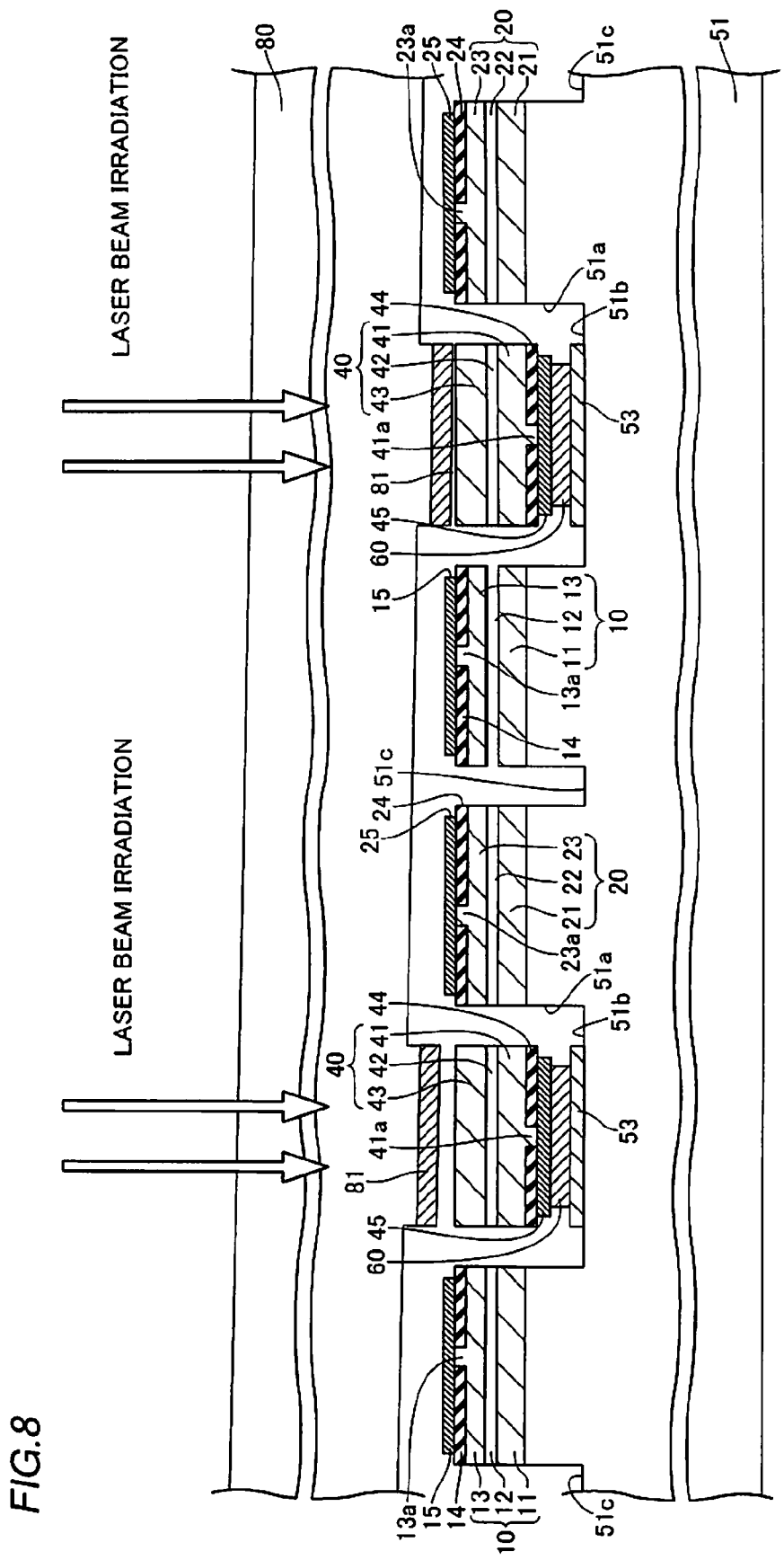

In the "separation step of a growth substrate", second harmonics of an Nd:YAG laser beam (wavelength: about 532 nm), adjusted to energy density of about 500 mJ/cm² to about 1000 mJ/cm² is applied to the n-type GaN substrate 80 from a back surface of the n-type GaN substrate 80 (upper surface of the n-type GaN substrate 80 in FIG. 8), as shown in FIG. 8. The binding of crystals of InGaN separative layers 81 stacked therein is totally or locally destroyed by the irradiation of the laser beam. Thus, the n-type GaN substrate 80 can be easily separated from the blue-violet semiconductor laser elements 40 along the breakdown region of the InGaN separative layers 81. The n-type GaN substrate 80 after separation is used as the growth substrate for forming the blue-violet semiconductor laser elements 40 again by flattening unevenness on the surfaces formed with the step portions 80a (see FIG. 6) and the InGaN separative layer 81 by polishing the surfaces.

Figure 9:
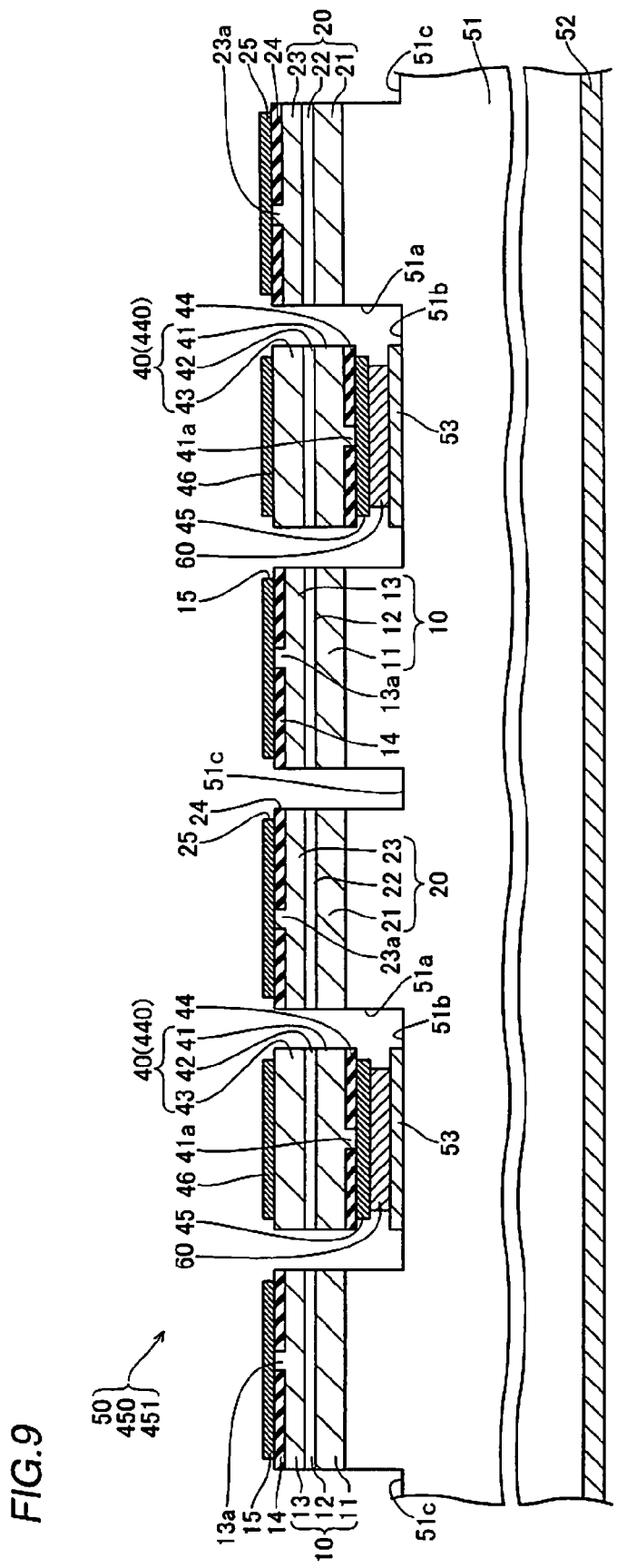

In the "electrode forming step", the p-side electrodes 46 are formed on the upper surfaces of the p-type AlGaN cladding layer 43 exposed on the upper surfaces of the blue-violet semiconductor laser element 40 through the "separation step of a growth substrate", by vacuum evaporation, as shown in FIG. 9. The thickness of the n-type GaAs substrate 51 forming the monolithic two-wavelength semiconductor laser element portions 30 is reduced by a prescribed thickness by etching and thereafter the n-side electrode 52 is formed on the (overall) surface of the n-type GaAs substrate 51 by vacuum evaporation. The wafer-state three-wavelength semiconductor laser element portion 50 is formed in the aforementioned manner.

According to the first embodiment, the three-wavelength semiconductor laser element portions 50 are formed through the aforementioned manufacturing process, whereby the n-type AlGaN cladding layers 41 of the blue-violet semiconductor laser elements 40 are rendered conductive through the step portions 51a while having the same polarity (n-type) as the n-type GaAs substrate 51 and hence the three-wavelength semiconductor laser element portions 50 each having a simplified inner structure can be formed.

Figure 10:
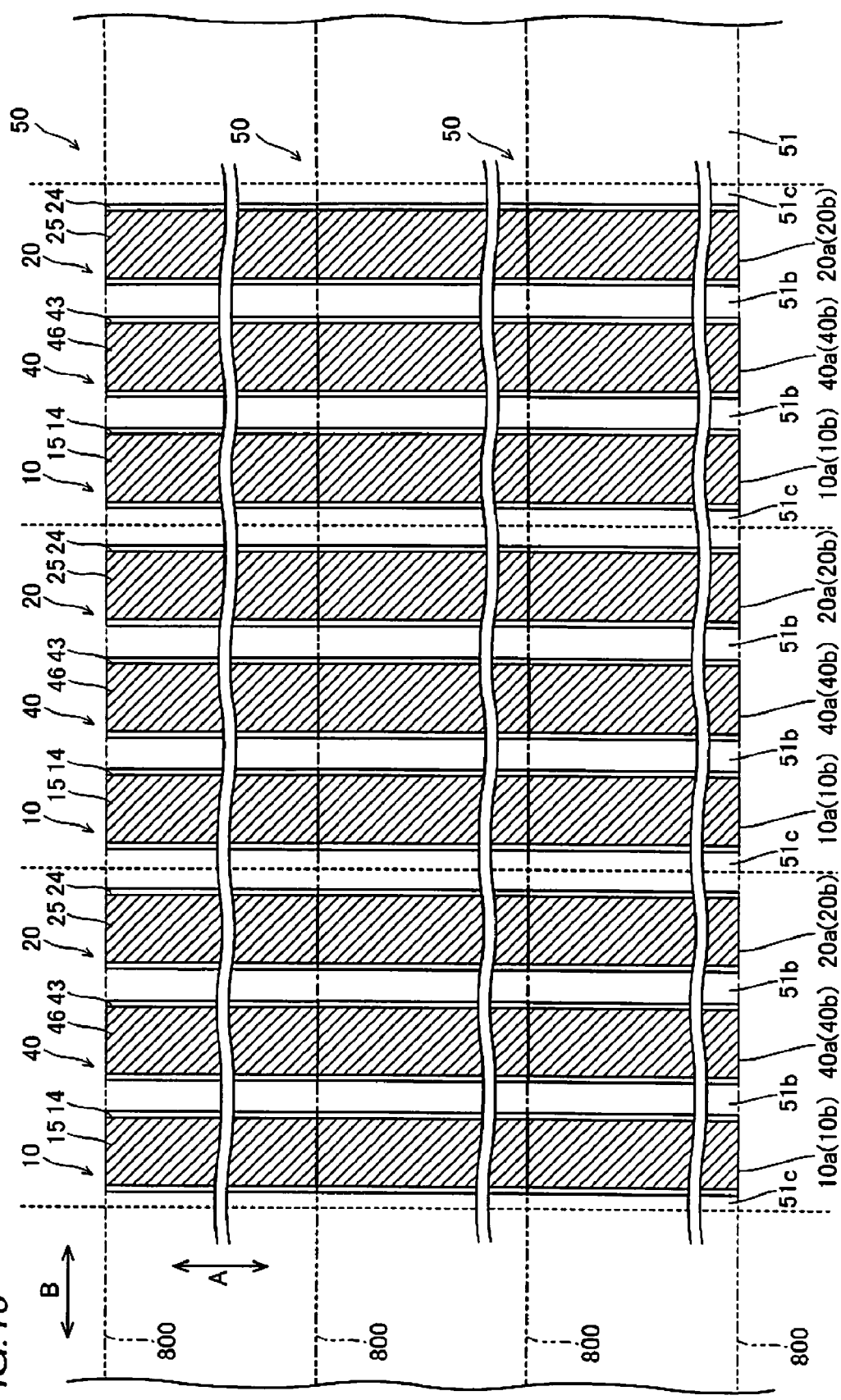

In the "cleavage plane forming step", scribe lines 800 (alternate long and short dash lines) are lined at cavity length pitches in a direction (direction B) perpendicular to the extensional direction (direction A) of the cavities by laser scribing, and the wafer-state three-wavelength semiconductor laser element portions 50 are cleaved along the scribe line 800, as shown in FIG. 10. Thus, the three-wavelength semiconductor laser element portions 50 are so divided as to be in the form of bars (see FIG. 10) and the light emitting surfaces 10a, 20a and 40a and the light reflecting surfaces 10b, 20b and 40b are formed on the both ends in the extensional direction (direction A) of the cavities, as shown in FIG. 2.

Figure 11:
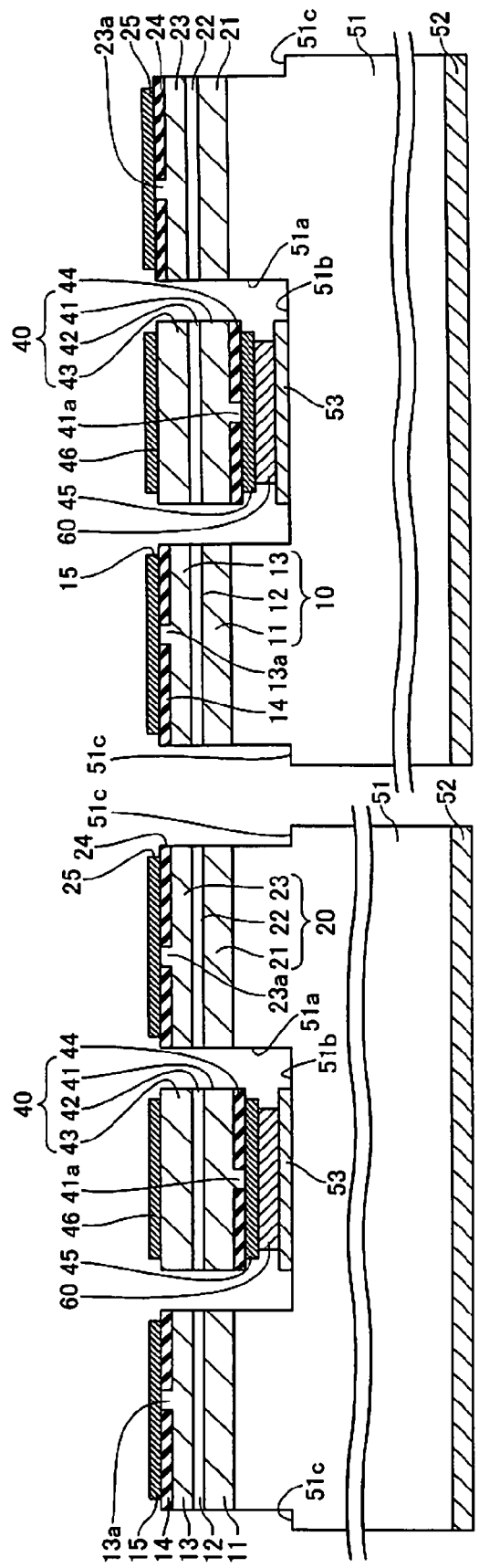

Thereafter dielectric multilayer films (oxide films, etc.) (not shown) are formed on cavity facets (the light emitting surfaces 10a and the light reflecting surfaces 10b (see FIG. 2) of the infrared semiconductor laser elements 10, the light emitting surfaces 20a and the light reflecting surfaces 20b (see FIG. 2) of the red semiconductor laser elements 20 and the light emitting surfaces 40a and the light reflecting surfaces 40b of the blue-violet semiconductor laser elements 40 (see FIG. 2)) of the three-wavelength semiconductor laser element portions 50 by facet coating treatment. As shown in FIG. 11, element division is performed along the isolation grooves 51c (see FIG. 10) of the bar-state three-wavelength semiconductor laser element portions 50 in the extensional direction (direction A in FIG. 10) of the cavities in a manner similar to the aforementioned manner. Thus, the individual three-wavelength semiconductor laser element portions 50 in the form of chips.

In the "mounting step", each three-wavelength semiconductor laser element portion 50 is bonded to the base 70 as shown in FIG. 1. The p-side electrodes 14, 24 and 46 of the three-wavelength semiconductor laser element portion 50 are arranged so as to be opposed to the electrode layers 71, 72 and 73 on the upper surface of the base 70 arranged with the conductive bonding layers 1 on prescribed regions (upper surfaces of the electrode layers 71, 72 and 73). The three-wavelength semiconductor laser element portion 50 is pressed against the base 70 through the conductive bonding layers 1 with a collet (not shown) made of ceramics, thereby melting the conductive bonding layers 1. Thereafter the conductive bonding layers 1 are solidified and the three-wavelength semiconductor laser element portion 50 is fixed on the base 70 through the conductive bonding layers 1.

The semiconductor laser device 100 (see FIG. 1) comprising the three-wavelength semiconductor laser element portion 50 (see FIG. 1) according to the first embodiment is formed in the aforementioned manner.

According to the first embodiment, as hereinabove described, the n-type AlGaN cladding layer 41 of the blue-violet semiconductor laser element 40 is bonded to the n-type GaAs substrate 51 through the fusible layer 60 so as to be electrically connected to the n-type AlGaAs cladding layer 11 of the infrared semiconductor laser element 10 and the n-type AlGaInP cladding layer 21 of the red semiconductor laser element 20, whereby the n-type AlGaN cladding layer 41 of the blue-violet semiconductor laser element 40 has the same polarity (common negative polarity) as the n-type GaAs substrate 51 forming the infrared semiconductor laser element 10 and the red semiconductor laser element 20 and hence no insulating layer for preventing an electrical short circuit between the n-type GaAs substrate 51 and the n-type AlGaN cladding layer 41 may be provided. Thus, the inner structure of the three-wavelength semiconductor laser element portion 50 in which the infrared and red semiconductor laser elements 10 and 20 and the blue-violet semiconductor laser element 40 are connected to each other in a common cathode type can be simplified. In particular, when a multiple wavelength semiconductor laser element is applied to an optical pickup system, the semiconductor laser elements are preferably employed in the common cathode type (as an n-side common electrode) and hence the semiconductor laser device 100 according to the first embodiment can be easily built into the optical pickup system.

According to the first embodiment, the step portion 51a having the bottom 51b reaching the n-type GaAs substrate 51 is formed on the region held between the infrared semiconductor laser element 10 and the red semiconductor laser element 20 and the n-type AlGaN cladding layer 41 of the blue-violet semiconductor laser element 40 is bonded to the bottom 51b of the step portion 51a through the fusible layer 60, whereby the infrared and red semiconductor laser elements 10 and 20 and the blue-violet semiconductor laser element 40 can be easily connected to each other in the common cathode type.

According to the first embodiment, the active layer 12 of the infrared semiconductor laser element 10, the active layer 22 of the red semiconductor laser element 20 and the active layer 42 of the blue-violet semiconductor laser element 40 are arranged at prescribed intervals in the direction along substantially the same plane (on positions in a thickness direction of each semiconductor layer (direction C in FIG. 1), where distances H of the emission regions from the upper surface of the n-type GaAs substrate 51 are substantially equal, whereby the emission region of each semiconductor laser element (10, 20, 40) can be arranged on substantially the same plane surface and hence light from the semiconductor laser elements (10, 20, 40) can be emitted at emission positions in substantially the same straight line. Thus, when the semiconductor laser device 100 is applied to the optical pickup system, light emitted from each semiconductor laser element can be incident at substantially the same angle with respect to (in a direction perpendicular to) a recording surface of an optical disk and hence optical spot quality of the semiconductor laser element in each recording medium can be inhibited from dispersion.

According to the first embodiment, the n-type AlGaAs cladding layer 11, the active layer 12 and the p-type AlGaAs cladding layer 13 of the infrared semiconductor laser element 10 and the n-type AlGaInP cladding layer 21, the active layer 22 and the p-type AlGaInP cladding layer 23 of the red semiconductor laser element 20 are formed by a compound semiconductor layer containing arsenic or phosphorus, and the n-type AlGaN cladding layer 41, the active layer 42 and the p-type AlGaN cladding layer 43 of the blue-violet semiconductor laser element 40 are formed by a nitride-based compound semiconductor, whereby the three-wavelength semiconductor laser element portion 50 can be constituted by the monolithic two-wavelength semiconductor laser element portion 30 emitting an infrared laser beam and an red laser beam and the blue-violet semiconductor laser element 40 emitting a laser beam having a wavelength different from the monolithic two-wavelength semiconductor laser element portion 30.

According to the first embodiment, the semiconductor laser device 100 further comprises the base 70 for mounting the infrared semiconductor laser element 10, the red semiconductor laser element 20 and the blue-violet semiconductor laser element 40 constituting the three-wavelength semiconductor laser element portion 50, and the infrared semiconductor laser element 10, the red semiconductor laser element 20 and the blue-violet semiconductor laser element 40 are fixed such that the p-type cladding layers (the p-type AlGaAs cladding layer 13, the p-type AlGaInP cladding layer 23 and the p-type AlGaN cladding layer 43) are fixed on the base 70, whereby heat generated from the three-wavelength semiconductor laser element portion 50 by emission of laser beams in a laser operation can be effectively radiated through the base 70 having more excellent radiation performance than the n-type GaAs substrate 51.

According to the first embodiment, the n-type AlGaN cladding layer 41 of the blue-violet semiconductor laser element 40 is bonded to the n-type GaAs substrate 51 through the fusible layer 60 made of AuSn solder so as to be electrically connected to the n-type GaAs substrate 51, whereby the active layer 42 of the blue-violet semiconductor laser element 40 and the active layers 12 and 22 of the infrared semiconductor laser element 10 and the red semiconductor laser element 20 can be easily on the same plane surface by controlling the thickness of the fusible layer 60 when the n-type AlGaN cladding layer 41 of the blue-violet semiconductor laser element 40 is bonded to the n-type GaAs substrate 51.

According to the first embodiment, the n-side electrode 45 and the p-side electrode 46 are formed on the blue-violet semiconductor laser element 40, whereby bondability between the n-side electrode 45 and the fusible layer 60 can be improved when bonding the blue-violet semiconductor laser element 40 to the monolithic two-wavelength semiconductor laser element portion 30. Additionally bondability between the p-side electrode 46 and the conductive bonding layers 1 can be improved when bonding the three-wavelength semiconductor laser element portion 50 to the base 70.

(First Modification of First Embodiment)

Figure 12:
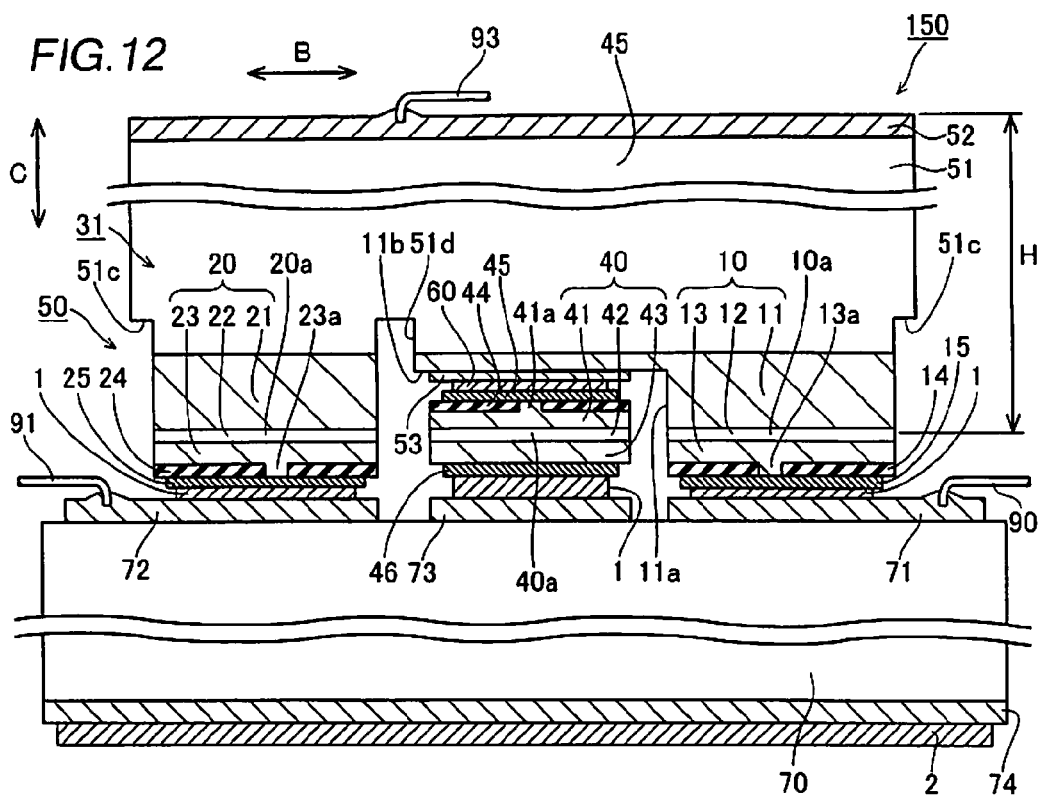
FIG. 12 is a front elevational view showing a structure of a semiconductor laser device according to a first modification of the first embodiment of the present invention.

In the semiconductor laser device 150 according to a first modification of the first embodiment, an isolation groove 51*d* reaching an n-type GaAs substrate 51 is formed on a region held between an infrared semiconductor laser element 10 and a red semiconductor laser element 20 of a monolithic two-wavelength semiconductor laser element portion 31 and a step portion 11*a* having a bottom 11*b* is formed on an n-type AlGaAs cladding layer 11 of the infrared semiconductor laser element 10 as shown in FIG. 12, dissimilar to the aforementioned first embodiment. An electrode layer 53 is formed on the bottom 11*b* of the step portion 11*a*. Thus, the blue-violet semiconductor laser element 40 is bonded to the n-type AlGaAs cladding layer 11 in a state where the n-type AlGaN cladding layer 41 is electrically connected to the bottom 11*b* of the step portion 11*a* through a fusible layer 60. The remaining structure and manufacturing process of a three-wavelength semiconductor laser element portion 31 according to the first modification of the first embodiment are similar to those of the aforementioned first embodiment.

According to the first modification, as hereinabove described, the step portion 11*a* having the bottom 11*b* is formed on the n-type AlGaAs cladding layer 11 of the infrared semiconductor laser element 10 and the n-type AlGaN cladding layer 41 of the blue-violet semiconductor laser element 40 is bonded to the bottom 11*b* of the step portion 11*a* through the fusible layer 60, whereby the infrared and red semiconductor laser elements 10 and 20 and the blue-violet semiconductor laser element 40 can be easily connected to each other in a cathode common type similarly to the aforementioned first embodiment. The remaining effects of the first modification of the aforementioned first embodiment are also similar to those of the aforementioned first embodiment.

While the step portion 11*a* is formed on the n-type AlGaAs cladding layer 11 of the infrared semiconductor laser element 10 in the aforementioned first modification of the first embodiment, a step portion may be formed on an n-type AlGaInP cladding layer 21 of the red semiconductor laser element 20 and an n-type AlGaN cladding layer 41 of a blue-violet semiconductor laser element 40 may be bonded to the step portion through an fusible layer 60.

(Second Modification of First Embodiment)

Figure 13:
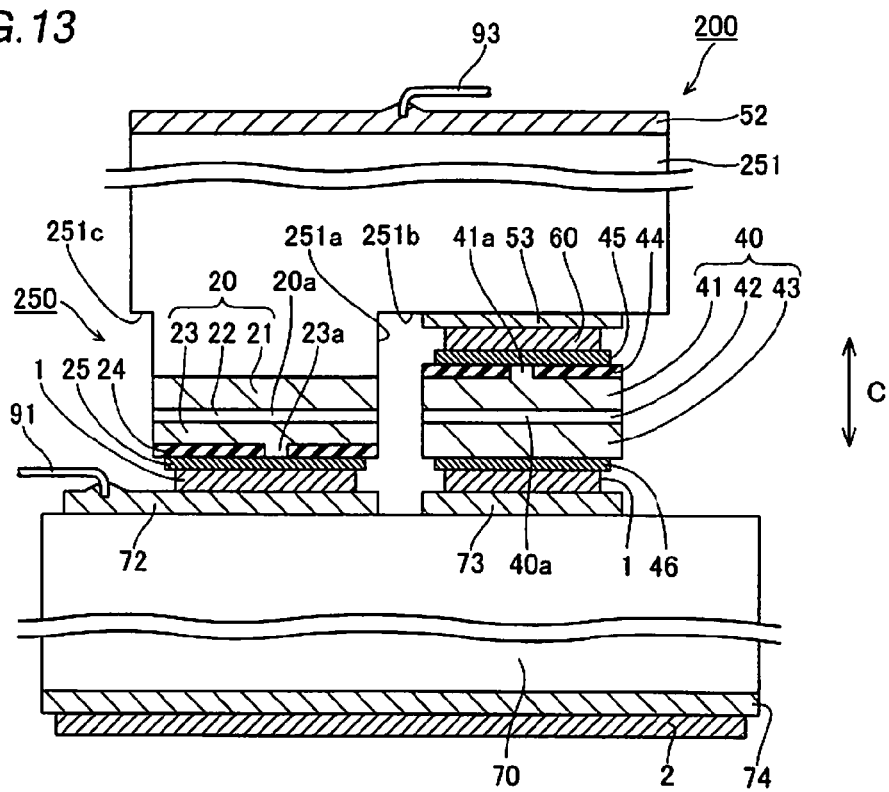
FIG. 13 is a front elevational view showing a structure of a semiconductor laser device according to a second modification of the first embodiment of the present invention.

In a semiconductor laser device 200 according to a second modification of the first embodiment, a two-wavelength semiconductor laser element portion 250, in which a blue-violet semiconductor laser element 40 is bonded to a red semiconductor laser element 20 formed on an n-type GaAs substrate 251 through an fusible layer 60, is fixed to a base 70 through conductive bonding layers 1 made of a metal layer such as AuSn solder as shown in FIG. 13, dissimilarly to the aforementioned first embodiment. The n-type GaAs substrate 251 is an example of the "first conductive substrate" in the present invention.

The remaining structure and manufacturing process of the two-wavelength semiconductor laser element portion 250 according to the second modification of the first embodiment are similar to those of the aforementioned first embodiment.

According to the second modification, as hereinabove described, the n-type AlGaN cladding layer 41 of the blue-violet semiconductor laser element 40 is bonded on the n-type GaAs substrate 251 through the fusible layer 60 so as to be electrically connected to the n-type AlGaInP cladding layer 21 of the red semiconductor laser element 20, whereby the n-type AlGaN cladding layer 41 of the blue-violet semiconductor laser element 40 has the same polarity (common negative polarity) as the n-type GaAs substrate 251 of the red semiconductor laser element 20 and hence no insulating layer for preventing an electrical short circuit between the n-type GaAs substrate 251 and the n-type AlGaN cladding layer 41 may be provided. Thus, the inner structure of the two-wavelength semiconductor laser element portion 250 in which the red semiconductor laser element 20 and the blue-violet semiconductor laser element 40 are connected to each other in a common cathode type can be simplified similarly to the aforementioned first embodiment. The remaining effects of the second modification of the first embodiment are similar to those of the aforementioned first embodiment.

(Second Embodiment)

In a semiconductor laser device 300 according to a second embodiment, a three-wavelength semiconductor laser element portion 350, in which a blue-violet semiconductor laser element 40 is bonded to a surface of a region held between an infrared semiconductor laser element 10 and a red semiconductor laser element 20 through an fusible layer 60, is fixed to a base 370 through conductive bonding layers 1 made of metal layers such as AuSn solder. The semiconductor laser device 300 according to the second embodiment will be described with reference to FIG. 14. The base 370 is an example of the "heat radiator base" in the present invention.

Figure 14:
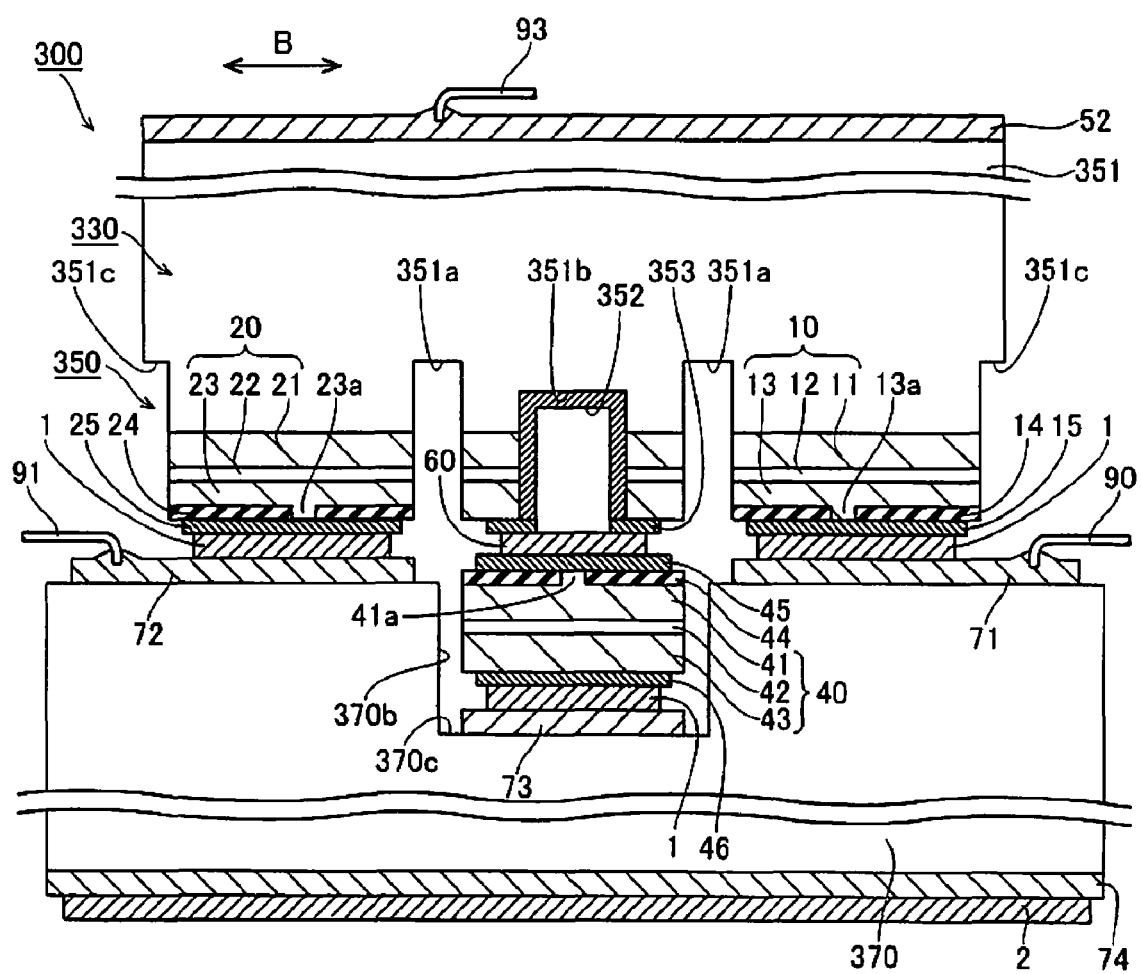
FIG. 14 is a sectional view showing a structure of a semiconductor laser device according to a second embodiment of the present invention.

According to the second embodiment, a conduction portion 352 reaching from a surface (electrode layer 353) of a semiconductor layer to an n-type GaAs substrate 351 is provided on a inner portion (inner surface of a hole 351b) of the region held between the infrared semiconductor laser element 10 and the red semiconductor laser element 20, as shown in FIG. 14. Thus, the blue-violet semiconductor laser element 40 is electrically connected to the n-type GaAs substrate 351 through the fusible layer 60, the electrode layer 353 and the conduction portion 352. The n-type GaAs substrate 351 is an example of the "first conductive substrate" in the present invention and the conduction portion 352 is an example of the "connection region" in the present invention.

According to the second embodiment, a recessed step portion 370b is formed on a surface of the base 370 to which the blue-violet semiconductor laser element 40 is bonded, by etching, as shown in FIG. 14. An electrode layer 73 is formed on a bottom 370c of the step portion 370b. Thus, the blue-violet semiconductor laser element 40 having a projecting shape in the three-wavelength semiconductor laser element portion 350 is bonded to the base 370 through the conductive bonding layers 1 in a state of entering in the recessed step portion 370b of the base 370.

The remaining structure of the semiconductor laser device 300 according to the second embodiment is similar to that of the aforementioned first embodiment.

A manufacturing process of the semiconductor laser device 300 according to the second embodiment will be now described with reference to FIGS. 14 to 20.

Figure 15:
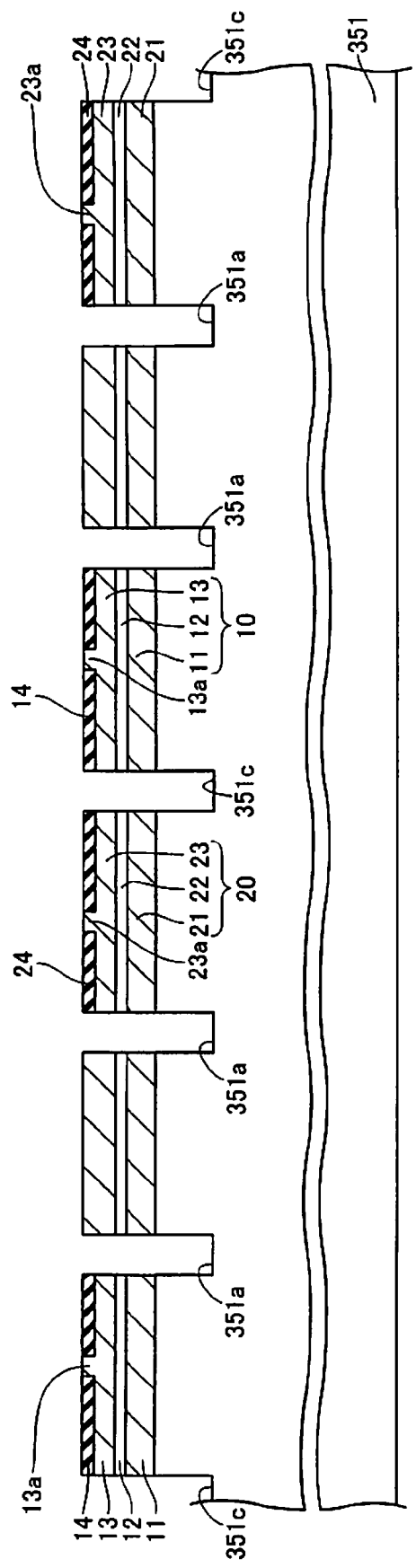
FIGS. 15 to 20 are diagrams for illustrating a manufacturing process for the semiconductor laser device according to the second embodiment shown in FIG. 14.

In a "forming step of a monolithic two-wavelength semiconductor laser element portion". the infrared semiconductor laser elements 10 and the red semiconductor laser elements 20 are formed on an upper surface of the n-type GaAs substrate 351 through a manufacturing process similar to that of the aforementioned first embodiment, as shown in FIG. 15.

Figure 16:
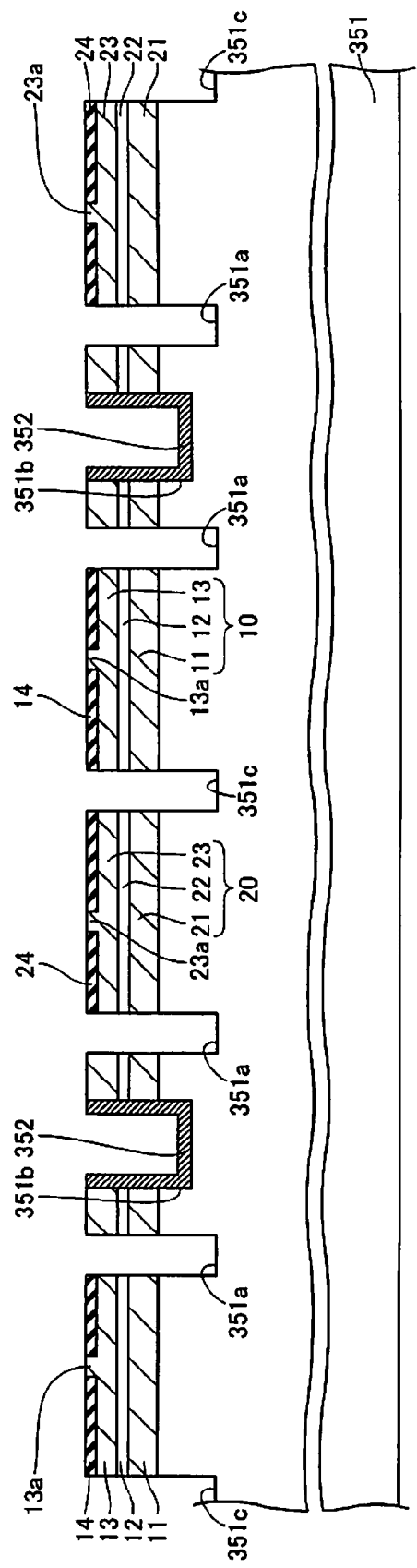

According to the second embodiment, pairs of insulating grooves 351a and the holes 351b and isolation grooves 351c are formed on the regions held between the infrared semiconductor laser elements 10 and the red semiconductor laser elements 20 by etching as shown in FIG. 16. The pairs of insulating grooves 351a and the holes 351b are formed such that the depths thereof reach the n-type GaAs substrate 351. Thereafter the conduction portions 352 are formed on the inner surfaces of the holes 351b by vacuum evaporation as shown in FIG. 16.

Figure 17:
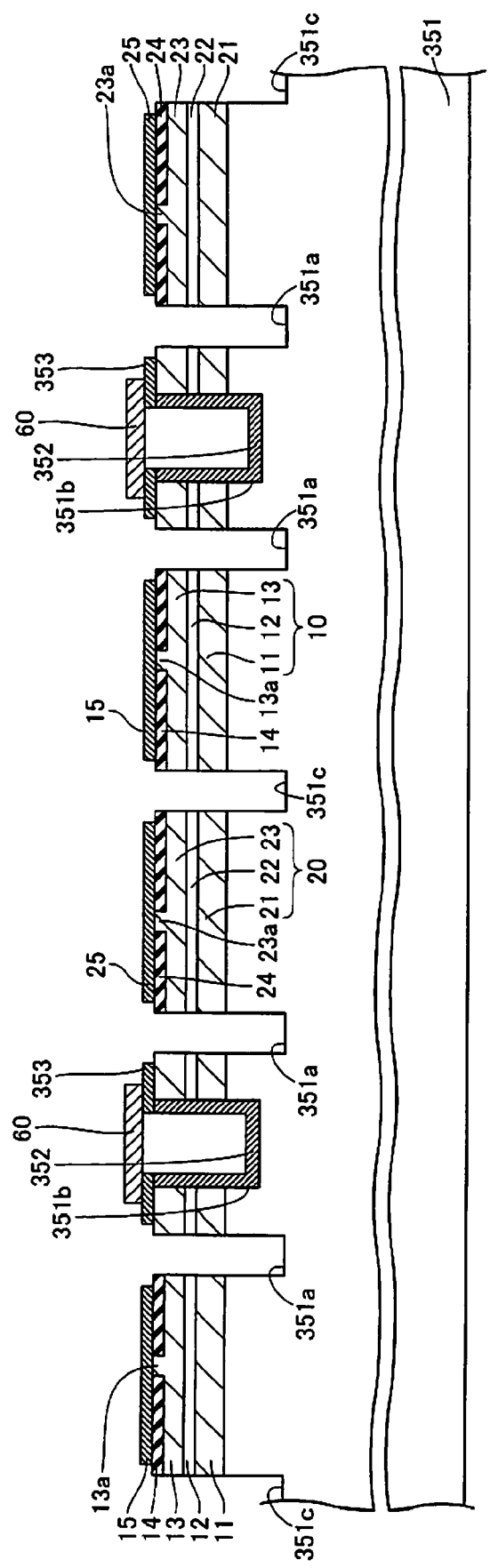

As shown in FIG. 17, the electrode layers 353 are formed on the conduction portions 352 of the n-type GaAs substrate 351 by vacuum evaporation and the fusible layers 60 are formed on the electrode layers 353. Thus, the n-type GaAs substrate 351 can be electrically connected to the fusible layers 60 through the conduction portions 352 and the electrode layers 353. A monolithic two-wavelength semiconductor laser element portion 330 is formed in the aforementioned manner.

Figure 18:
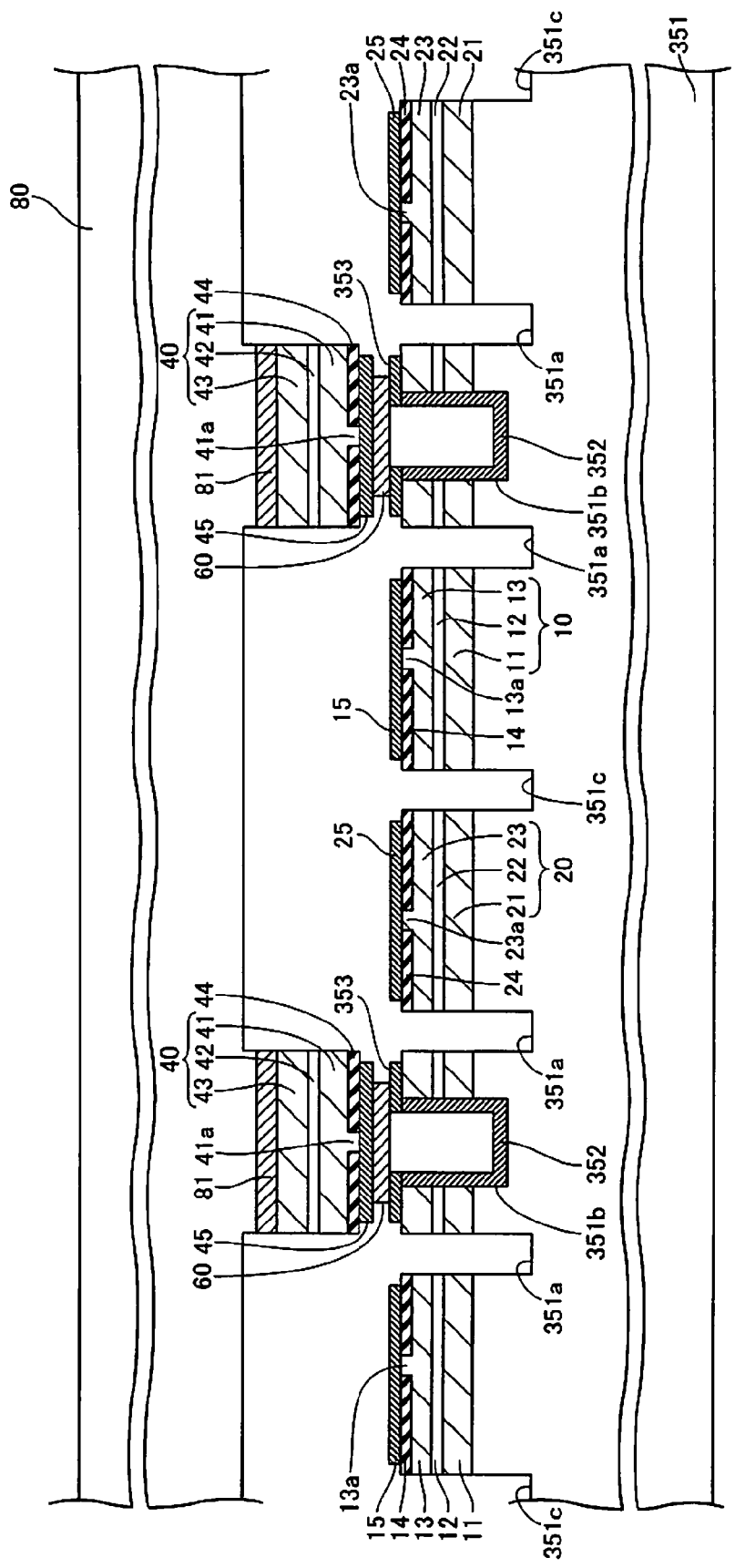

In a "bonding step of semiconductor laser elements", the blue-violet semiconductor laser elements 40 formed through a manufacturing process similar to that of the aforementioned first embodiment and the electrode layer 353 of the monolithic two-wavelength semiconductor laser element portion 330 are opposed and bonded to each other through the fusible layers 60 with a load of about 100 N at a temperature of about 295° C., as shown in FIG. 18

Figure 19:
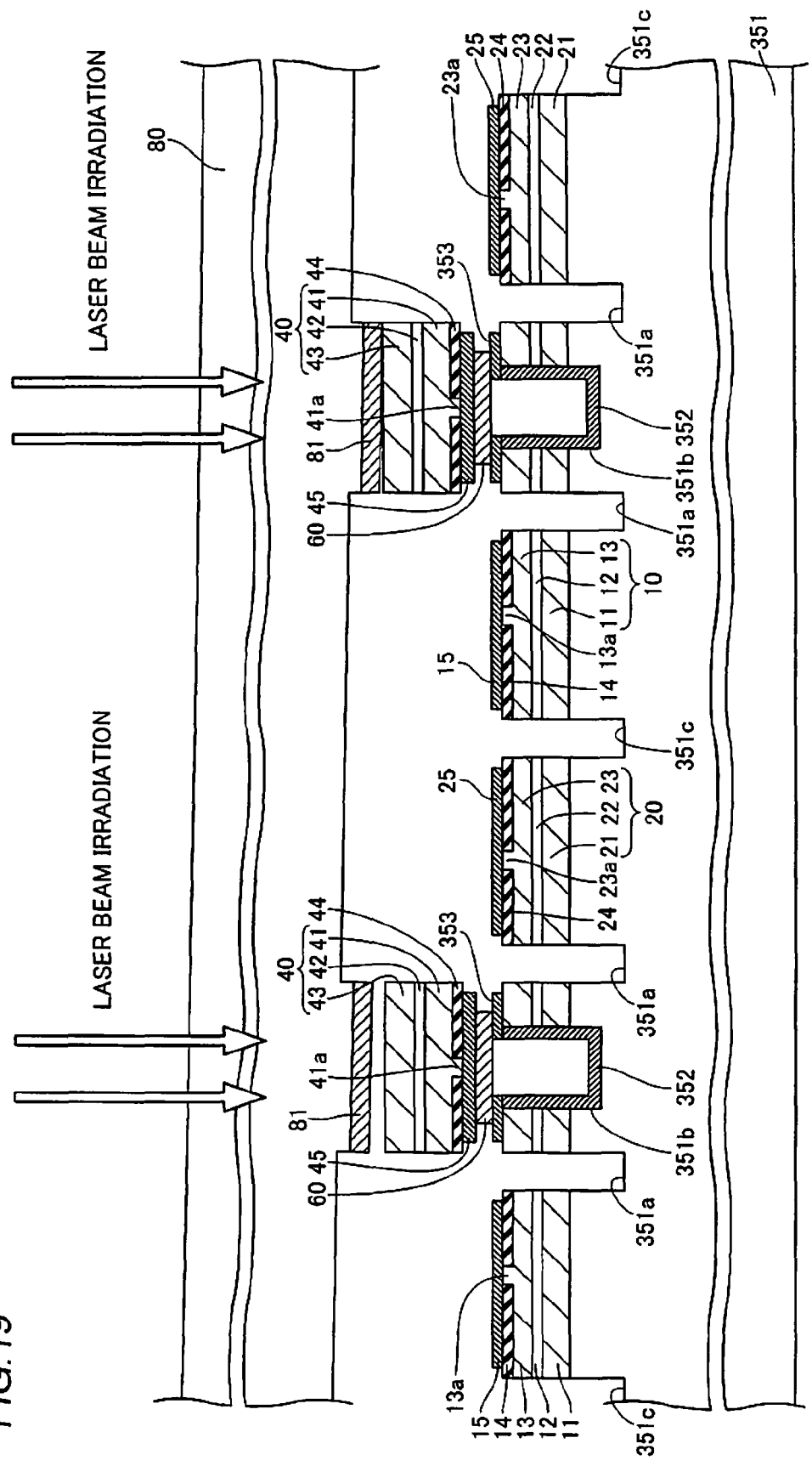

In a "separation step of a growth substrate", second harmonics of an Nd:YAG laser beam (wavelength: about 532 run) is applied to the n-type GaN substrate 80 from a back surface of the n-type GaN substrate 80 (upper surface of the n-type GaN substrate 80 in FIG. 19), whereby the n-type GaN substrate 80 is separated from the blue-violet semiconductor laser elements 40 along the breakdown region of the InGaN separative layers 81, as shown in FIG. 19.

Figure 20:
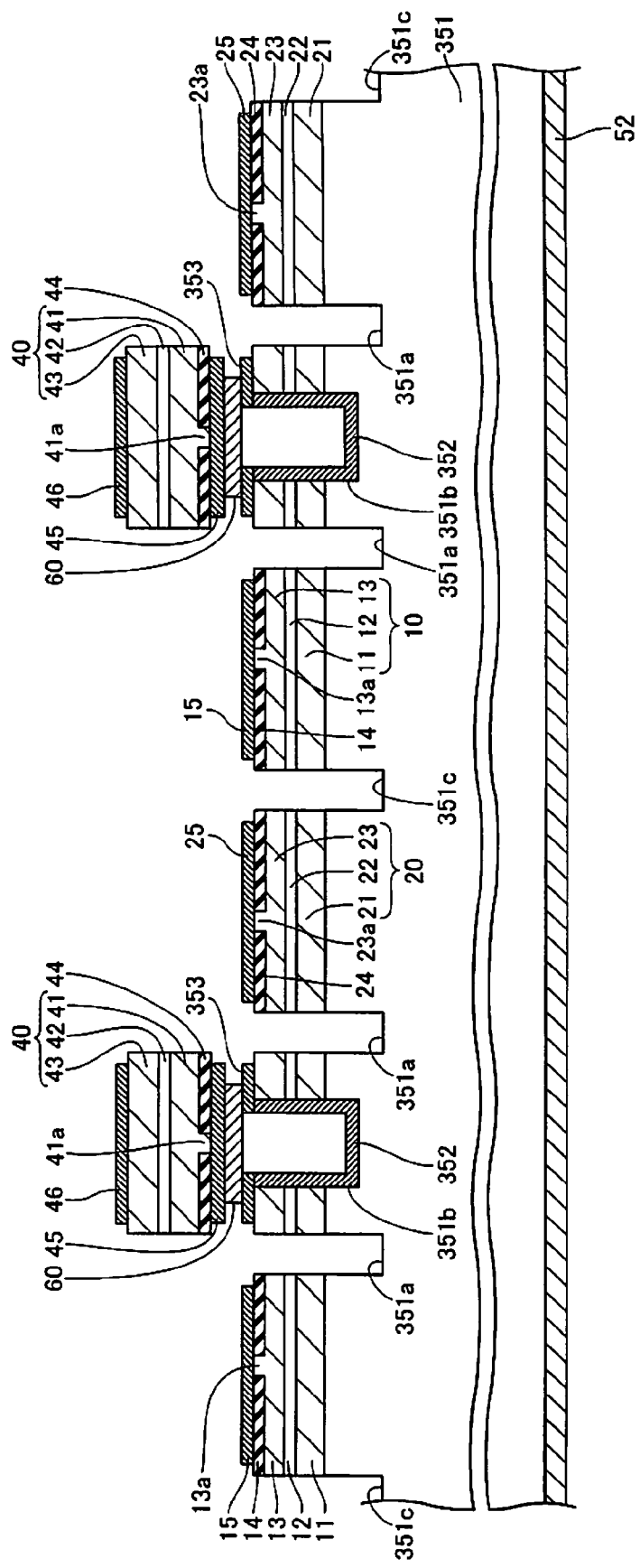

As shown in FIG. 20, p-side electrodes 46 are formed on upper surfaces of the p-type AlGaN cladding layers 43 exposed on upper surfaces of the blue-violet semiconductor laser element 40 by vacuum evaporation. The thickness of the n-type GaAs substrate 351 of the monolithic two-wavelength semiconductor laser element portion 330 is reduced by a prescribed thickness by etching and thereafter the n-side electrode 52 is formed on the (overall) surface of the n-type GaAs substrate 351 by vacuum evaporation. The wafer-state three-wavelength semiconductor laser element portion 350 is formed in the aforementioned manner.

According to the second embodiment, the three-wavelength semiconductor laser element portion 350 is formed through the aforementioned manufacturing process, whereby the n-type AlGaN cladding layer 41 of the blue-violet semiconductor laser element 40 conducts with the n-type GaAs substrate 351 through the conduction portion 352 electrically connecting to the n-type GaAs substrate 351 formed on the region (semiconductor layer) held between the infrared semiconductor laser element 10 and the red semiconductor laser element 20 of the monolithic two-wavelength semiconductor laser element portion 330 while having the same polarity (n-type) as the n-type GaAs substrate 351, and hence the three-wavelength semiconductor laser element portion 350 having a simplified inner structure can be formed.

In the remaining manufacturing process such as an "electrode forming step" and the like is similar to that of the aforementioned first embodiment.

The semiconductor laser device 300 (see FIG. 14) comprising the three-wavelength semiconductor laser element portion 350 (see FIG. 14) according to the second embodiment is formed in the aforementioned manner.

According to the second embodiment, as hereinabove described, the conduction portion 352 and the electrode layer 353 covered with semiconductor layer and the electrically conducting with the n-type GaAs substrate 351 are provided on the surface of the region (semiconductor layer) held between the infrared semiconductor laser element 10 and the red semiconductor laser element 20 and the n-type AlGaN cladding layer 41 of the blue-violet semiconductor laser element 40 is bonded to the electrode layer 353 through the fusible layer 60, whereby the infrared and red semiconductor laser elements 10 and 20 and the blue-violet semiconductor laser element 40 can be easily connected in the cathode common type without providing a step portion reaching the n-type GaAs substrate 351 on the region (semiconductor layer) held between the infrared semiconductor laser element 10 and the red semiconductor laser element 20.

The remaining effects of the second embodiment are similar to those of the aforementioned first embodiment.

(First Modification of Second Embodiment)

Figure 21:
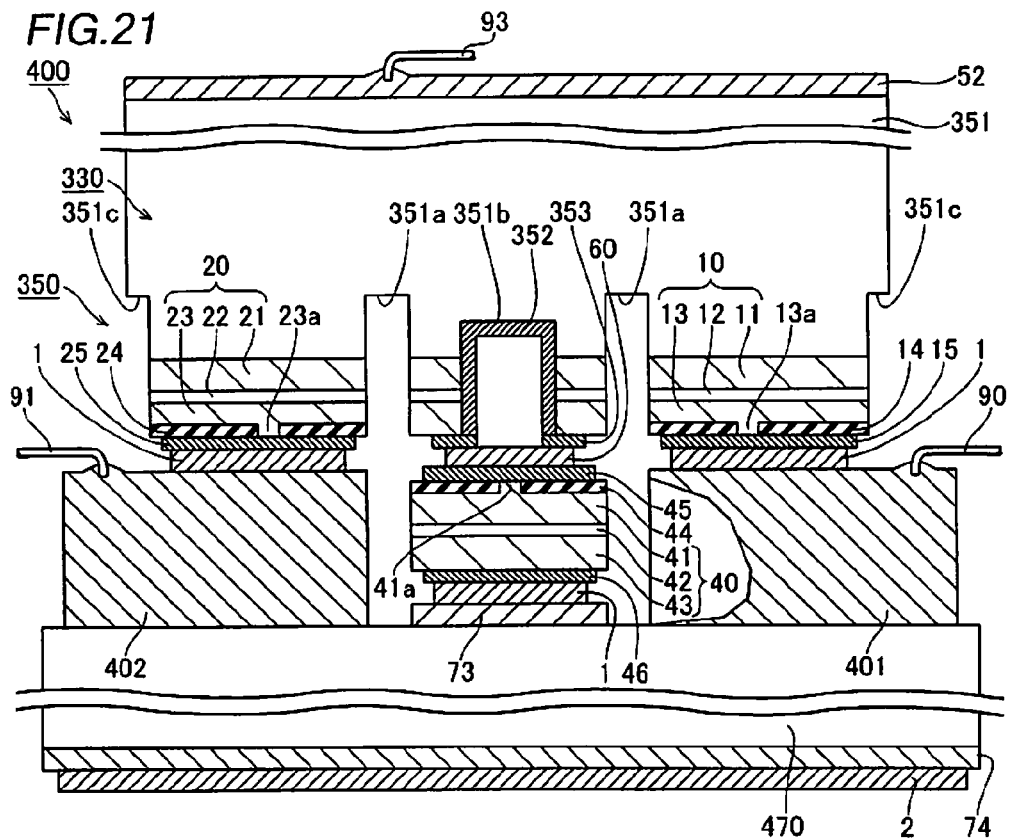
FIG. 21 is a sectional view showing a structure of a semiconductor laser device according to a first modification of the second embodiment of the present invention.

In a semiconductor laser device 400 according to a first modification of the second embodiment, electrode layers 401 and 402 each having a thickness corresponding to the thickness (height) of a blue-violet semiconductor laser element 40 are formed on regions bonded with an infrared semiconductor laser element 10 and a red semiconductor laser element 20 in an upper surface of a flat base 470 with no etching so that the base 470 is formed to have a recess portion, as shown in FIG. 21, dissimilarly to the aforementioned second embodiment. Thus, a three-wavelength semiconductor laser element portion 350 having a projecting shape corresponding to a portion of the blue-violet semiconductor laser element 40 is bonded to the base 470. The base 470 is an example of the "heat radiator base" in the present invention.

The remaining structure of the three-wavelength semiconductor laser element portion 350 according to the first modification of the second embodiment is similar to that of the aforementioned second embodiment.

(Second Modification of Second Embodiment)

Figure 22:
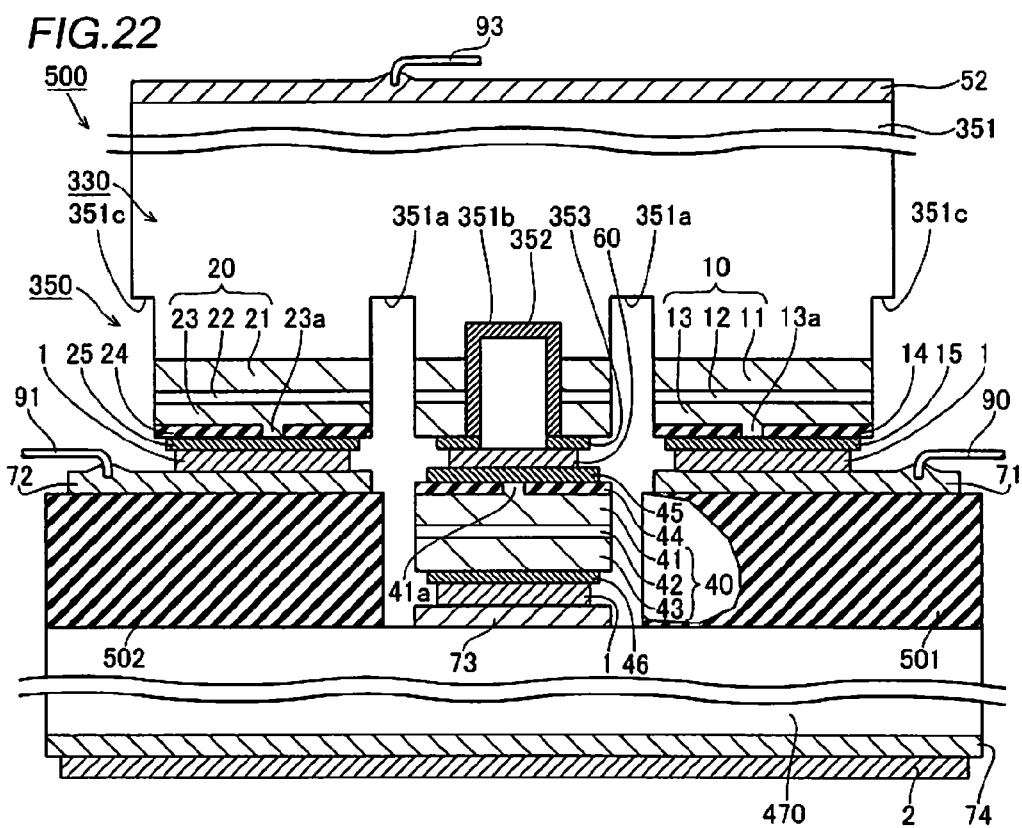
FIG. 22 is a sectional view showing a structure of a semiconductor laser device according to a second modification of the second embodiment of the present invention.

In a semiconductor laser device 500 according to a second modification of the second embodiment, insulating films 501 and 502 made of $SiO_2$ each having a thickness corresponding to the thickness (height) of a blue-violet semiconductor laser element 40 are formed on regions bonded with an infrared semiconductor laser element 10 and a red semiconductor laser element 20 in an upper surface of a flat base 470 respectively and electrode layers 71 and 72 each having a thickness similar to the second embodiment are formed on upper surfaces of the insulating films 501 and 502 respectively so that the base 470 is formed to have a recess portion, as shown in FIG. 22, dissimilarly to the aforementioned second embodiment. Thus, a three-wavelength semiconductor laser element portion 350 having a projecting shape which is a portion of the blue-violet semiconductor laser element 40 is bonded to the base 470.

The remaining structure of the three-wavelength semiconductor laser element portion 350 according to the second modification of the second embodiment is similar to that of the aforementioned second embodiment.

(Third Modification of Second Embodiment)

In a semiconductor laser device 600 according to a third modification of the second embodiment, an electrode layer 601 is formed on an overall upper surface of a flat base 470 and insulating films 602 and 603 made of $SiO_2$ each having a thickness corresponding to the thickness (height) of a blue-violet semiconductor laser element 40 are formed on regions bonded with an infrared semiconductor laser element 10 and a red semiconductor laser element 20 respectively as shown in FIG. 23, dissimilarly to the aforementioned second embodiment. Electrode layers 71 and 72 each having a thickness similar to the second embodiment are formed on upper surfaces of the insulating films 602 and 603 respectively so that the base 470 is formed to have a recess portion. Thus, a three-wavelength semiconductor laser element portion 350 having a projecting shape which is a portion of the blue-violet semiconductor laser element 40 is bonded to the base 470.

The remaining structure of the three-wavelength semiconductor laser element portion 350 according to the third modification of the second embodiment is similar to that of the aforementioned second embodiment.

According to the first to third modifications of the second embodiment, the semiconductor laser devices 400, 500 and 600 comprising three-wavelength semiconductor laser element portions 350 having simplified inner structures can be formed in the aforementioned manner similarly to the aforementioned second embodiment. The remaining effects of the first to third modifications of the second embodiment are similar to those of the aforementioned second embodiment.

(Fourth Modification of Second Embodiment)

In a semiconductor laser device 650 according to a fourth modification of the second embodiment, an isolation groove 351d reaching an n-type GaAs substrate 351 and a hole 351e reaching an n-type AlGaAs cladding layer 11 of the infrared semiconductor laser element 10 are formed on a region held between the infrared semiconductor laser element 10 and the red semiconductor laser element 20 of a monolithic two-wavelength semiconductor laser element portion 331 as shown in FIG. 24, dissimilarly to the aforementioned second embodiment. A conduction portion 355 reaching from a surface of a semiconductor layer (electrode layer 353) to the n-type AlGaAs cladding layer 11 is provided on an inner surface of the hole 351e. Thus, the blue-violet semiconductor laser element 40 is electrically connected to the n-type AlGaAs cladding layer 11 through an fusible layer 60, the electrode layer 353 and the conduction portion 355. The conduction portion 355 is an example of the "connection region" in the present invention. The remaining structure and manufacturing process of the three-wavelength semiconductor laser element portion 350 according to the fourth modification of the second embodiment is similar to those of the aforementioned first embodiment.

According to the fourth modification of the second embodiment, the conduction portion 355 and the electrode layer 353 electrically conducting with the n-type AlGaAs cladding layer 11 of the infrared semiconductor laser element 10 are provided on the surface of the region (semiconductor layer) held between the infrared semiconductor laser element 10 and the red semiconductor laser element 20 and the n-type AlGaN cladding layer 41 of the blue-violet semiconductor laser element 40 is bonded to the electrode layer 353 through the fusible layer 60, whereby the infrared and red semiconductor laser elements 10 and 20 and the blue-violet semiconductor laser element 40 can be easily connected in a cathode common type similarly to the aforementioned second embodiment. The remaining effects of the fourth modification of the second embodiment are also similar to those of the aforementioned second embodiment.

While the hole 351e reaching the n-type AlGaAs cladding layer 11 is provided on the infrared semiconductor laser element 10 in the aforementioned fourth modification of the second embodiment, the present invention is not restricted to this, but a hole and a conduction portion reaching the n-type AlGaInP cladding layer 21 may be provided on the red semiconductor laser element 20 and the n-type AlGaN cladding layer 41 of the blue-violet semiconductor laser element 40 may be electrically connected to the conduction portion through the fusible layer 60.

(Third Embodiment)

Figure 25:
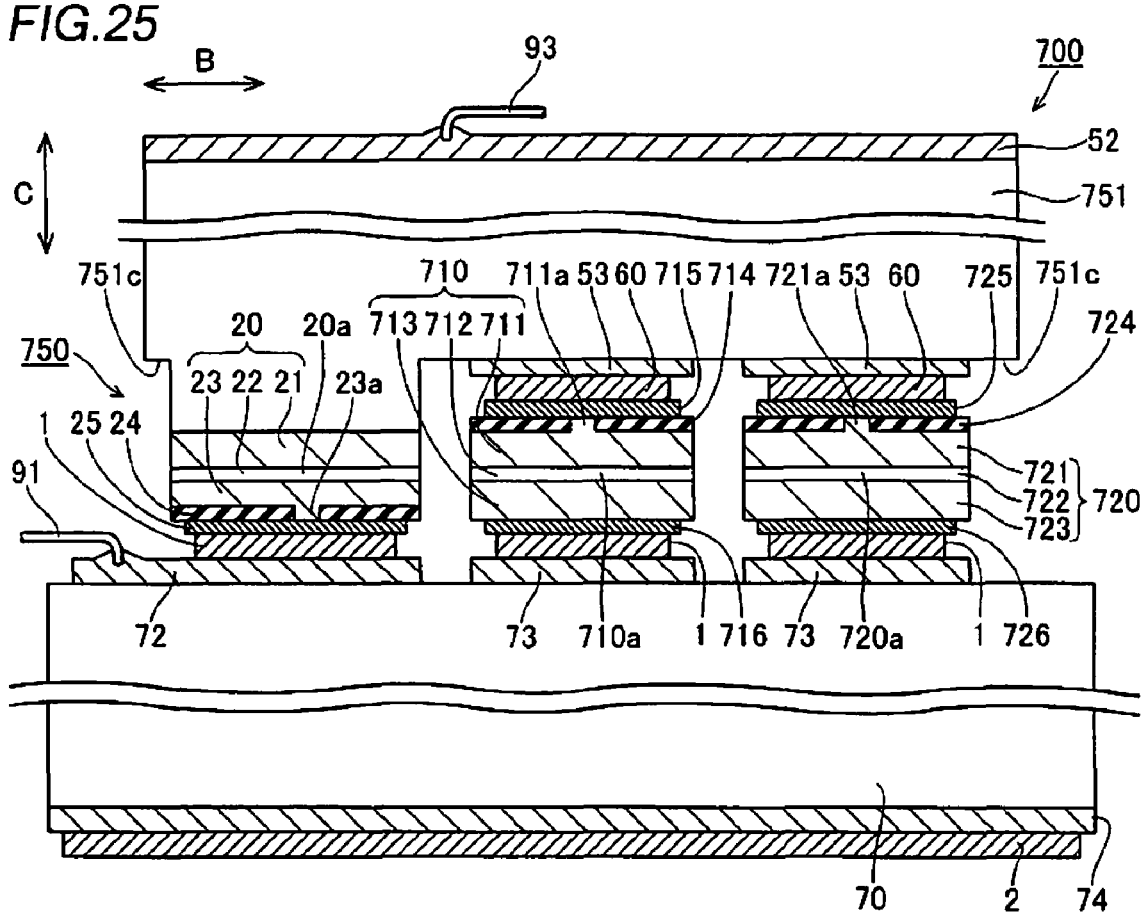
FIG. 25 is a front elevational view showing a structure of a semiconductor laser device according to a third embodiment of the present invention.

In a semiconductor laser device 700 according to a third embodiment, an RGB multiple wavelength semiconductor laser element portion 750, in which a blue semiconductor laser element 710 having a lasing wavelength of about 450 nm and a green semiconductor laser element 720 having a lasing wavelength of about 532 nm are bonded to a red semiconductor laser element 20 formed on an n-type GaAs substrate 751 through fusible layers 60, is fixed to a base 70 through a conductive bonding layer 1 made of a metal layer such as AuSn solder as shown in FIG. 25, dissimilarly to the aforementioned first embodiment. The n-type GaAs substrate 751 is an example of the "first conductive substrate" in the present invention and the blue semiconductor laser element 710 and the green semiconductor laser element 720 are each an example of the "second semiconductor laser element" in the present invention.

The blue semiconductor laser element 710 is constituted by an n-type AlGaN cladding layer 711, an active layer 712 having an MQW structure and a p-type AlGaN cladding layer 713, as shown in FIG. 25. The n-type AlGaN cladding layer 711 is provided with a ridge portion 711a extending in a direction A (see FIG. 2) which is a direction perpendicular to the drawing. Insulating films 714 are formed on a surface of the n-type AlGaN cladding layer 711 except the ridge portion 711a in addition to the aforementioned structure. An n-side electrode 715 is formed on upper surfaces of the ridge portion 711a of the n-type AlGaN cladding layer 711 and the insulating films 714. A p-side electrode 716 is formed on a lower surface of the p-type AlGaN cladding layer 713. As shown in FIG. 25, a lower surface of the p-side electrode 716 and an upper surface of the electrode layer 73 formed on the base 70 are bonded to each other. The n-type AlGaN cladding layer 711, the active layer 712 and the p-type AlGaN cladding layer 713 are examples of the "first conductive type third semiconductor layer", the "second active layer" and the "second conductive type fourth semiconductor layer" in the present invention respectively. The n-side electrode 715 and the p-side electrode 716 are examples of the "first electrode" and the "second electrode" in the present invention respectively.

The green semiconductor laser element 720 is constituted by an n-type AlGaN cladding layer 721, an active layer 722 having an MQW structure and a p-type AlGaN cladding layer 723, as shown in FIG. 25. The n-type AlGaN cladding layer 721 is provided with a ridge portion 721a extending in the direction A (see FIG. 2) which is the direction perpendicular to the drawing. Insulating films 724 are formed on a surface of the n-type AlGaN cladding layer 721 except the ridge portion 721a in addition to the aforementioned structure. An n-side electrode 725 is formed on upper surfaces of the ridge portion 721a of the n-type AlGaN cladding layer 721 and the insulating films 724. A p-side electrode 726 is formed on a lower surface of the p-type AlGaN cladding layer 723. As shown in FIG. 25, a lower surface of the p-side electrode 726 and an upper surface of the electrode layer 73 formed on the base 70 are bonded to each other.

The n-type AlGaN cladding layer 721, the active layer 722 and the p-type AlGaN cladding layer 723 are examples of the "first conductive type third semiconductor layer", the "second active layer" and the "second conductive type fourth semiconductor layer" in the present invention respectively. The n-side electrode 725 and the p-side electrode 726 are examples of the "first electrode" and the "second electrode" in the present invention respectively.

As shown in FIG. 25, the blue semiconductor laser element 710 and the green semiconductor laser element 720 are formed with light emitting surfaces 710a and 720a respectively. The remaining structure of the semiconductor laser device 700 according to the third embodiment is similar to that of the aforementioned first embodiment.

A manufacturing process of the semiconductor laser device 700 according to the third embodiment will be now described with reference to FIGS. 25 to 28.

Figure 26:
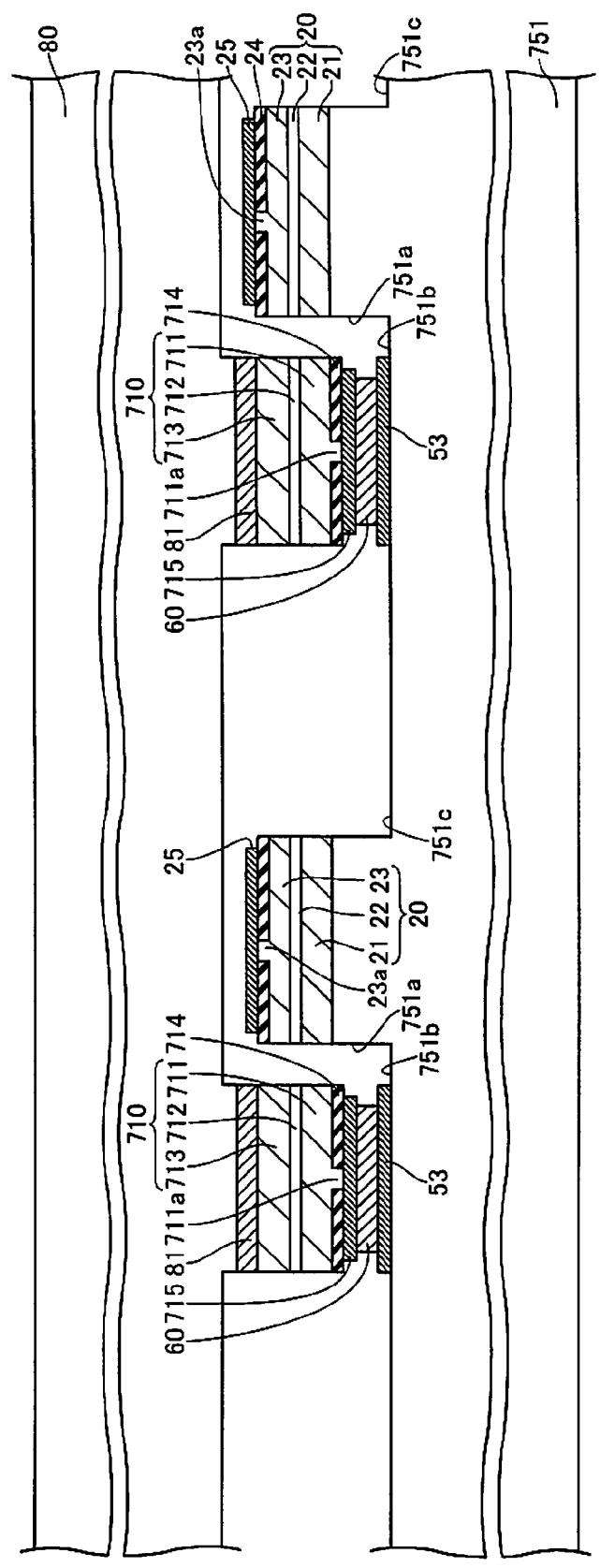
FIGS. 26 to 28 are diagrams for illustrating a manufacturing process for the semiconductor laser device according to the third embodiment shown in FIG. 25.

As shown in FIG. 26, the red semiconductor laser elements 20 are formed on the upper surface of the n-type GaAs substrate 751 through a manufacturing process similar to the manufacturing process of the aforementioned first embodiment. The p-side electrodes 25 each having an outermost surface made of an Au film are formed on the upper surfaces of the ridge portions 23a and the insulating films 24 of the red semiconductor laser element 20 by vacuum evaporation.

As shown in FIG. 26, the blue semiconductor laser elements 710 formed through a manufacturing process similar to that of the aforementioned first embodiment and the electrode layers 53 provided on bottoms 751b of step portions 751a of the n-type GaAs substrate 751 are opposed and bonded to each other through the fusible layers 60 with a load of about 100 N at a temperature of about 295° C. The n-type GaN substrate 80 is separated from the blue-violet semiconductor laser elements 710 along the breakdown region of InGaN separative layers 81 with second harmonics of an Nd:YAG laser beam.

Figure 27:
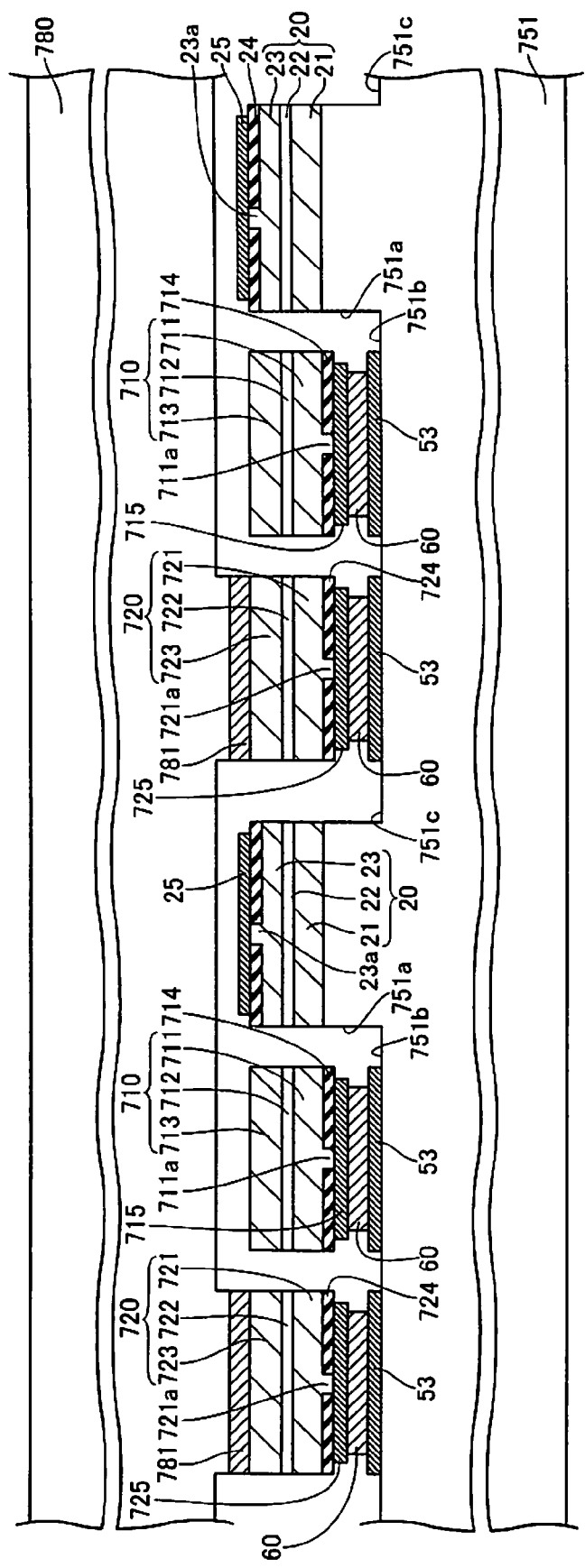

As shown in FIG. 27, the green semiconductor laser element 720 formed through a manufacturing process similar to that of the aforementioned first embodiment and the electrode layers 53 provided on step portions 751a of the n-type GaAs substrate 751 are opposed and bonded to each other, similarly to the blue-violet semiconductor laser elements 40. The n-type GaN substrate 780 is separated from the green semiconductor laser element 720 along the breakdown region of the InGaN separative layers 781 with second harmonics of an Nd:YAG laser beam.

Figure 28:
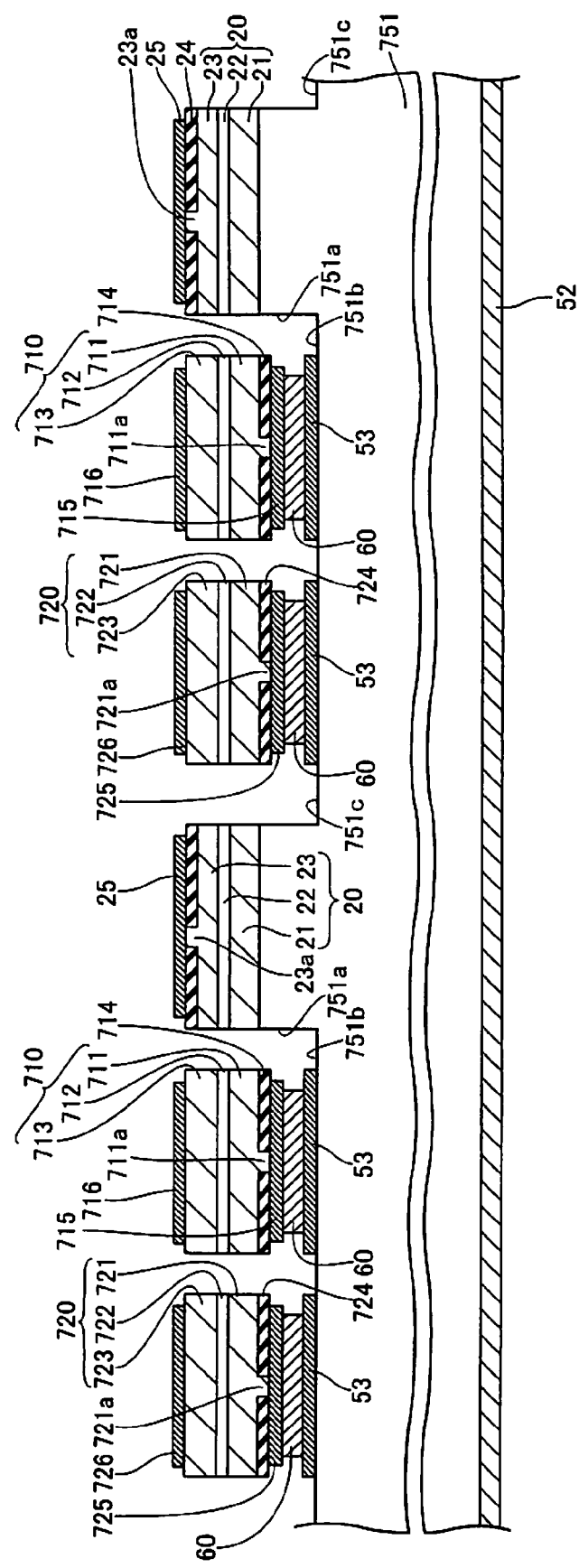

As shown in FIG. 28, p-side electrodes 716 and 726 are formed on upper surfaces of the p-type AlGaN cladding layer 713 and 723 exposed on upper surfaces of the blue semiconductor laser elements 710 and the green semiconductor laser elements 720 by vacuum evaporation, respectively. The thickness of the n-type GaAs substrate 751 is reduced by a prescribed thickness by etching and thereafter the n-side electrode 52 is formed on the n-type GaAs substrate 751 by vacuum evaporation.

The remaining manufacturing process of the third embodiment is similar to that of the aforementioned first embodiment. Thus, the semiconductor laser device 700 (see FIG. 25) comprising the RGB multiple wavelength semiconductor laser element portion 750 (see FIG. 25) according to the third embodiment is formed in the aforementioned manner. The effects of the third embodiment are similar to those of the aforementioned first embodiment.

(Fourth Embodiment)

Figure 29:
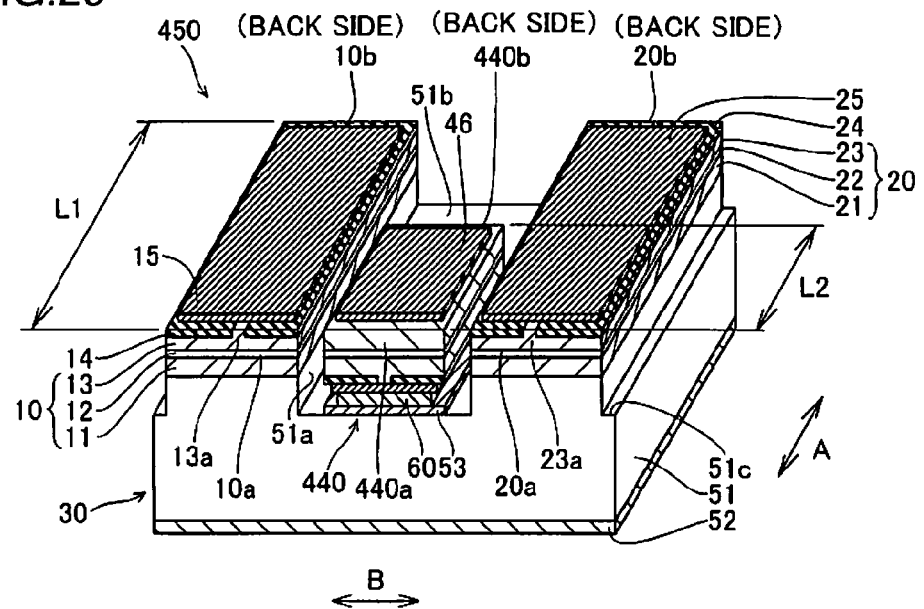
FIG. 29 is a perspective view showing a structure of a three-wavelength semiconductor laser element portion constituting a semiconductor laser device according to a fourth embodiment of the present invention.

Referring to FIGS. 1 and 29, the cavity length of a blue-violet semiconductor laser element 440 is smaller than the cavity lengths of an infrared semiconductor laser element 10 and a red semiconductor laser element 20 in a fourth embodiment, dissimilarly to the aforementioned first embodiment. The blue-violet semiconductor laser element 440 is an example of the "second semiconductor laser element" in the present invention.

In a three-wavelength semiconductor laser element portion 450 according to the fourth embodiment, the cavity lengths L1 of the infrared semiconductor laser element 10 and the red semiconductor laser element 20 are about 2 mm, while the cavity length L2 of the blue-violet semiconductor laser element 440 is about 1 mm, as shown in FIG. 29. Light emitting surfaces (light emitting surfaces 10a, 20a and 440a) of the respective semiconductor laser elements are arranged on substantially the same plane. Therefore, a region of a step portion 51b, bonded with no blue-violet semiconductor laser element 440 remains in the back of a light reflecting surface 440b of the blue-violet semiconductor laser element 440. The three-wavelength semiconductor laser element portion 450 is fixed to a base 70 (see FIG. 1) in a junction-down system similarly to the aforementioned first embodiment.

The remaining structure of a semiconductor laser device 100a (see FIG. 1) according to the fourth embodiment is similar to the aforementioned first embodiment.

The manufacturing process of the semiconductor laser device 100a according to the fourth embodiment will be now described with reference to FIGS. 1, and 3 to 11, 29 and 30.

Wafer-state monolithic two-wavelength semiconductor laser element portions 30 (see FIG. 4) are formed through a manufacturing process similar to that of the aforementioned first embodiment shown in FIGS. 3 and 4.

Wafer-state blue-violet semiconductor laser elements 440 (see FIG. 6) are formed through a manufacturing process similar to that of the aforementioned first embodiment shown in FIGS. 5 and 6.

Figure 30:
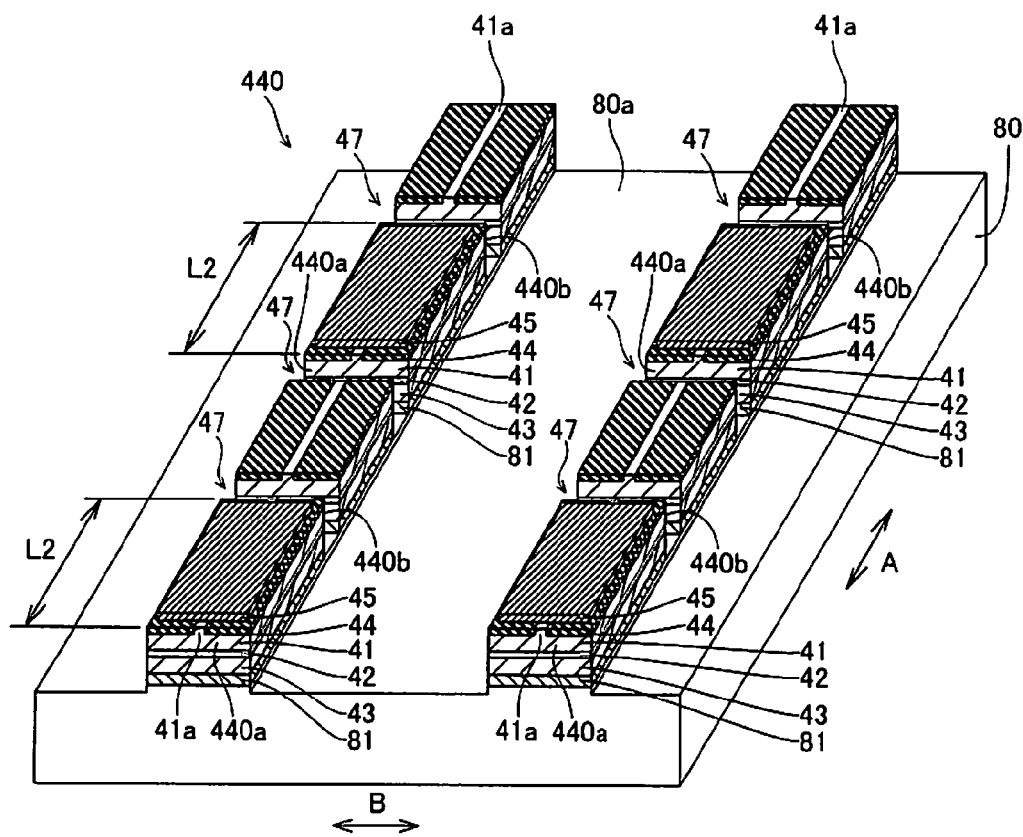
FIG. 30 is a diagram for illustrating a manufacturing process for the semiconductor laser device according to the fourth embodiment shown in FIG. 29.

In the manufacturing process of the fourth embodiment, step portions 80a is formed by etching before a step of forming the n-side electrodes 45 as shown FIG. 30. A plurality of grooves 47 extending in a direction (direction B) perpendicular to an extensional direction of ridge portions 41a are formed on prescribed positions of the blue-violet semiconductor laser elements 440 at prescribed intervals in the extensional direction (direction A) of the ridge portions 41a by etching. At this time, the grooves 47 are preferably formed by removing the InGaN separative layers 81 from the n-type AlGaN cladding layers 41 toward the n-type GaN substrate 80 by etching. Therefore, the surface (upper surface) of the n-type GaN substrate 80 are exposed on the bottoms of the grooves 47. Thereafter the n-side electrodes 45 are formed on the upper surfaces of the ridge portions 41a and the insulating films 44 having the cavity lengths L2. Thus, a plurality of the blue-violet semiconductor laser elements 440 having pairs of cavity facets (the light emitting surfaces 440a and the light reflecting surfaces 440b) are formed on a wafer.

As shown in FIG. 7, the wafer-state blue-violet semiconductor laser elements 440 formed with the cavity facets are bonded to the monolithic two-wavelength semiconductor laser element portions 30. The n-type GaN substrate 80 are separated and the p-side electrodes 46 are formed on the upper surfaces of the p-type AlGaN cladding layers 43 exposed on the upper surfaces of the blue-violet semiconductor laser elements 440 through a manufacturing process similar to that of the aforementioned first embodiment shown in FIGS. 8 and 9. Thereafter the wafer-state three-wavelength semiconductor laser element portions 450 (see FIG. 9) are cleaved to be in the form of bars through a manufacturing process similar to the aforementioned first embodiment shown in FIG. 10. At this time, the monolithic two-wavelength semiconductor laser element portions 30 are cleaved such that the light emitting surface 10a and 20a of the monolithic two-wavelength semiconductor laser element portions 30 and the light emitting surfaces 440a of the blue-violet semiconductor laser elements 440 are arranged on substantially the same plane, as shown in FIG. 29. The elements are divided through a manufacturing process similar to the aforementioned first embodiment shown in FIG. 11. A plurality of the three-wavelength semiconductor laser element portions 450 according to the fourth embodiment shown in FIG. 29 are formed in the aforementioned manner. The remaining manufacturing process for the semiconductor laser device 100a (see FIG. 1) according to the fourth embodiment is similar to that of the aforementioned first embodiment.

According to the fourth embodiment, as hereinabove described, the plurality of semiconductor laser elements having the different cavity lengths L1 and L2 are bonded to each other so that the three-wavelength semiconductor laser element portion 450 is formed, whereby the semiconductor laser element (three-wavelength semiconductor laser element portion 450) integrated in one chip is formed in consideration of the operating characteristics (light output-current characteristics or temperature characteristics) of the respective semiconductor laser element, also when the semiconductor laser elements having different lasing wavelengths are combined with each other. Thus, the operating characteristics of the semiconductor laser element can be optimized.

According to the fourth embodiment, the cavity length L2 of the blue-violet semiconductor laser element 440 is shorter than the cavity lengths L1 of the infrared semiconductor laser element 10 and the red semiconductor laser element 20, whereby the infrared semiconductor laser element 10 and the red semiconductor laser element 20 having longer cavity lengths for reducing current density or improving temperature characteristics and the blue-violet semiconductor laser element 440 having a shorter cavity length for suppressing increase in a threshold current or reduction in a slop efficiency are integrated in one chip so that the three-wavelength semiconductor laser element portion 450 can be formed, and hence operating characteristics of the laser element of one chip can be easily optimized.

(Modification of Fourth Embodiment)

Referring to FIGS. 1, 4, 6, 7, 9, 31 and 32, a first cavity facet of a blue-violet semiconductor laser element 440 is formed by etching while a second cavity facet of the blue-violet semiconductor laser element 440 is formed by cleavage in a modification of the fourth embodiment, dissimilarly to the manufacturing process of the aforementioned fourth embodiment.

Wafer-state monolithic two-wavelength semiconductor laser element portions 30 (see FIG. 4) and wafer-state blue-violet semiconductor laser elements 440 (see FIG. 6) are formed through a manufacturing process similar to that of the aforementioned fourth embodiment.

Figure 32:
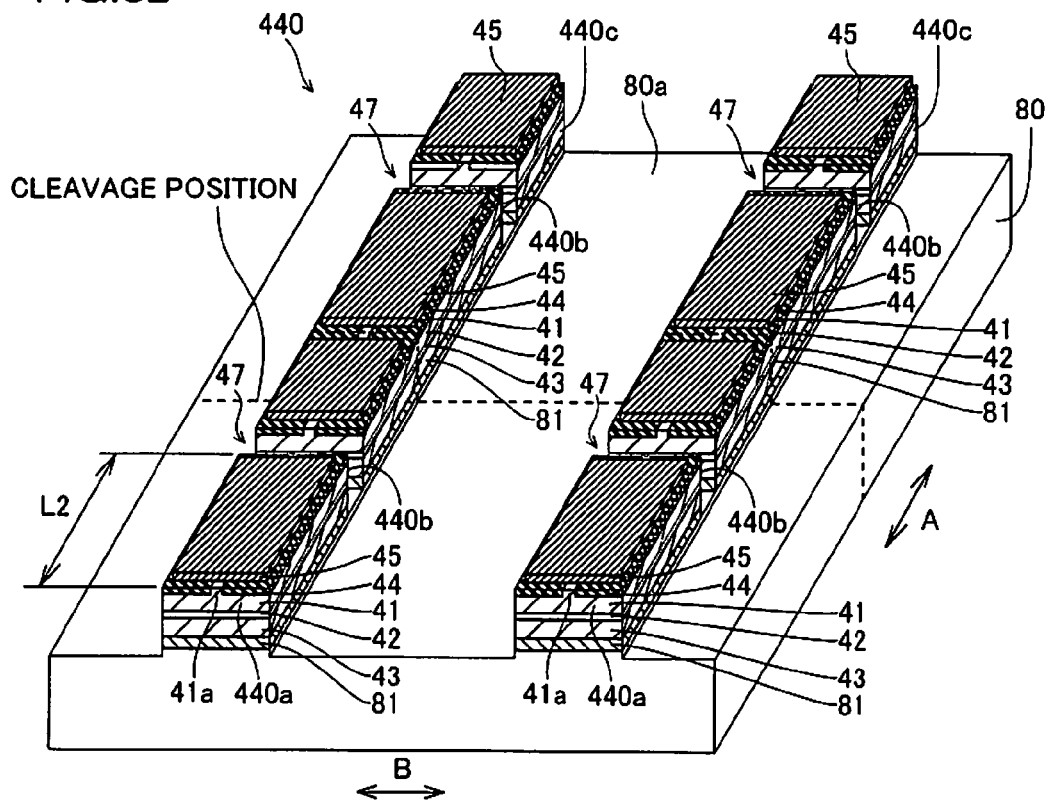
FIG. 32 is a diagram for illustrating a manufacturing process for the semiconductor laser device according to the modification of the fourth embodiment shown in FIG. 31.

In the manufacturing process of the modification of the fourth embodiment, step portions 80a are formed by etching before a step of forming the n-side electrodes 45 as shown FIG. 32. A plurality of grooves 47 extending in a direction (direction B) perpendicular to an extensional direction of ridge portions 41a are formed on prescribed positions of the blue-violet semiconductor laser elements 440 at prescribed intervals in the extensional direction (direction A) of the ridge portions 41a by etching. Thus, a plurality of wafer-state blue-violet semiconductor laser elements 440 having only first cavity facets (light reflecting surfaces 440b, for example) are formed. Thereafter the n-side electrodes 45 are formed on upper surfaces of the ridge portions 41a and insulating films 44.

Figure 31:
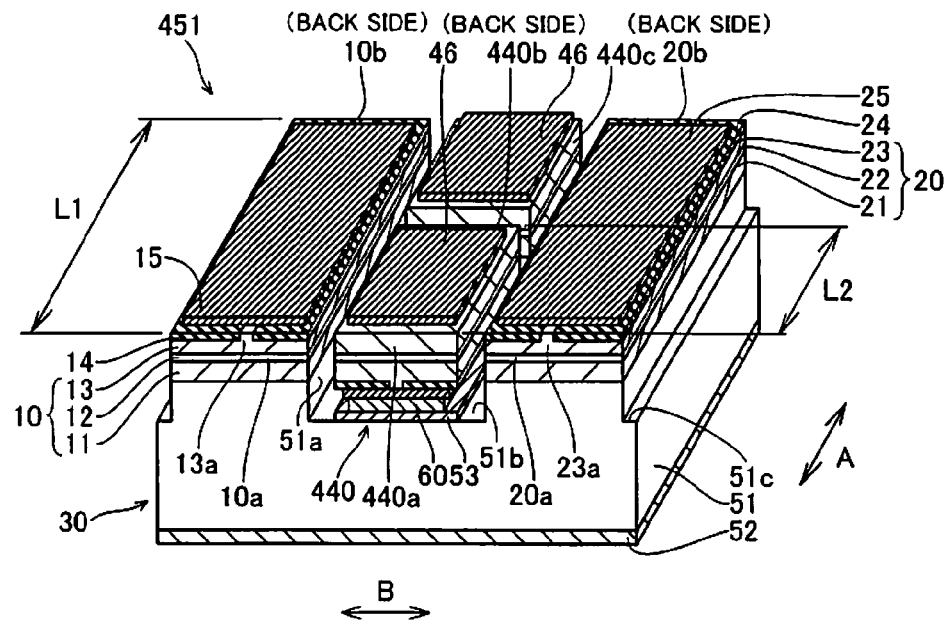
FIG. 31 is a perspective view showing a structure of a three-wavelength semiconductor laser element portion constituting a semiconductor laser device according to a modification of the fourth embodiment of the present invention.

As shown in FIG. 7, the aforementioned wafer-state blue-violet semiconductor laser elements 440 are bonded to the monolithic two-wavelength semiconductor laser element portions 30. At this time, the fusible layers 60 are previously formed only on regions of the electrode layers 53 of the monolithic two-wavelength semiconductor laser element portions 30, bonded with the blue-violet semiconductor laser elements 440. Then the n-type GaN substrate 80 is separated similarly to the aforementioned fourth embodiment. The p-side electrodes 46 are formed on upper surfaces of the p-type AlGaN cladding layers 43 after separation, and then wafer-state three-wavelength semiconductor laser element portions 451 (see FIG. 9) are cleaved to be in the form of bars. At this time, light emitting surfaces 10a and 20a of the monolithic two-wavelength semiconductor laser element portions 30 and light emitting surfaces 440a of the blue-violet semiconductor laser element 440 are so cleaved as to be arranged on substantially the same plane, as shown in FIG. 31, thereby forming the bar state three-wavelength semiconductor laser element portions 451. FIG. 32 shows an example of the blue-violet semiconductor laser elements 440 formed with the light emitting surfaces 440a cleaved together with the monolithic two-wavelength semiconductor laser element portions 30 at cleavage positions shown by a dotted line to be in the form of bars.

A plurality of chip-state three-wavelength semiconductor laser element portions 451 according to a modification of the fourth embodiment shown in FIG. 31 are formed by element division. As shown in FIG. 31, a semiconductor layer 440c formed with a p-side electrode 46 remains in the back of the light reflecting surface 440b of the blue-violet semiconductor laser element 440 with a groove 47 (see FIG. 32) therebetween. Therefore, the semiconductor layer 440c formed with the p-side electrode 46 of the three-wavelength semiconductor laser element portion 451 is also bonded to a base 70 through the conductive bonding layers 1 (see FIG. 1) when bonding the three-wavelength semiconductor laser element portion 451 to the base 70 (see FIG. 1). The remaining manufacturing process for a semiconductor laser device 100b (see FIG. 1) according to the modification of the fourth embodiment is similar to the aforementioned first embodiment.

According to the modification of the fourth embodiment, as hereinabove described, the semiconductor layer 440c is provided on the three-wavelength semiconductor laser element portion 451, whereby the bonding area of the three-wavelength semiconductor laser element portion 451 and the base 70 can be ensured even when the cavity length L2 of the blue-violet semiconductor laser element 440 is short, and hence the bonding strength between the three-wavelength semiconductor laser element portion 451 and the base 70 can be maintained.

According to the modification of the fourth embodiment, the light emitting surface 440a of the blue-violet semiconductor laser element 440 is formed by cleavage, whereby the light emitting surface 440a formed by a cleavage plane and having an improved planarity can be formed dissimilarly to the light reflecting surface 440b having microscopic unevenness by etching. Thus, a laser beam can be stably emitted. The remaining effects of a modification of the fourth embodiment is similar those of the aforementioned fourth embodiment.

(Fifth Embodiment)

Figure 33:
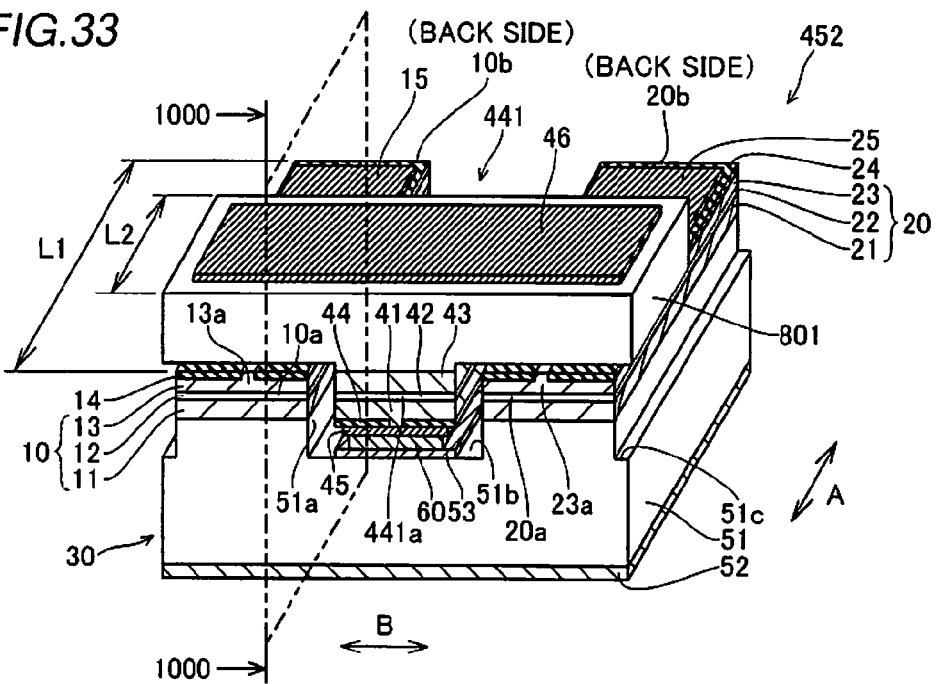
FIG. 33 is a perspective view showing a structure of a three-wavelength semiconductor laser element portion constituting a semiconductor laser device according to a fifth embodiment of the present invention.
Figure 34:
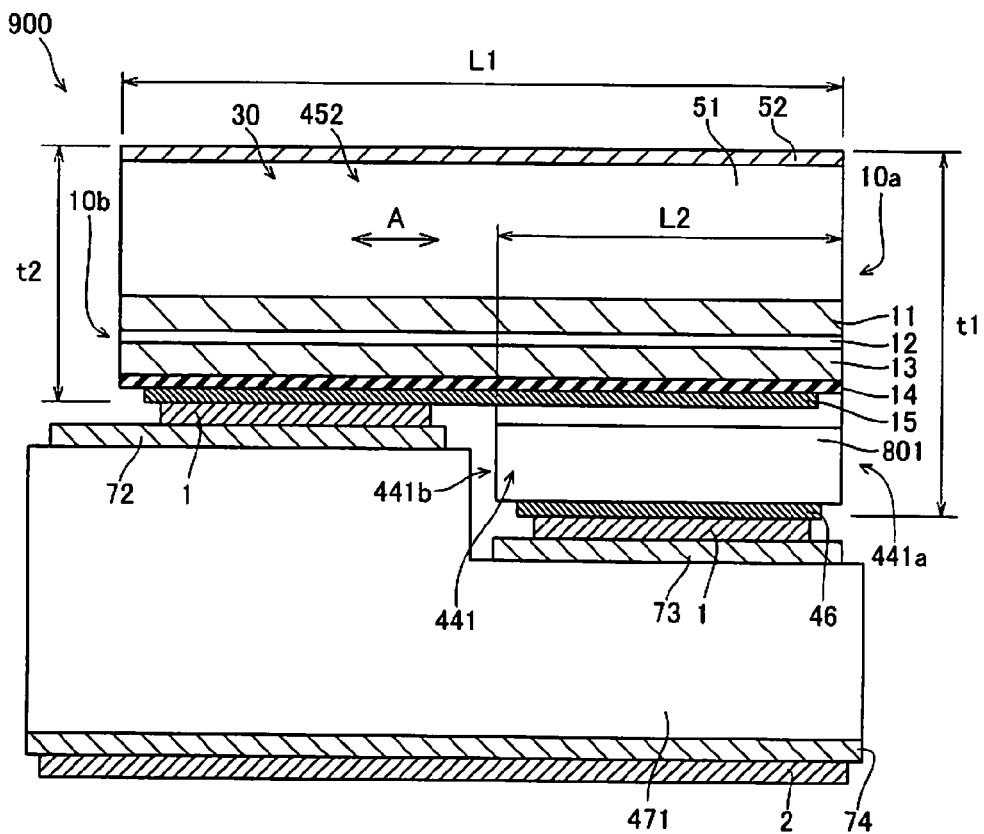
FIG. 34 is a sectional view showing the structure of the semiconductor laser device in cross-section in a direction (direction A) along the plane 1000-1000 of the three-wavelength semiconductor laser element portion on the base according to the fifth embodiment shown in FIG. 33.

Referring to FIGS. 33 and 34, each of a plurality of blue-violet semiconductor laser elements 441, previously formed in a bar state from a wafer state, is bonded to a monolithic two-wavelength semiconductor laser element portion 30 so that a three-wavelength semiconductor laser element portion 452 according to a fifth embodiment is formed, dissimilarly to the aforementioned fourth embodiment. The blue-violet semiconductor laser element 441 is an example of the "second semiconductor laser element" in the present invention. FIG. 34 shows a sectional structure of a semiconductor laser device 900 formed with the three-wavelength semiconductor laser element on the base 471 with step on the 1000-1000 plane (in a direction along a cavity direction (direction A) of the three-wavelength semiconductor laser element portion 452 except a ridge portion 13a) in FIG. 33.

According to the fifth embodiment, a bar-state blue-violet semiconductor laser element 441 having a p-type GaN substrate 801 is bonded to the monolithic two-wavelength semiconductor laser element portion 30 in the three-wavelength semiconductor laser element portion 452, as shown in FIG. 33. Therefore, an upper surface of the monolithic two-wavelength semiconductor laser element portion 30 is partially covered with the p-type GaN substrate 801 extending in a direction B of the blue-violet semiconductor laser element 441 in plan view. The p-type GaN substrate 801 is an example of the "second conductive type nitride-based semiconductor substrate" in the present invention.

As shown in FIG. 34, the three-wavelength semiconductor laser element portion 452 is formed such that a thickness t1 of a portion bonded with the blue-violet semiconductor laser element 441 is bonded is larger than a thickness t2 of a portion bonded with no blue-violet semiconductor laser element 441. Thus, the semiconductor laser device 900 according to the fifth embodiment is formed such that the three-wavelength semiconductor laser element portion 452 and a base 471 formed to correspond to a stepped shape (see FIG. 34) in a direction A of a lower surface of the three-wavelength semiconductor laser element portion 452. The base 471 is an example of the "heat radiator base" in the present invention. The remaining structure of the semiconductor laser device 900 according to the fifth embodiment is similar to that of the aforementioned first embodiment.

A manufacturing process for the semiconductor laser device 900 according to the fifth embodiment will be now described with reference to FIGS. 4 and 33 to 37.

The wafer-state monolithic two-wavelength semiconductor laser element portions 30 (see FIG. 4) are formed through a manufacturing process similar to the aforementioned first embodiment.

Figure 35:
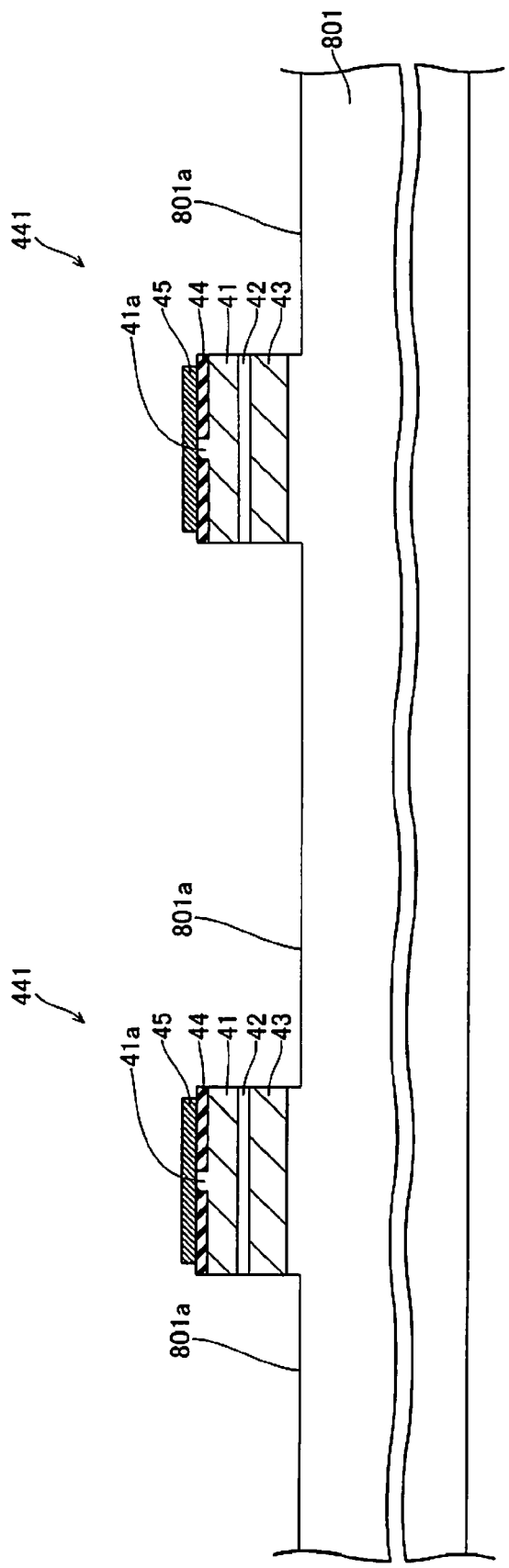
FIGS. 35 to 37 are diagrams for illustrating a manufacturing process for the semiconductor laser device according to the fifth embodiment shown in FIG. 33.

As shown in FIG. 35, p-type AlGaN cladding layers 43, active layers 42 and n-type AlGaN cladding layers 41 are successively staked on an upper surface of the p-type GaN substrate 801, thereby forming the blue-violet semiconductor laser elements 441. Ridge portions 41a are formed on upper surfaces of the n-type AlGaN cladding layer 41 by etching and thereafter insulating films 44 are formed on the upper surfaces of the n-type AlGaN cladding layers 41 except the ridge portions 41a. Thereafter n-side electrodes 45 are formed on upper surfaces of the ridge portion 41a and the insulating films 44. Step portions 801a reaching the p-type GaN substrate 801 are formed by etching.

Figure 36:
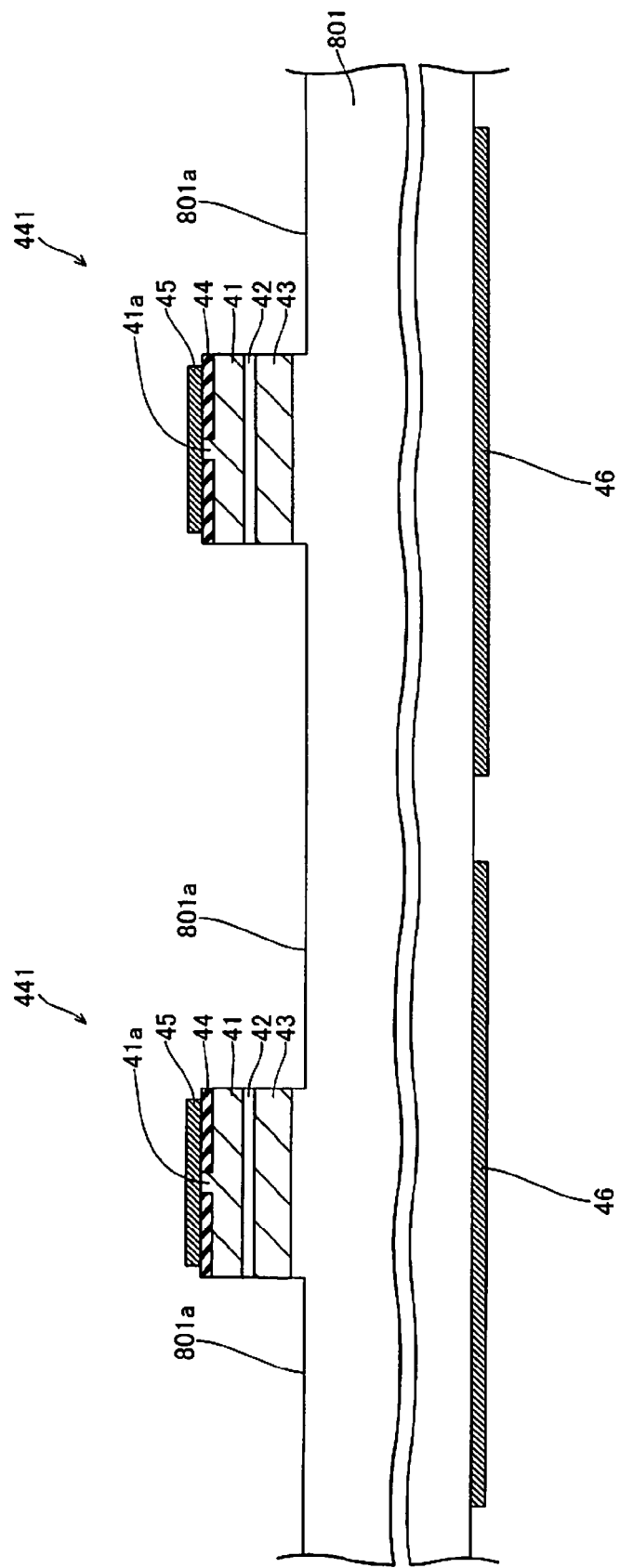

As shown in FIG. 36, the thickness of the p-type GaN substrate 801 is reduced by a prescribed thickness by etching or polishing and thereafter p-side electrodes 46 are formed on a lower surface of the p-type GaN substrate 801. The wafer-state blue-violet semiconductor laser elements 441 are formed in the aforementioned manner.

In the manufacturing process according to the fifth embodiment, a plurality of bar-state blue-violet semiconductor laser elements 441 are formed by cleavage. Thus, the bar-state blue-violet semiconductor laser elements 441 are formed with pairs of cavity facets (the light emitting surfaces 441a and the light reflecting surface 441b (see FIG. 34)).

Figure 37:
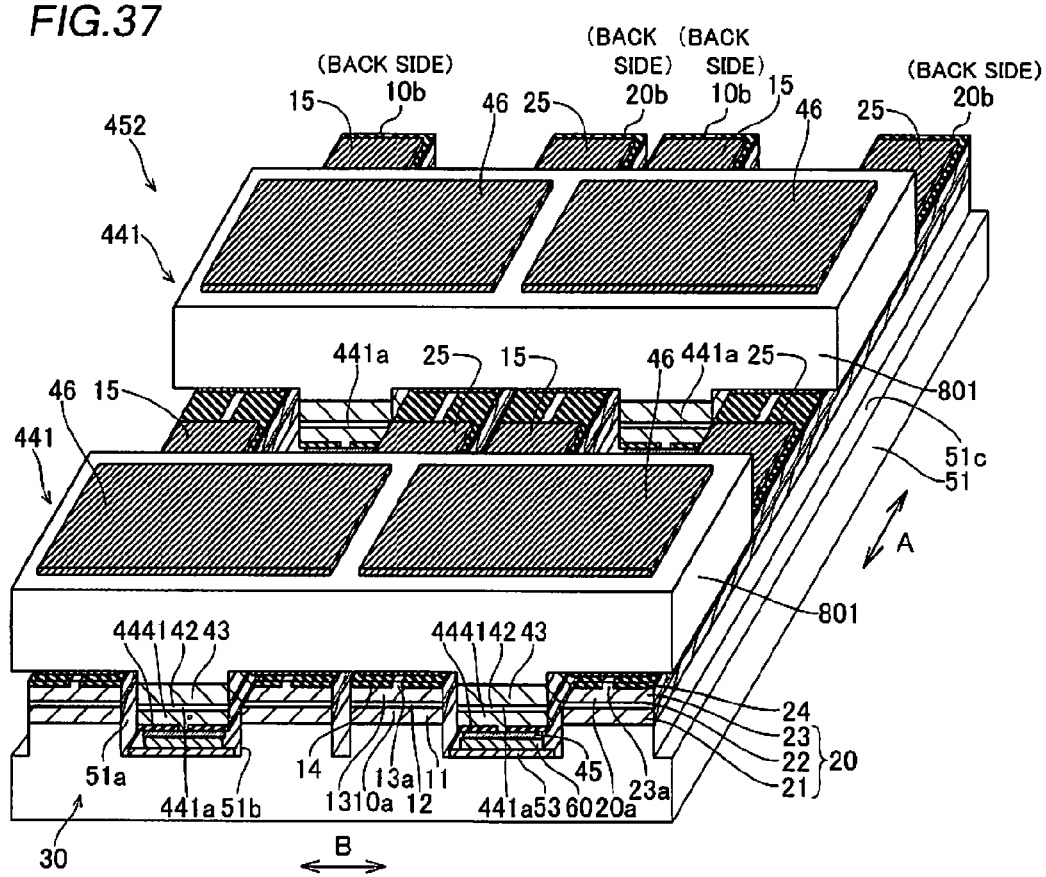

As shown in FIG. 37, the bar-state blue-violet semiconductor laser elements 441 are bonded to the wafer-state monolithic two-wavelength semiconductor laser element portions 30 at prescribed intervals. At this time, fusible layers 60 on the lower surfaces of the blue-violet semiconductor laser elements 441 are previously formed only on portions of the electrode layers 53 of the monolithic two-wavelength semiconductor laser element portion 30, bonded with the blue-violet semiconductor laser elements 441.

The monolithic two-wavelength semiconductor laser element portions 30 are cleaved to be in the form of bars and divided along the extensional direction (direction A in FIG. 37) of the cavities by element division, thereby forming a plurality of the three-wavelength semiconductor laser element portions 452 constituting the semiconductor laser device 900 shown in FIG. 33.

Finally, the three-wavelength semiconductor laser element portion 452 and a base 471 formed to correspond to the stepped shape of the lower surface of the three-wavelength semiconductor laser element portion 452 (see FIG. 34). The remaining manufacturing process for the semiconductor laser device 900 according to the fifth embodiment is similar to that of the aforementioned first embodiment.

As hereinabove described, the manufacturing process of the fifth embodiment comprises a step of bonding the plurality of blue-violet semiconductor laser elements 441 previously formed in the form of bars to the wafer-state monolithic two-wavelength semiconductor laser element portions 30 at prescribed intervals, whereby the wafer-state three-wavelength semiconductor laser element portion 452 can be easily cleaved on portions where the monolithic two-wavelength semiconductor laser element portions 30 have the thickness t2, to be in the form of bars. The remaining effects of the fifth embodiment are similar to those of the aforementioned fourth embodiment.

(Sixth Embodiment)

Figure 38:
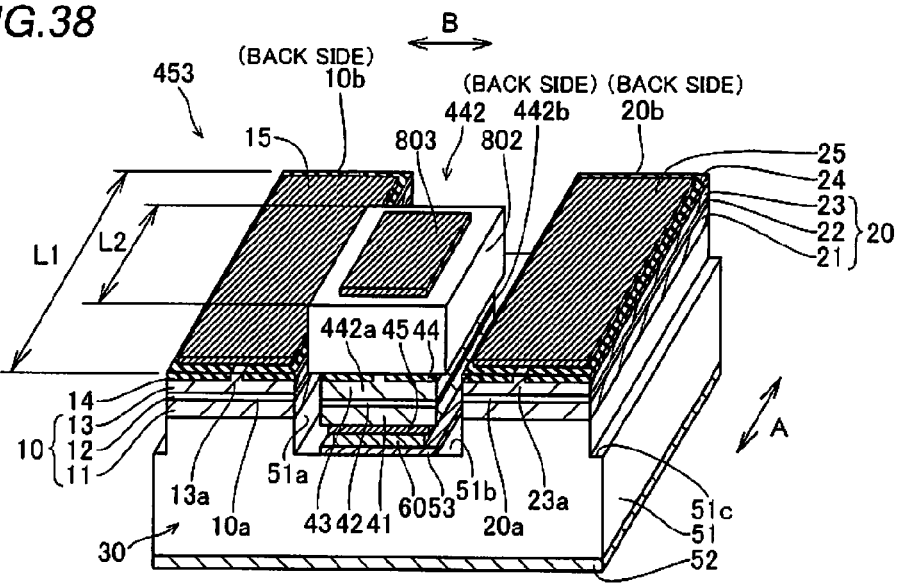
FIG. 38 is a perspective view showing a structure of a three-wavelength semiconductor laser element portion constituting a semiconductor laser device according to a sixth embodiment of the present invention.
Figure 39:
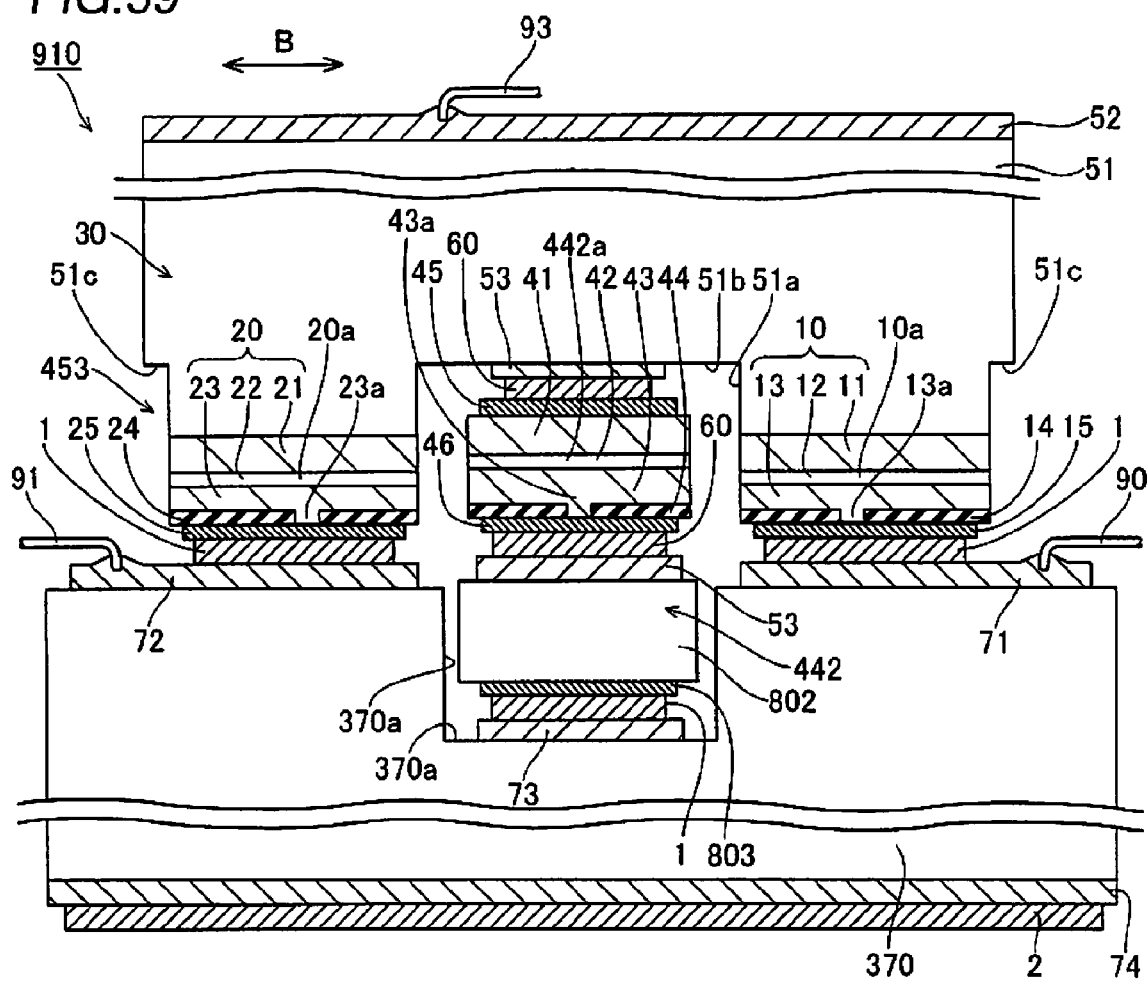
FIG. 39 is a front elevational view showing a structure of a semiconductor laser device according to the sixth embodiment of the present invention.

Referring to FIGS. 38 and 39, a blue-violet semiconductor laser element 442 is bonded to a monolithic two-wavelength semiconductor laser element portion 30 in a state where a support substrate 802 of a blue-violet semiconductor laser element 442 does not cover an upper surface of a monolithic two-wavelength semiconductor laser element portion 30 in a sixth embodiment, dissimilarly to the aforementioned fifth embodiment. The blue-violet semiconductor laser element 442 is an example of the "second semiconductor laser element" in the present invention.

In the blue-violet semiconductor laser element 442 of a three-wavelength semiconductor laser element portion 453 constituting a semiconductor laser device 910 according to the sixth embodiment, a p-type AlGaN cladding layer 43, an active layer 42 and an n-type AlGaN cladding layer 41 are formed on an upper surface of a support substrate 802 made of Ge through an electrode layer 53 and an fusible layer 60, as shown in FIG. 39. An electrode 803 electrically connected to a p-side electrodes 46 is formed on a prescribed region of a lower surface of the support substrate 802.

According to the sixth embodiment, the blue-violet semiconductor laser element 442 bonded to the support substrate 802, having a width slightly smaller than the width in a direction B of the step portion 51a of the monolithic two-wavelength semiconductor laser element portion 30, is bonded to the monolithic two-wavelength semiconductor laser element portion 30, as shown in FIG. 38. Thus, the overall upper surface (p-side electrodes 15 and 25 in FIG. 38) of the monolithic two-wavelength semiconductor laser element portion 30 is so formed as to be exposed.

In the semiconductor laser device 910, the three-wavelength semiconductor laser element portion 453 is fixed to the base 370 in a junction-down system, as shown in FIG. 39. At this time, the support substrate 802 of the blue-violet semiconductor laser element 442 is so formed as to be bonded to a bottom of a recess portion 370a previously formed in the base 370. The remaining structure of the semiconductor laser device 910 according to the sixth embodiment is similar to the aforementioned fifth embodiment.

A manufacturing process of a semiconductor laser device 910 according to the sixth embodiment will be now described with reference to FIGS. 4 and 38 to 43.

The wafer-state monolithic two-wavelength semiconductor laser element portions 30 (see FIG. 4) are formed through a manufacturing process similar to the aforementioned first embodiment.

Figure 40:
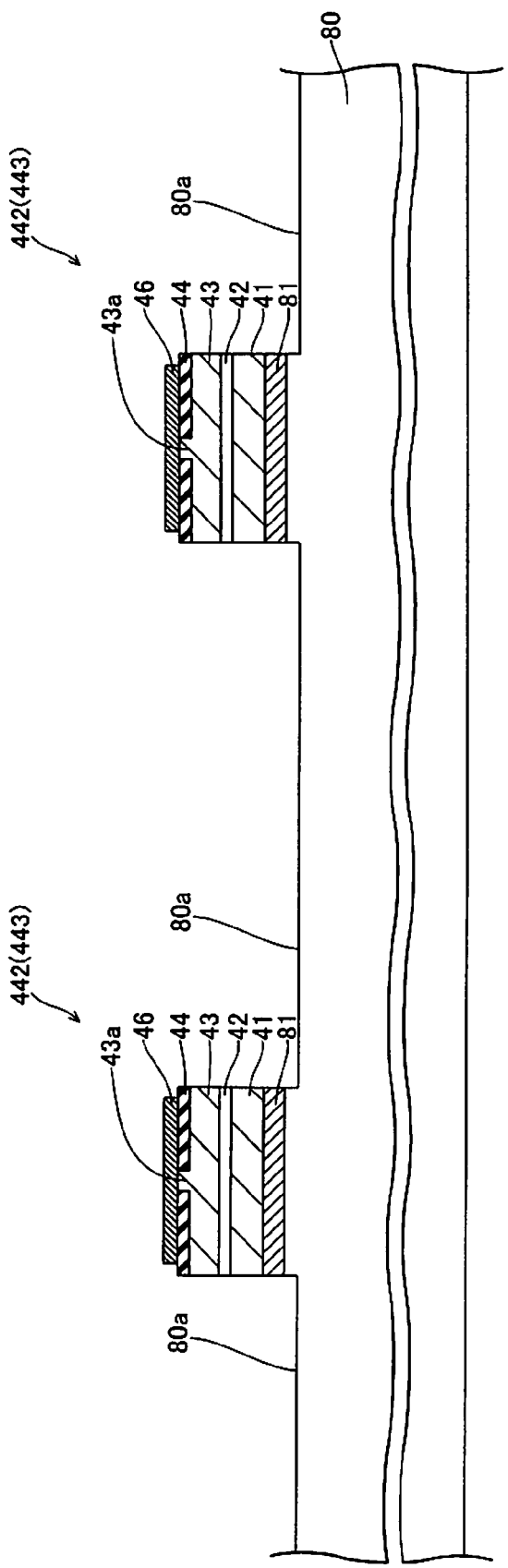
FIGS. 40 to 43 are diagrams for illustrating a manufacturing process for the semiconductor laser device according to the sixth embodiment shown in FIG. 39.

As shown in FIG. 40, InGaN separative layers 81, the n-type AlGaN cladding layers 41, the active layers 42 and the p-type AlGaN cladding layers 43 are successively stacked on the upper surface of the n-type GaN substrate 80. Then the ridge portions 43a are formed on upper surfaces of the p-type AlGaN cladding layers 43 by etching and thereafter insulating films 44 are formed on upper surfaces of the p-type AlGaN cladding layers 43 except the ridge portions 43a. Thereafter p-side electrodes 46 are formed on upper surfaces of the ridge portions 43a and the insulating films 44. The step portions 80a reaching the n-type GaN substrate 80 are formed by etching.

Figure 41:
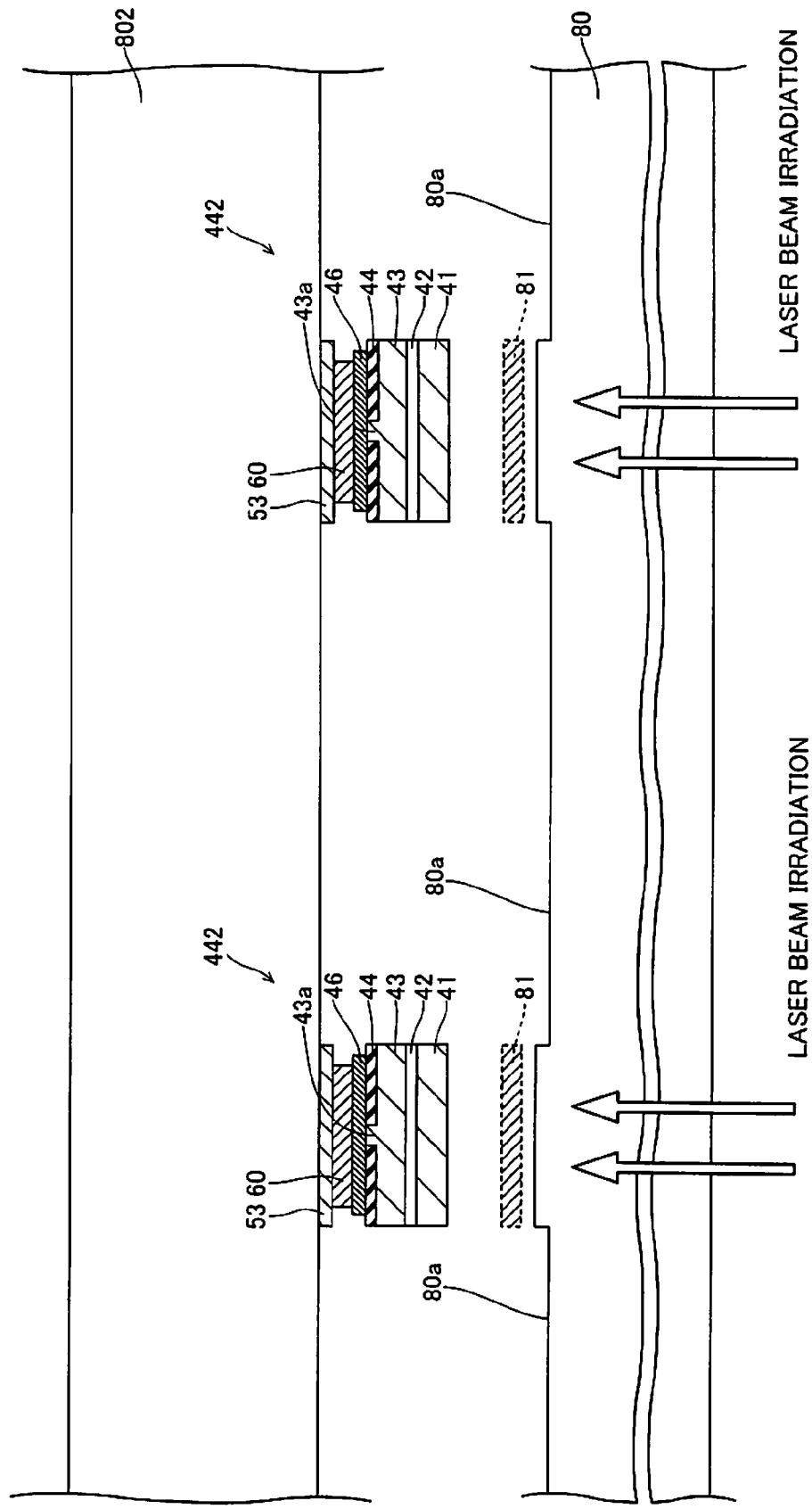

As shown in FIG. 41, the support substrate 802 made of Ge previously formed with the electrode layers 53 on prescribed regions are bonded on upper surfaces of the p-side electrodes 46 through the fusible layers 60. Then the n-type GaN substrate 80 is separated along the breakdown region of the InGaN separative layers 81 by laser beam irradiation, as shown in FIG. 41. Thus, the wafer-state blue-violet semiconductor laser elements 442 bonded from the n-type GaN substrate 80 to the support substrate 802 are formed.

Figure 42:
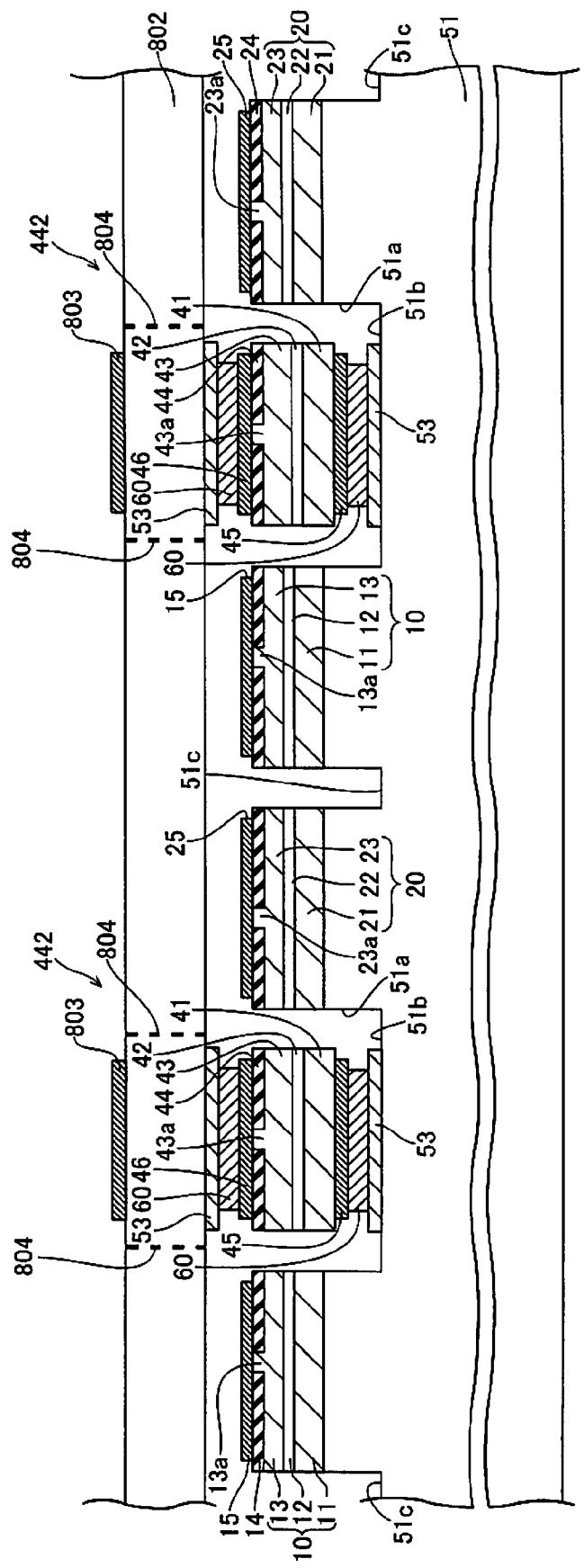

The blue-violet semiconductor laser elements 442 are bonded to the monolithic two-wavelength semiconductor laser element portion 30. At this time, the fusible layers 60 are previously formed only on regions of the electrode layers 53 of the monolithic two-wavelength semiconductor laser element portions 30, bonded with the blue-violet semiconductor laser elements 442. The thickness of the support substrate 802 is formed by a prescribed thickness by polishing, as shown in FIG. 42 and thereafter the electrodes 803 are formed on the upper surface of the support substrate 802 by vacuum evaporation. The electrodes 803 are formed on the upper surface of the support substrate 802 corresponding to positions of the p-type AlGaN cladding layers 43 including the ridge portions.

Figure 43:
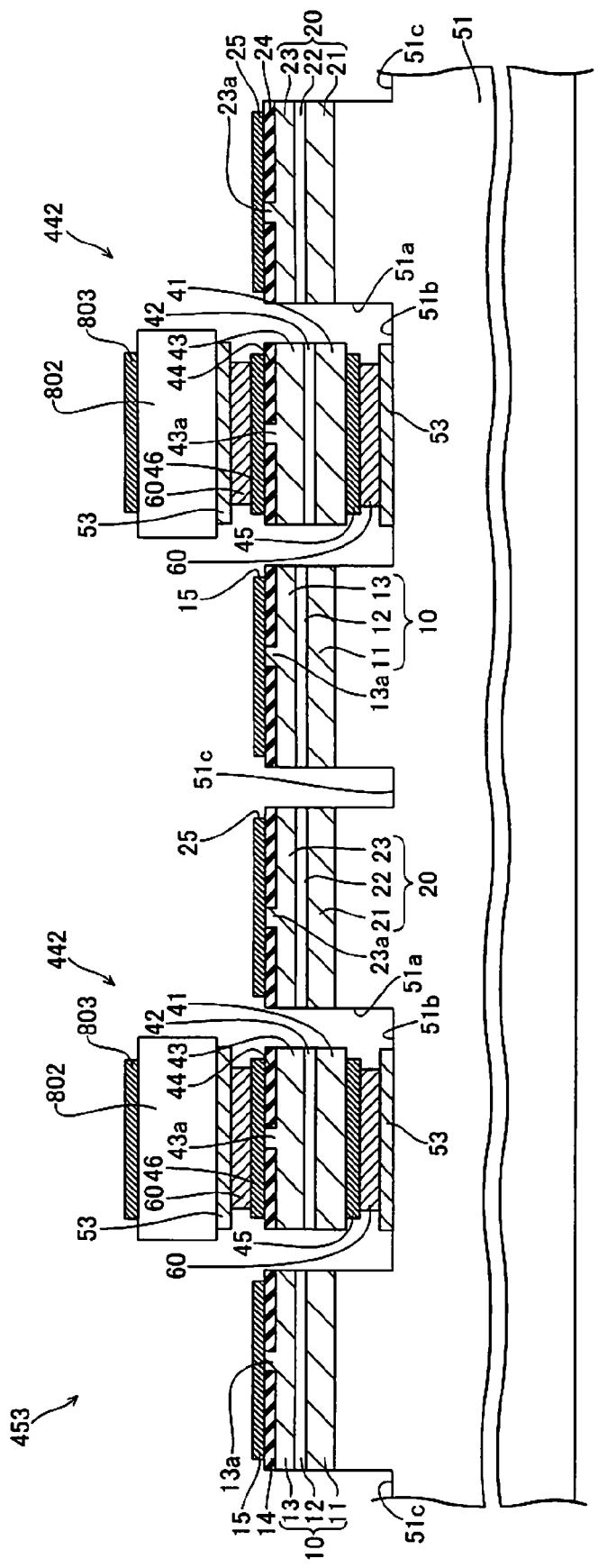

As shown in FIG. 42, scribing grooves 804 (shown by thick broken lines) are formed on prescribed positions of the support substrate 802. As shown in FIG. 43, regions of the support substrate 802, formed with no electrode 803 are divided along the scribing grooves 804, thereby partially removing the support substrate 802 formed with no electrode 803. Thus, the upper surfaces of the infrared semiconductor laser elements 10 and the red semiconductor laser elements 20 of the monolithic two-wavelength semiconductor laser element portions 30 are open.

Thereafter the elements are divided to be in the form of chips, thereby forming a plurality of the three-wavelength semiconductor laser element portions 453 according to the sixth embodiment shown in FIG. 38.

The recess portion 370a is previously formed on the prescribed region of the base 370 (see FIG. 39). In this state, the three-wavelength semiconductor laser element portion 453 is bonded to the base 370 through a manufacturing process similar to the aforementioned first embodiment. At this time, the blue-violet semiconductor laser element 442 is bonded to correspond to the recess portion 370a of the base 370. The semiconductor laser device 910 according to the sixth embodiment shown in FIG. 39 is formed in the aforementioned manner. The remaining manufacturing process for the semiconductor laser device 910 according to the sixth embodiment is similar to that of the aforementioned fifth embodiment.

According to the sixth embodiment, as hereinabove described, the three-wavelength semiconductor laser element portion 453 is formed such that the overall upper surfaces of the infrared semiconductor laser element 10 and the red semiconductor laser element 20 of the monolithic two-wavelength semiconductor laser element portion 30 are exposed, whereby the overall upper surfaces of the infrared semiconductor laser element 10 and the red semiconductor laser element 20 of the monolithic two-wavelength semiconductor laser element portion 30 can be bonded to the base 370, dissimilarly to the three-wavelength semiconductor laser element portion 452 according to the fifth embodiment shown in FIG. 33, and hence the three-wavelength semiconductor laser element portion 453 and the base 370 can be further reliably bonded to each other. The remaining effects of the sixth embodiment are similar to those of the aforementioned fourth embodiment.

(Modification of Sixth Embodiment)

Referring to FIGS. 40, 44 to 46, a blue-violet semiconductor laser element 443 formed on a provisional support substrate 805 is bonded to a monolithic two-wavelength semiconductor laser element portion 30 in a modification of the sixth embodiment and thereafter the provisional support substrate 805 is completely removed from the blue-violet semiconductor laser element 443, dissimilarly to the manufacturing process of the aforementioned sixth embodiment. The blue-violet semiconductor laser element 443 is an example of the "second semiconductor laser element" in the present invention.

Figure 45:
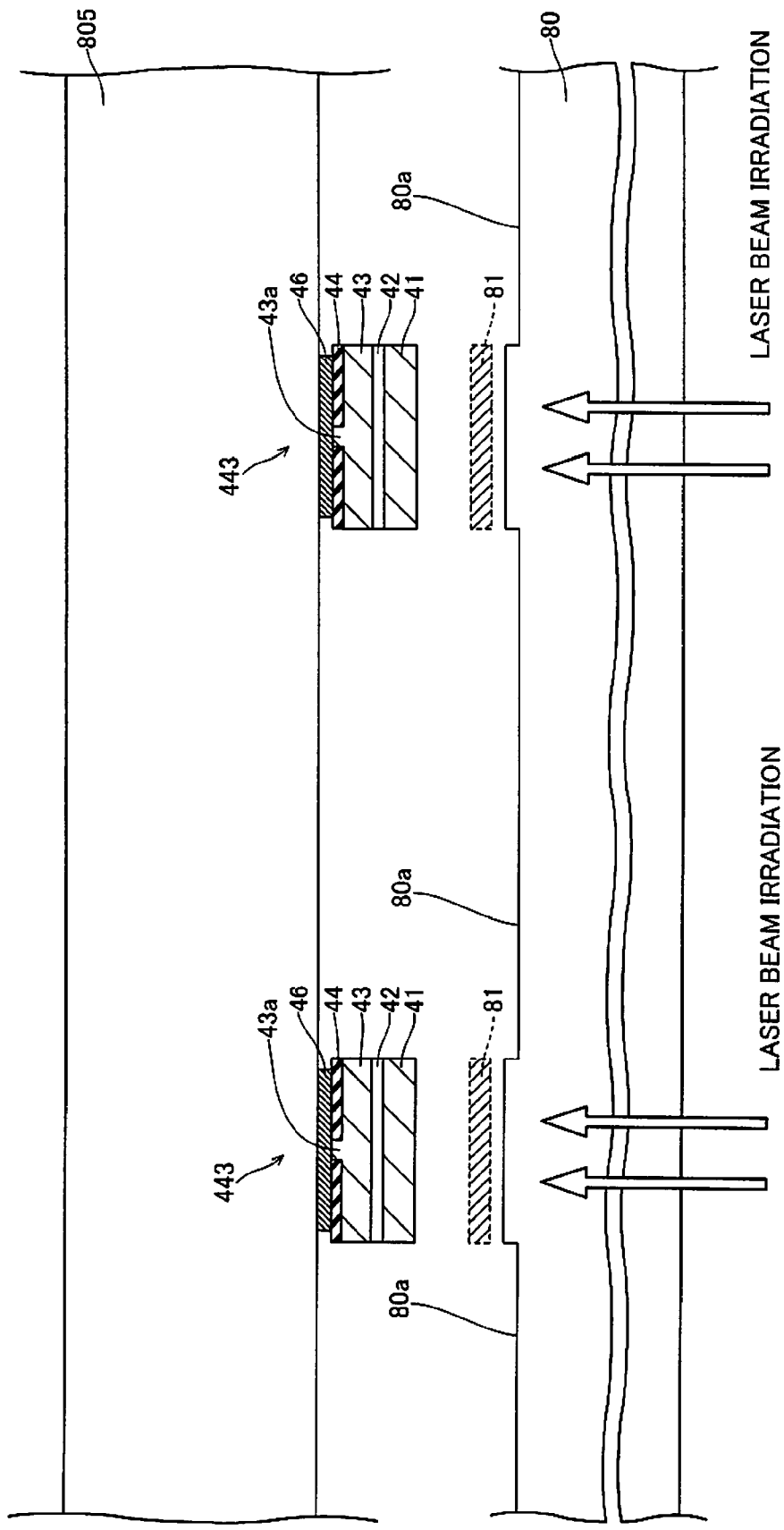
FIGS. 45 and 46 are diagrams for illustrating a manufacturing process for the semiconductor laser device according to the modification of the sixth embodiment shown in FIG. 44.

As shown in FIG. 40, the blue-violet semiconductor laser elements 443 are formed on the n-type GaN substrate 80 through a manufacturing process similar to that of the aforementioned sixth embodiment. Thereafter the provisional support substrate 805 is bonded to upper surfaces of the p-side electrodes 46 as shown in FIG. 45. A thermal release sheet formed with a thermal release adhesive material on a surface of a film such as polyester is employed as the provisional support substrate 805, the surface on which the thermal release adhesive material of the film is formed is bonded to the p-side electrodes 46. As shown in FIG. 45, the n-type GaN substrate 81 is separated along the breakdown region of the InGaN separative layers 81 by laser beam irradiation. Thus, the wafer-state blue-violet semiconductor laser elements 443 bonded to the provisional support substrate 805 are formed.

Figure 46:
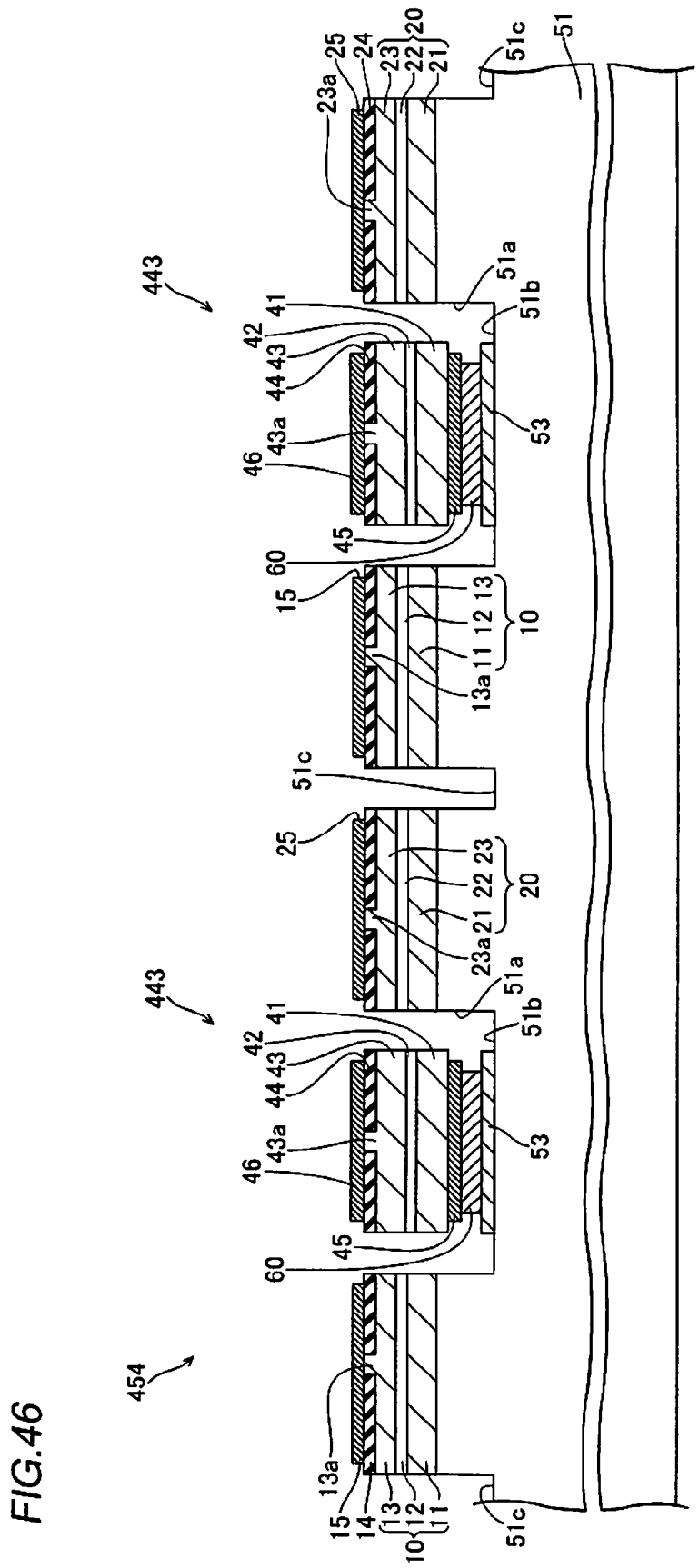

In the manufacturing process for the semiconductor laser device 920 according to the modification of the sixth embodiment, the wafer-state blue-violet semiconductor laser elements 443 bonded to the provisional support substrate 805 are bonded to the monolithic two-wavelength semiconductor laser element portions 30 and thereafter all the provisional support substrate 805 is removed from the blue-violet semiconductor laser elements 443 by heating as shown in FIG. 46. Consequently, the wafer-state three-wavelength semiconductor laser element portions 454 are formed as shown in FIG. 46.

Figure 44:
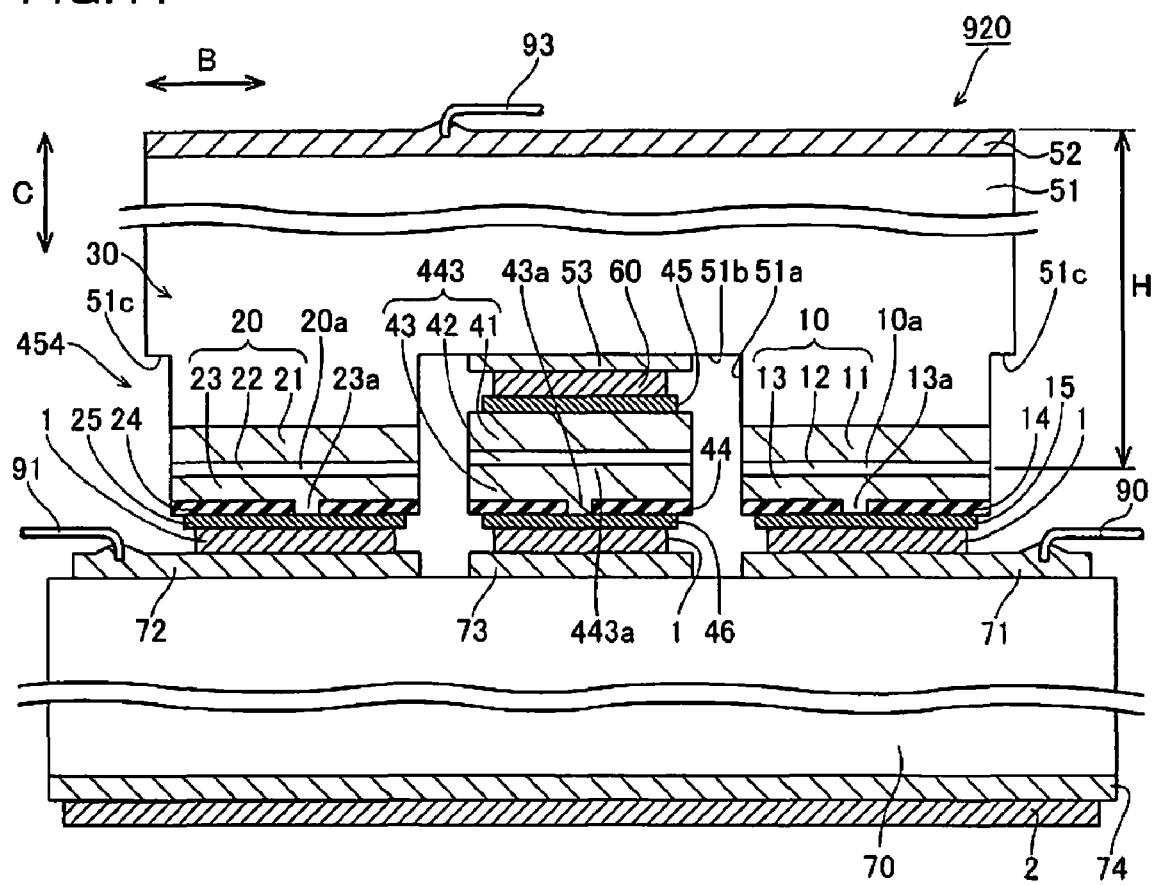
FIG. 44 is a front elevational view showing a structure of a semiconductor laser device according to a modification of the sixth embodiment of the present invention.

A plurality of the three-wavelength semiconductor laser element portions 454 constituting semiconductor laser devices 920 shown in FIG. 44 are formed by cleaving to be in the form of bars and dividing the elements.

Finally, the three-wavelength semiconductor laser element portion 454 is bonded to the base 70 though a manufacturing process similarly to that of the aforementioned first embodiment. The remaining manufacturing process for the semiconductor laser device 920 according to the modification of the sixth embodiment is similar to that of the aforementioned first embodiment.

In the manufacturing process according to the modification of the sixth embodiment, as hereinabove described, the provisional support substrate 805 is removed form the wafer-state blue-violet semiconductor laser elements 443 bonded to the monolithic two-wavelength semiconductor laser element portions 30 and hence the three-wavelength semiconductor laser element portion 454 formed by a substantially flat surface, in which any portion of the blue-violet semiconductor laser element 443 does not protrude above the monolithic two-wavelength semiconductor laser element portion 30, can be formed. Thus, the three-wavelength semiconductor laser element portion 454 can be easily fixed to the base 70 in a junction-down system. The remaining effects of the modification of the sixth embodiment is similar to that of the aforementioned first embodiment.

(Seventh Embodiment)

Referring to FIGS. 47 to 50, the wafer-state blue-violet semiconductor laser elements 444 are divided along an extensional direction of cavities and thereafter each of the strip-shaped blue-violet semiconductor laser elements 444 is bonded to a monolithic two-wavelength semiconductor laser element portion 30 in a seventh embodiment, dissimilarly to the manufacturing processes of the aforementioned first to sixth embodiments. The blue-violet semiconductor laser element 444 is an example of the "second semiconductor laser element" in the present invention.

Figure 47:
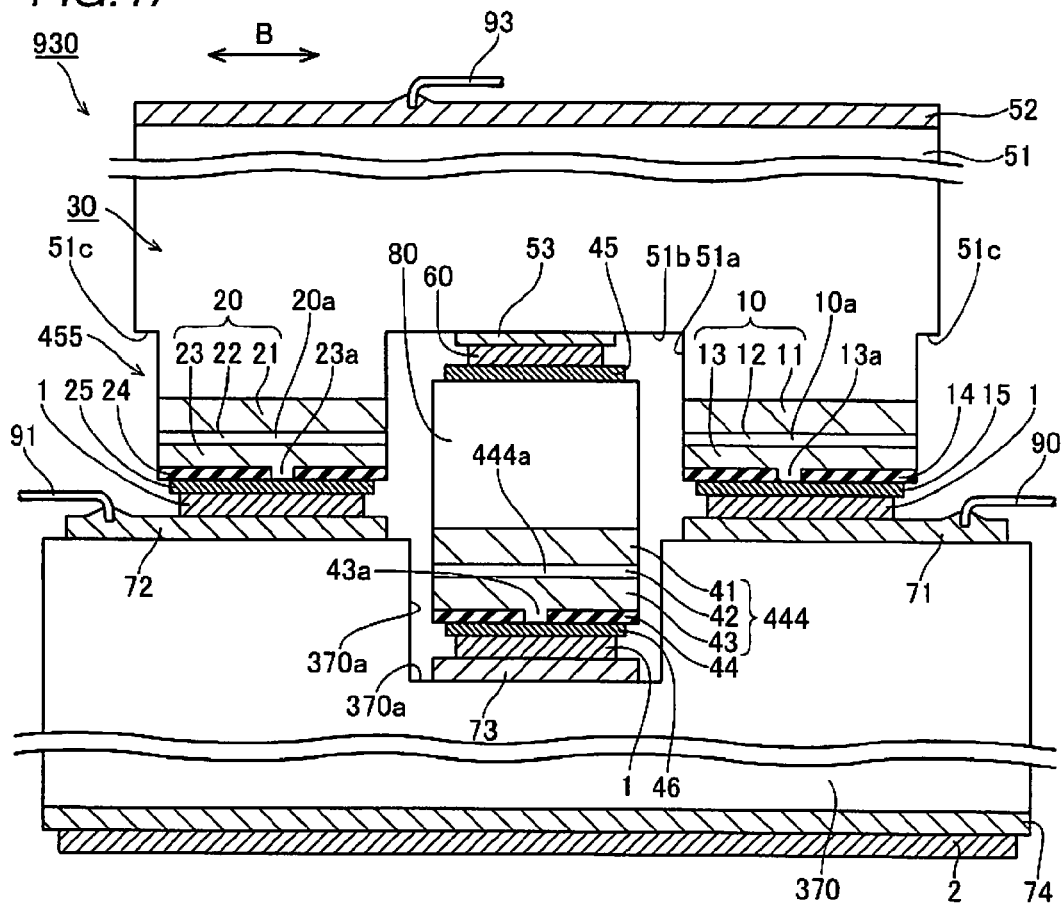
FIG. 47 is a front elevational view showing a structure of a semiconductor laser device according to a seventh embodiment of the present invention.

In a semiconductor laser device 930 according to the seventh embodiment of the present invention, a three-wavelength semiconductor laser element portion 455 formed by bonding the blue-violet semiconductor laser element 444 to the monolithic two-wavelength semiconductor laser element portion 30 is fixed to a base 370 in a junction-down system, as shown in FIG. 47.

According to the seventh embodiment, an n-type GaN substrate 80 (n-side electrode 45) of the blue-violet semiconductor laser element 444 is bonded to a bottom 51b of a step portion 51a of a monolithic two-wavelength semiconductor laser element portion 30 through an fusible layer 60. A p-side electrode 46 of the blue-violet semiconductor laser element 444 is bonded to a bottom of a recess portion 370a previously formed on the base 370 through a conductive bonding layers 1. The n-type GaN substrate 80 is an example of the "first conductive type nitride-based semiconductor substrate" in the present invention. The remaining structure of the semiconductor laser device 930 according to the seventh embodiment is similar to that of the aforementioned first embodiment.

A manufacturing process for the semiconductor laser device 930 according to the seventh embodiment will be now described with reference to FIGS. 4, 47 to 50.

The wafer-state monolithic two-wavelength semiconductor laser element portions 30 (see FIG. 4) are formed through a manufacturing process similar to the aforementioned first embodiment.

Figure 48:
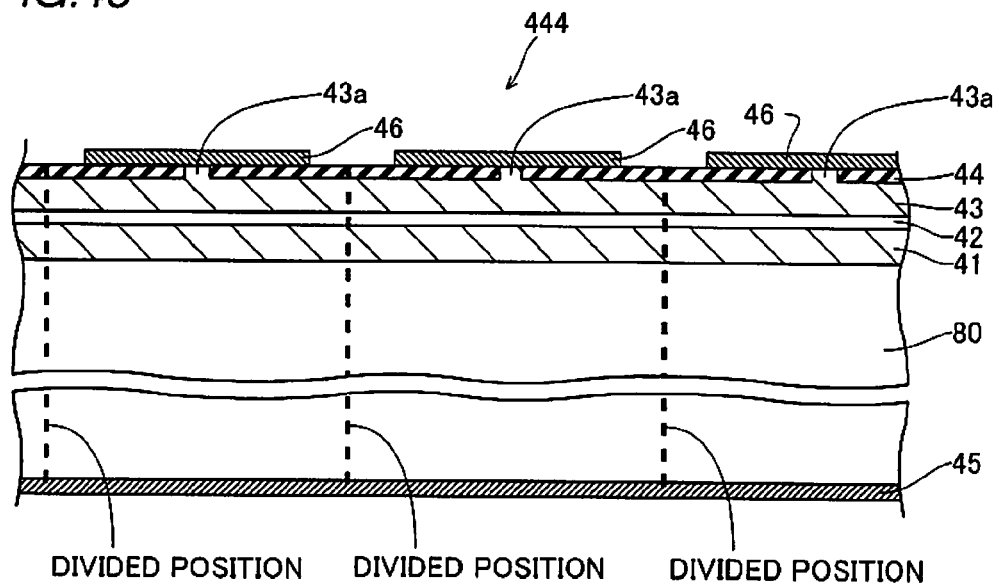
FIGS. 48 to 50 are diagrams for illustrating a manufacturing process for the semiconductor laser device according to a seventh embodiment shown in FIG. 47.

As shown in FIG. 48, an n-type AlGaN cladding layer 41, an active layer 42 and a p-type AlGaN cladding layer 43 are successively formed on an upper surface of the n-type GaN substrate 80. Ridge portions 43a are formed on upper surface of the p-type AlGaN cladding layer 43 by etching and thereafter insulating films 44 are formed on the upper surface of the p-type AlGaN cladding layer except the ridge portions 43a. Thereafter the p-side electrodes 46 are formed on upper surfaces of the ridge portions 43a and the insulating films 44. The n-side electrode 45 is formed on a lower surface of the n-type GaN substrate 80.

Figure 49:
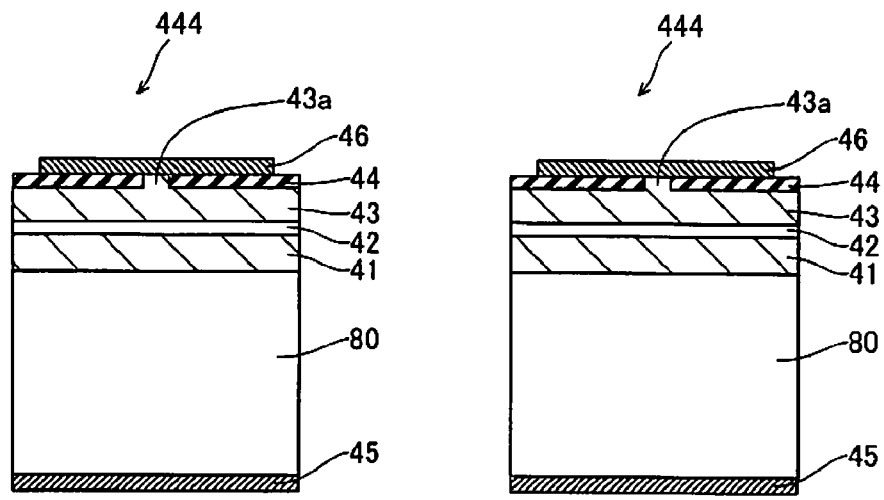

In the manufacturing process of the seventh embodiment, the elements are divided along an extensional direction (direction perpendicular to the plane of paper) of the ridge portions 43a as shown in FIG. 48. The aforementioned element division is performed at positions shown by broken lines in FIG. 48. Thus, a plurality of the blue-violet semiconductor laser elements 444 formed in strip shapes in the cavity direction (direction perpendicular to the plane of paper) are formed as shown in FIG. 49.

Figure 50:
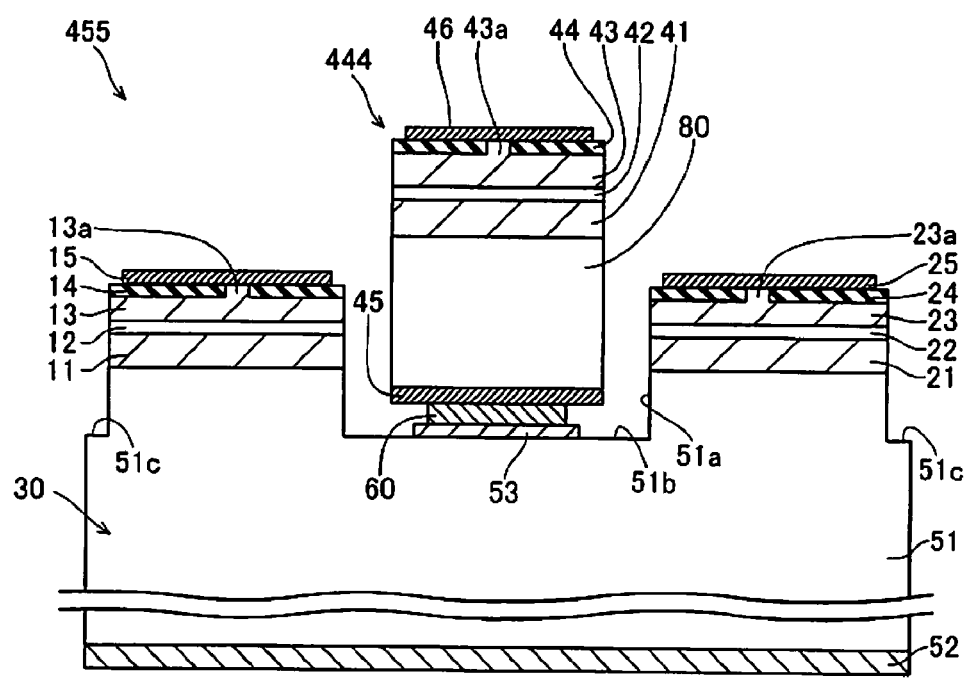

As shown in FIG. 50, electrode layers 53 provided on the step portions 51a of the monolithic two-wavelength semiconductor laser element portions 30 and the n-type GaN substrate 80 of the strip-shaped blue-violet semiconductor laser elements 444 are opposed and bonded to through fusible layers 60. The wafer-state three-wavelength semiconductor laser element portions 455 are formed in the aforementioned manner.

Thereafter the elements are divided to be in the form of chips, thereby forming a plurality of the three-wavelength semiconductor laser element portion 455 shown in FIG. 50.

The recess portion 370a is previously formed on a prescribed region of the base 370 (see FIG. 47) similarly to the manufacturing process of the aforementioned fifth embodiment. In this state, the three-wavelength semiconductor laser element portion 455 is bonded to the base 370. At this time, the recess portion 370a of the base 370 is bonded to correspond to the blue-violet semiconductor laser element 444.

The semiconductor laser device 930 according to the seventh embodiment shown in FIG. 47 is formed in the aforementioned manner.

As hereinabove described, the manufacturing process of the seventh embodiment comprises a step of bonding the plurality of strip-shaped blue-violet semiconductor laser elements 444 previously formed by element division along the extensional direction of the cavities to the monolithic two-wavelength semiconductor laser element portions 30, whereby the number of the plurality of blue-violet semiconductor laser elements 444 formed on one n-type GaN substrate 80 can be increased and hence the yield in formation of the semiconductor laser element can be improved.

Although the present invention has been described and illustrated in detail, it is clearly understood that the same is by way of illustration and example only and is not to be taken by way of limitation, the spirit and scope of the present invention being limited only by the terms of the appended claims.

For example, while the base to which the multiple wavelength semiconductor laser element portion is bonded is formed by the substrate made of AlN in each of the aforementioned first to seventh embodiments, the present invention is not restricted to this but the base may be formed by a substrate made of an insulating material having an excellent thermal conductivity such as SiC, Si, diamond and cubic boron nitride (CBN).

While the hole 351b reaching from the surface formed with the semiconductor layer of the monolithic two-wavelength semiconductor laser element portion 330 to the n-type GaAs substrate 351 is provided and the conduction portion 352 is formed in the inner surface of the hole 351b by vacuum evaporation in the aforementioned second embodiment, the present invention is not restricted to this but a conductive material may fill up the hole 351b for forming a conduction portion structure.

While the semiconductor laser device is formed in the junction-down system where the multiple wavelength laser element portion (p-n junction) is directed downward with respect to the base (submount) in each of the aforementioned first to seventh embodiments, the present invention is not restricted to this but the semiconductor laser device may be formed in a junction-up system where the multiple wavelength laser element portion is directed upward with respect to the base.

While one blue-violet semiconductor laser element 40 is bonded to the monolithic two-wavelength semiconductor laser element portion 30 (330) constituted by the two semiconductor laser elements so that the three-wavelength semiconductor laser element portion 50 (350) is formed in each of the aforementioned first and second embodiments, the present invention is not restricted to this but the multiple wavelength laser element constituted by a plurality of semiconductor laser element portions other than two semiconductor laser element portions may be formed on the same growth substrate and two or more semiconductor laser element portions emitting laser beams having different wavelengths may be bonded so that the multiple wavelength laser element portion is formed.

While the blue semiconductor laser element 710 and the green semiconductor laser element 720 are successively bonded to the red semiconductor laser element 20 formed on the n-type GaAs substrate 751 so that the RGB multiple wavelength semiconductor laser element portion 750 is formed in the aforementioned third embodiment, the present invention is not restricted to this but the RGB multiple wavelength semiconductor laser element portion may be formed by successively bonding the green semiconductor laser element and the blue semiconductor laser element.

While the individually formed blue semiconductor laser element 710 and green semiconductor laser element 720 are successively bonded to the red semiconductor laser element 20 formed on the n-type GaAs substrate 751 so that the RGB multiple wavelength semiconductor laser element portion 750 is formed, the present invention is not restricted to this but a monolithic two-wavelength semiconductor laser element portion, in which a blue semiconductor laser element and a green semiconductor laser element are formed on the same GaN substrate, may be bonded to the red semiconductor laser element, so that the RGB multiple wavelength semiconductor laser element portion is formed.

While an AlN film or an $Al_2O_3$ film containing Al elements is applied to the dielectric multilayer films formed on the cavity facets (the light emitting surface and the light reflecting surface) of each of the semiconductor laser elements forming the multiple wavelength semiconductor laser element portion in each of the aforementioned first to seventh embodiments, the present invention is not restricted to this but a single layer or a multilayer film made of $SiO_2$, $TiO_2$, $ZrO_2$, $Ta_2O_5$, $Nb_2O_5$, $La_2O_3$, SiN, $MgF_2$, GaN or BN, or $Ti_3O_5$ or $Nb_2O_3$ which is a material having the different composition ratio thereof.

What is claimed is:

1. A semiconductor laser device comprising:
    a first semiconductor laser element formed on a surface of a first conductive type substrate, obtained by stacking a first conductive type first semiconductor layer, a first active layer and a second conductive type second semiconductor layer successively from said first conductive type substrate; and
    a second semiconductor laser element obtained by successively stacking a first conductive type third semiconductor layer, a second active layer and a second conductive type fourth semiconductor layer; and
    a heat radiator base, wherein
    a first semiconductor laser element portion is constituted by said first conductive type substrate and said first semiconductor laser element,
    said first semiconductor laser element portion has a step portion for arranging said second semiconductor laser element,
    said step portion has a bottom portion formed at either said first conductive type substrate or said first semiconductor laser element,
    said bottom portion is located at a height different from said surface of said first conductive type substrate on which said first semiconductor layer is formed,
    said third semiconductor layer is electrically connected to said first semiconductor layer by bonding a side of said third semiconductor layer to said bottom portion through a first fusible layer,
    said first semiconductor laser element and said second semiconductor laser element are mounted on said heat radiator base,
    sides of said second and fourth semiconductor layers of respective said first and second semiconductor laser element are fixed to said heat radiator base in a same plane through a second fusible layer.

2. The semiconductor laser device according to claim 1, wherein
    said first active layer and said second active layer are arranged at a prescribed distance on a substantially the same plane.

3. The semiconductor laser device according to claim 1, wherein
a cavity length of said first semiconductor laser element and a cavity length of said second semiconductor laser element are different from each other.

4. The semiconductor laser device according to claim 1, wherein
a connection region electrically conducting said first conductive type substrate or said first semiconductor layer is provided on a surface of said first semiconductor laser element, and
said second semiconductor laser element is bonded on said connection region.

5. The semiconductor laser device according to claim 1, wherein
said first active layer is formed by a compound semiconductor containing at least either arsenic or phosphorus, and
said second active layer is formed by a nitride-based compound semiconductor.

6. The semiconductor laser device according to claim 5, wherein
a cavity length of said second semiconductor laser element is smaller than a cavity length of said first semiconductor laser element.

7. The semiconductor laser device according to claim 1, wherein a thickness of said second fusible layer along a thickness direction of a semiconductor layer on a side of said second semiconductor layer and a thickness of said second fusible layer along a thickness direction of a semiconductor layer on a side of said fourth semiconductor layer are different from each other.

8. The semiconductor laser device according to claim 1, further comprising a first electrode formed between said third semiconductor layer and said fusible layer and being in contact with said third semiconductor layer.

9. The semiconductor laser device according to claim 1, further comprising a second electrode formed on said fourth semiconductor layer.

10. The semiconductor laser device according to claim 1, further comprising a first conductive type nitride-based semiconductor substrate formed between said third semiconductor layer and said fusible layer and being in contact with said third semiconductor layer.

11. The semiconductor laser device according to claim 1, further comprising a second conductive type nitride-based semiconductor substrate arranged on said fourth semiconductor layer.

12. The semiconductor laser device according to claim 1, further comprising a support substrate arranged on said fourth semiconductor layer.

13. The semiconductor laser device according to claim 1, wherein said first semiconductor laser element includes two said first semiconductor laser elements having different wavelengths with each other, said step portion is provided between said two first semiconductor laser elements.

14. The semiconductor laser device according to claim 13, wherein the wavelength of said second semiconductor laser element is the shortest among the wavelengths of at least said two first semiconductor laser elements and said second semiconductor laser element.

15. A semiconductor laser device comprising:
two first semiconductor laser elements having different wavelengths with each other formed on a surface of a first conductive type substrate, obtained by stacking a first conductive type first semiconductor layer, a first active layer and a second conductive type second semiconductor layer successively from said first conductive type substrate;
a first electrode for a second conductive type provided at a side of said second semiconductor layer of one said first semiconductor laser element;
a second electrode for a second conductive type provided at a side of said second semiconductor layer of another said first semiconductor laser element;
a second semiconductor laser element obtained by successively stacking a first conductive type third semiconductor layer, a second active layer and a second conductive type fourth semiconductor layer; and
a third electrode for a second conductive type provided at a side of said fourth semiconductor layer of said second semiconductor laser element, wherein
a first semiconductor laser element portion is constituted by said first conductive type substrate and said two first semiconductor laser elements,
said first semiconductor laser element portion has a step portion between said two first semiconductor laser elements, and said second semiconductor laser element is arranged on said step portion,
said step portion has a bottom portion formed at either said first conductive type substrate or said first semiconductor laser element,
said bottom portion is located at a height different from said surface of said first conductive type substrate on which said first semiconductor layer is formed,
said third semiconductor layer is electrically connected to said first semiconductor layer by bonding a side of said third semiconductor layer to said bottom portion through a fusible layer,
a lower surface of said first electrode for a second conductive type opposite to one said first semiconductor laser element, a lower surface of said second electrode for a second conductive type opposite to another said first semiconductor laser element and a lower surface of said third electrode for a second conductive type opposite to said second semiconductor laser element are located on a same plane.

16. The semiconductor laser device according to claim 15, wherein
said first active layer and said second active layer are arranged at a prescribed distance on substantially the same plane.

17. The semiconductor laser device according to claim 15, wherein
said first active layer is formed by a compound semiconductor containing at least either arsenic or phosphorus, and
said second active layer is formed by a nitride-based compound semiconductor.

18. The semiconductor laser device according to claim 15, further comprising a heat radiator base for mounting said two first semiconductor laser elements and said second semiconductor laser element, wherein
sides of said second and fourth semiconductor layers of respective said two first and second semiconductor laser element are fixed to said heat radiator base.

19. The semiconductor laser device according to claim 15, wherein
the wavelength of said second semiconductor laser element is the shortest among the wavelengths of at least said two first semiconductor laser elements and said second semiconductor laser element.

* * * * *